US008772837B2

(12) United States Patent
Suligoj et al.

(10) Patent No.: US 8,772,837 B2
(45) Date of Patent: Jul. 8, 2014

(54) SEMICONDUCTOR DEVICE COMPRISING A LATERAL BIPOLAR TRANSISTOR

(71) Applicant: Asahi Kasei Microdevices Corporation, Tokyo (JP)

(72) Inventors: Tomislav Suligoj, Zagreb (HR); Marko Koricic, Zagreb (HR); Hidenori Mochizuki, Tokyo (JP); Soichi Morita, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/032,515

(22) Filed: Sep. 20, 2013

(65) Prior Publication Data
US 2014/0035063 A1 Feb. 6, 2014

Related U.S. Application Data

(62) Division of application No. 12/808,874, filed on Jun. 17, 2010, now Pat. No. 8,569,866.

(30) Foreign Application Priority Data

Dec. 20, 2007 (JP) ................................. 2007-328783
Mar. 31, 2008 (JP) ................................. 2008-092288
Jul. 29, 2008 (JP) ................................. 2008-195016

(51) Int. Cl.
| | | |
|---|---|---|
| *H01L 21/8249* | (2006.01) | |
| *H01L 29/10* | (2006.01) | |
| *H01L 29/08* | (2006.01) | |
| *H01L 27/06* | (2006.01) | |
| *H01L 29/735* | (2006.01) | |
| *H01L 29/66* | (2006.01) | |
| *H01L 21/265* | (2006.01) | |

(52) U.S. Cl.
CPC ........ *H01L 27/0623* (2013.01); *H01L 29/1008* (2013.01); *H01L 29/0808* (2013.01); *H01L 29/1045* (2013.01); *H01L 29/735* (2013.01); *H01L 21/26513* (2013.01); *H01L 29/6625* (2013.01); *H01L 21/8249* (2013.01)

USPC ...... 257/197; 257/577; 257/E29.45; 438/204; 438/311

(58) Field of Classification Search
CPC ............ H01L 21/8249; H01L 27/0623; H01L 29/6625
USPC .......... 257/197, 370, 577, E21.696, E29.045; 438/204, 311
See application file for complete search history.

(56) References Cited

U.S. PATENT DOCUMENTS

| | | | |
|---|---|---|---|
| 6,476,450 B2 | 11/2002 | Kondo et al. | |
| 6,897,545 B2 | 5/2005 | Menut et al. | |

(Continued)

FOREIGN PATENT DOCUMENTS

| | | |
|---|---|---|
| EP | 0 392 954 A2 | 10/1990 |
| JP | 01-241167 | 6/1989 |
| JP | 03-004538 | 1/1991 |
| JP | 06-021069 | 1/1994 |

(Continued)

*Primary Examiner* — John C Ingham
(74) *Attorney, Agent, or Firm* — Morgan, Lewis & Bockius LLP

(57) ABSTRACT

A configuration of a lateral transistor suited for the hybrid-integration (BiCMOS) of a high-performance lateral transistor (HCBT) and a CMOS transistor, and a method for manufacturing the lateral transistor. A semiconductor device includes a HCBT 100 and a CMOS transistor 200 hybrid-integrated. The HCBT 100 has an open region 21 opened by etching a device isolating oxide film 6 surrounding an n-hill layer 11. An emitter electrode 31A and a collector electrode 31B are formed in the open region 21 and are composed of a polysilicon film having such a thickness as to expose the n-hill layer 11 exposed by etching the device isolating oxide film, and an ultrathin oxide film 24 covering at least a part of the n-hill layer 11. The ultrathin oxide film 24 functions as a protective film for protecting the n-hill layer 11 from being etched when the polysilicon film is etched.

6 Claims, 56 Drawing Sheets

(56) References Cited

U.S. PATENT DOCUMENTS

| | | |
|---|---|---|
| 2005/0040495 A1 | 2/2005 | Suligoj et al. |
| 2006/0060941 A1 | 3/2006 | Sun et al. |
| 2007/0272964 A1 | 11/2007 | Tsumura |
| 2009/0212394 A1 | 8/2009 | Melai et al. |

FOREIGN PATENT DOCUMENTS

| | | |
|---|---|---|
| JP | 2006-080508 | 3/2006 |
| JP | 2007-318020 | 12/2007 |

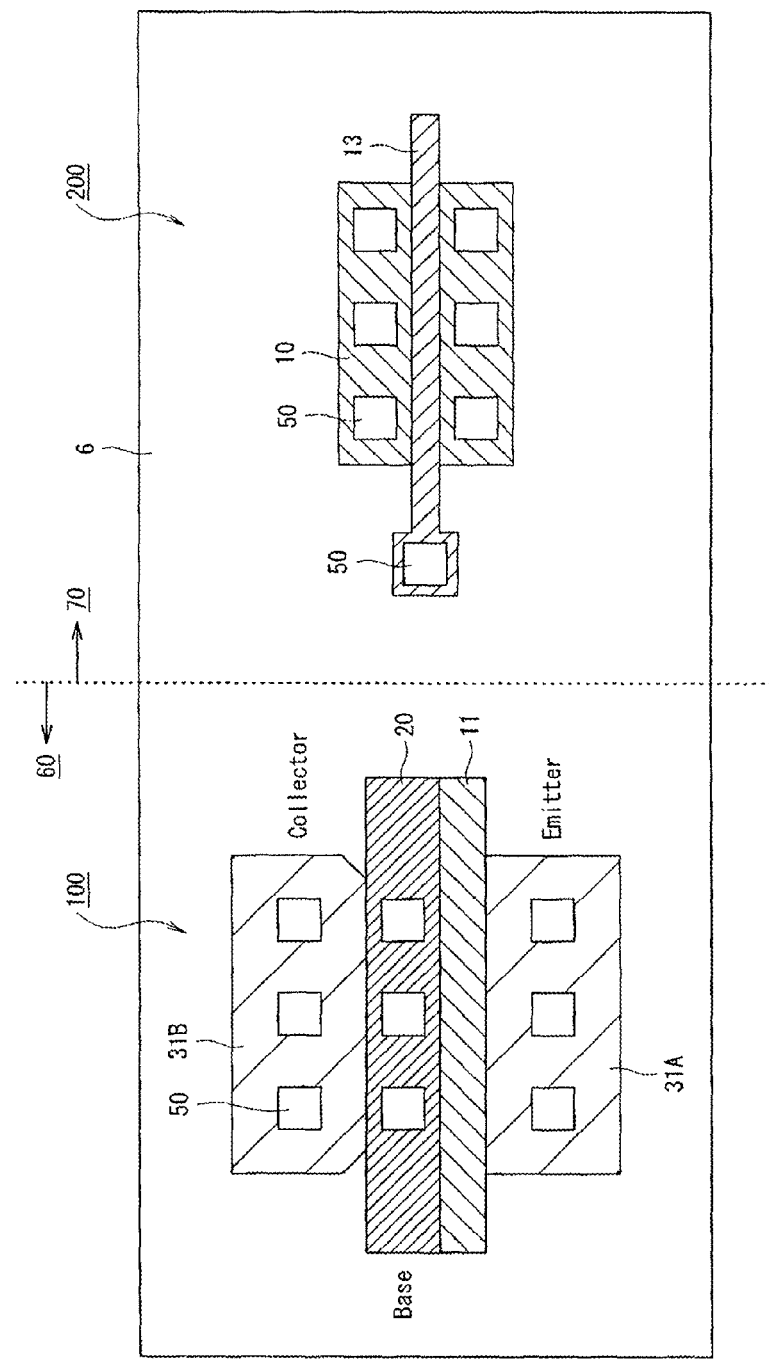

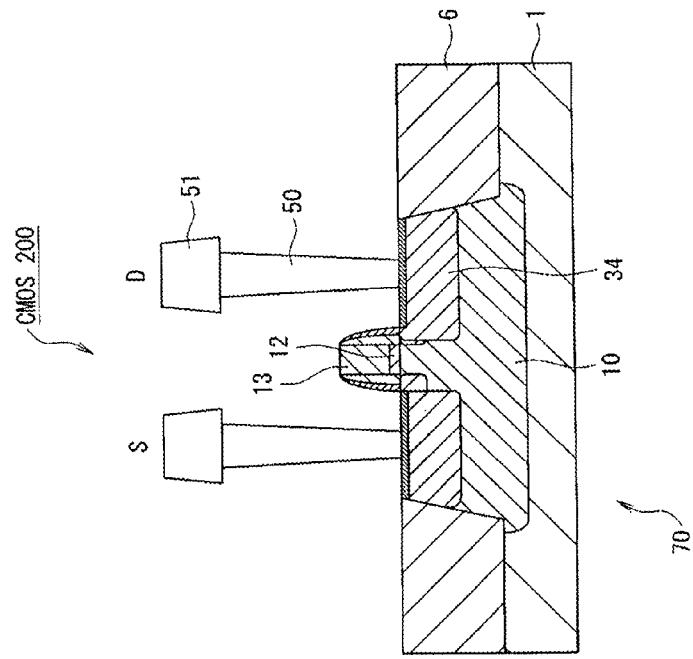
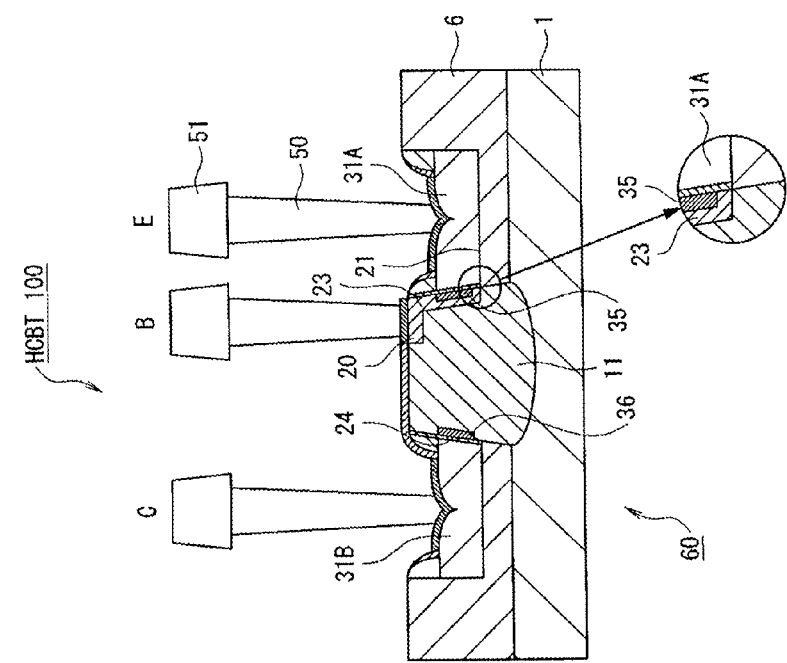

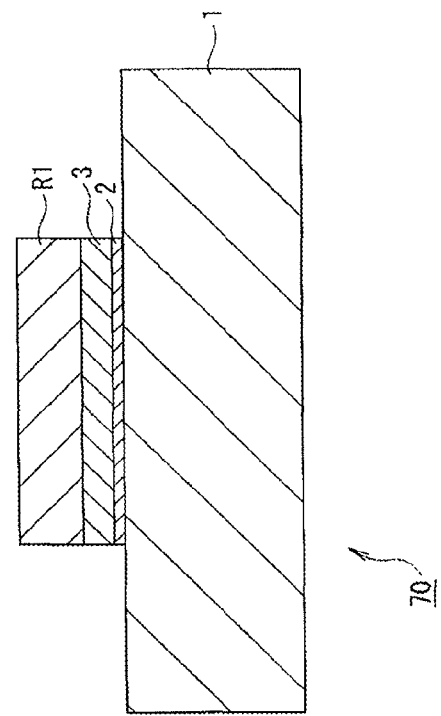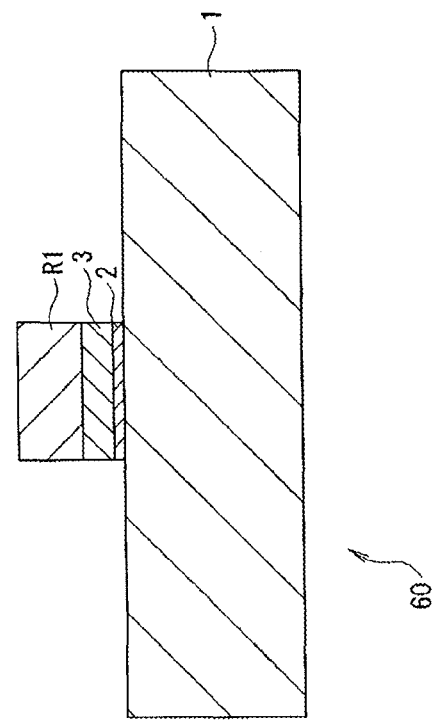

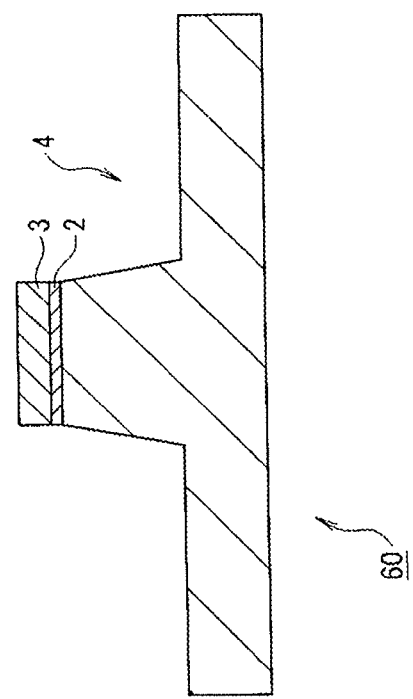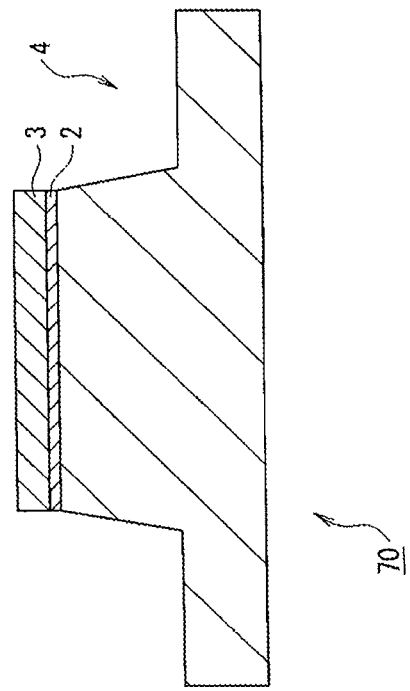

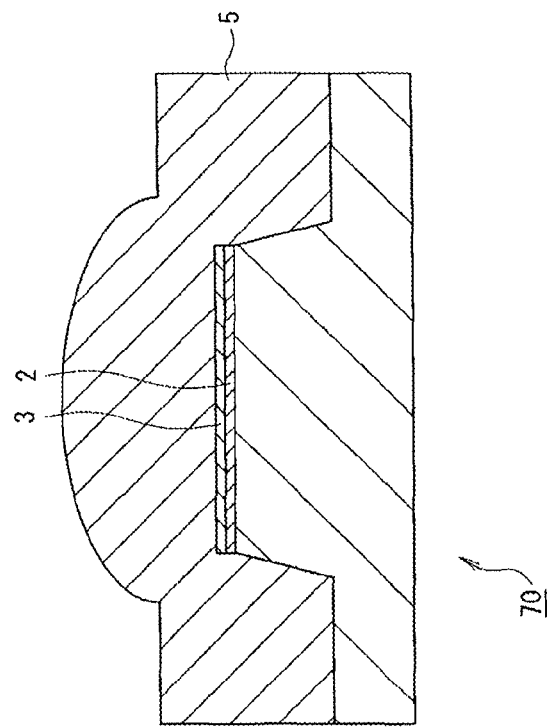
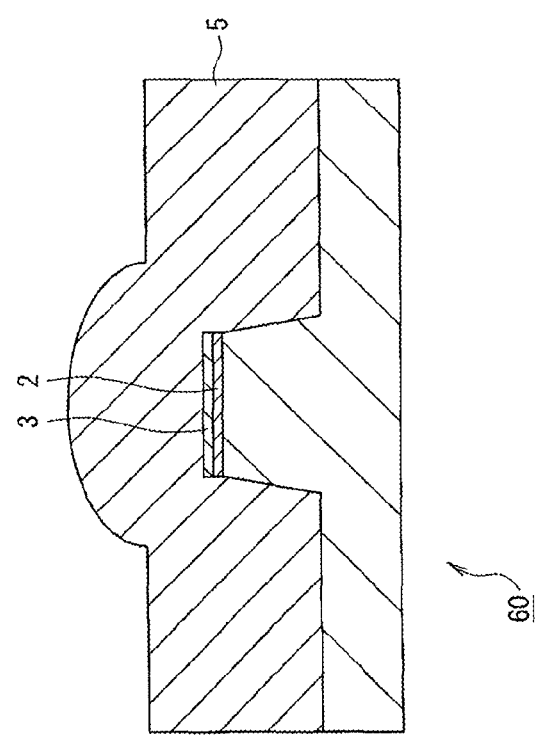

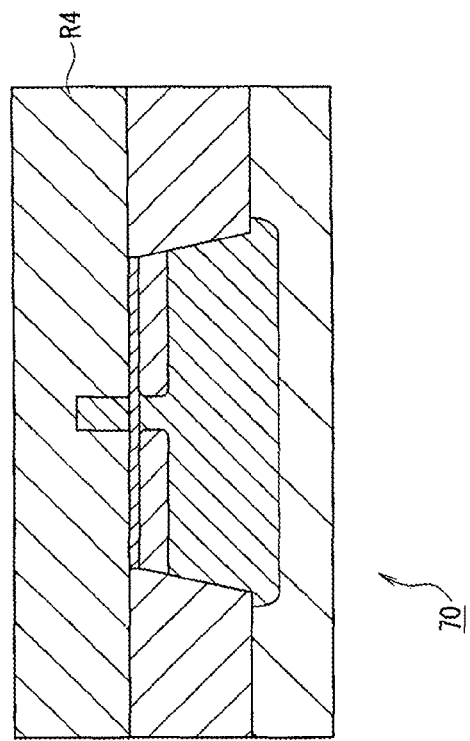
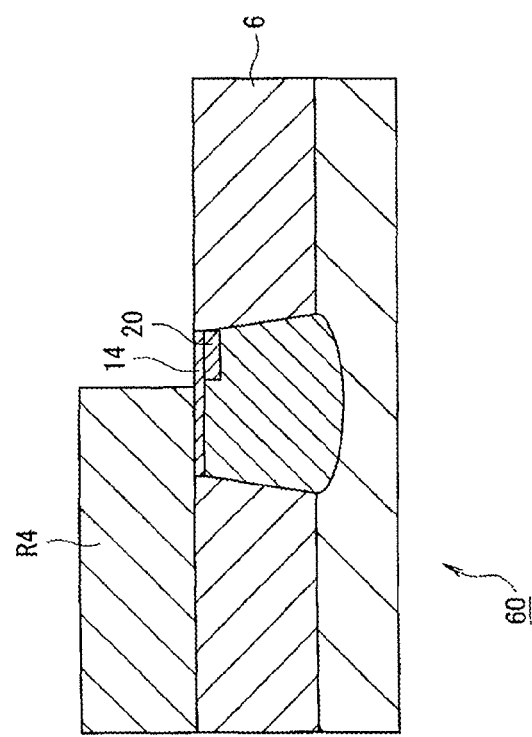

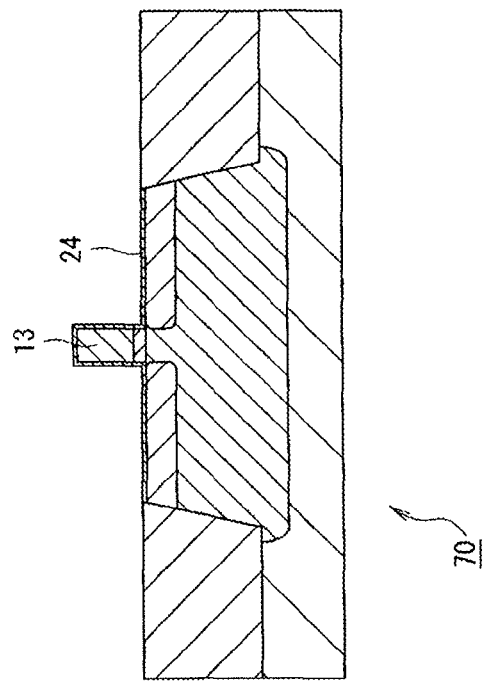
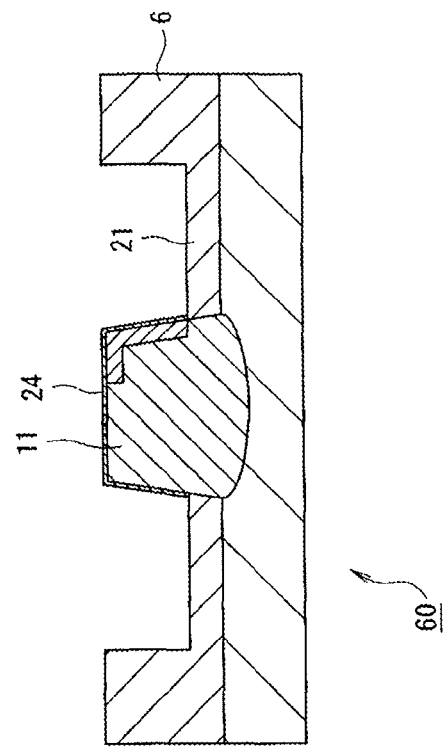

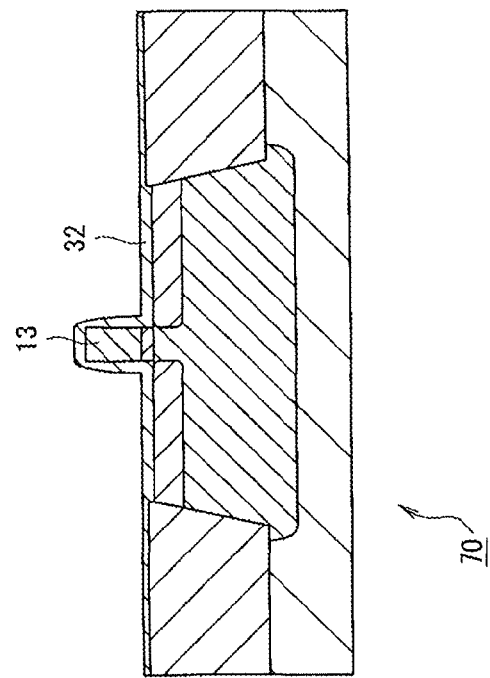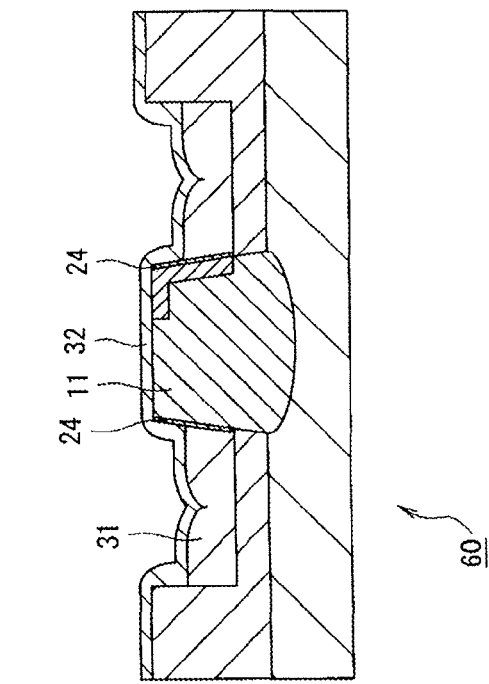

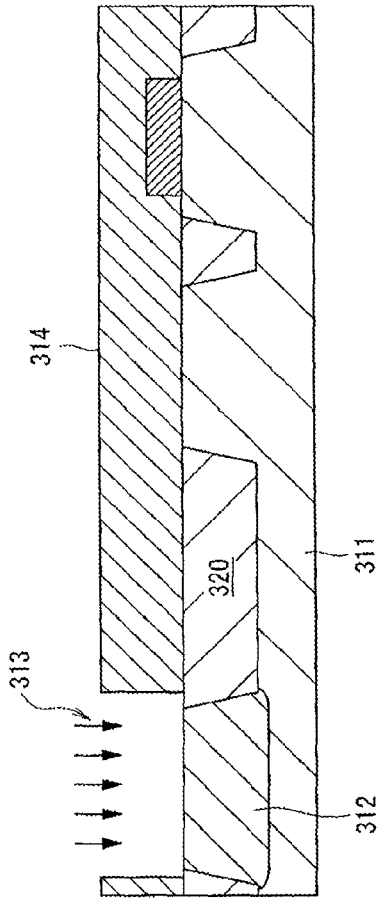
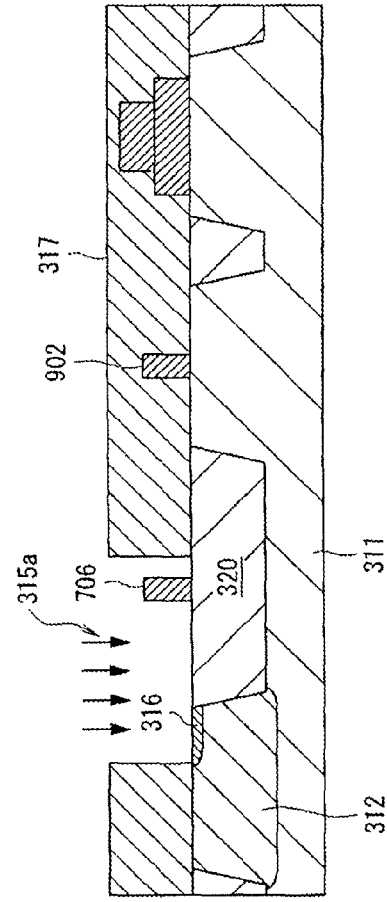
FIG. 37A
FIG. 37B

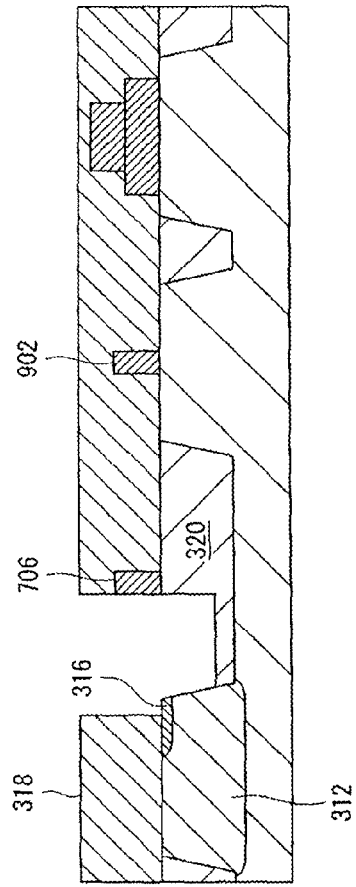
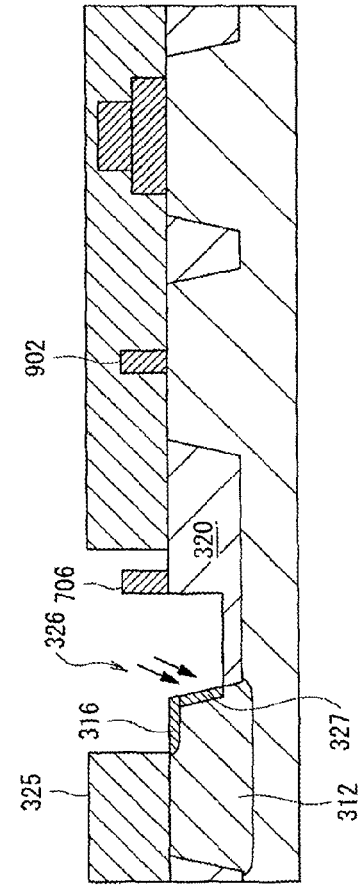
FIG. 37C
FIG. 37D

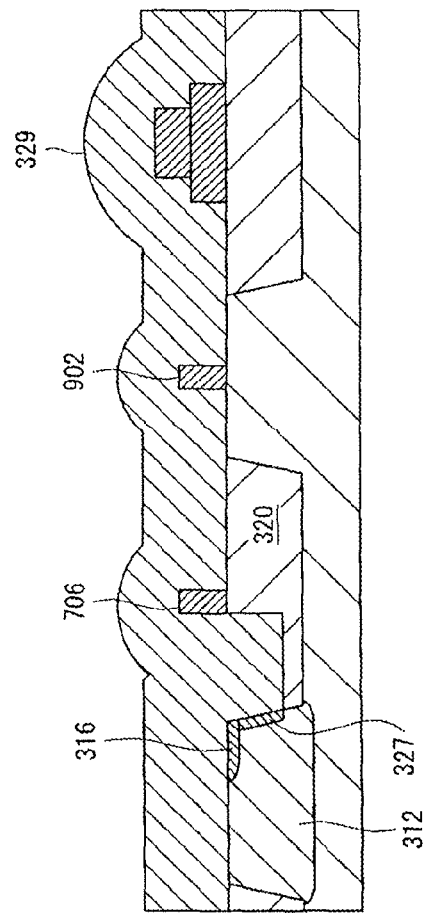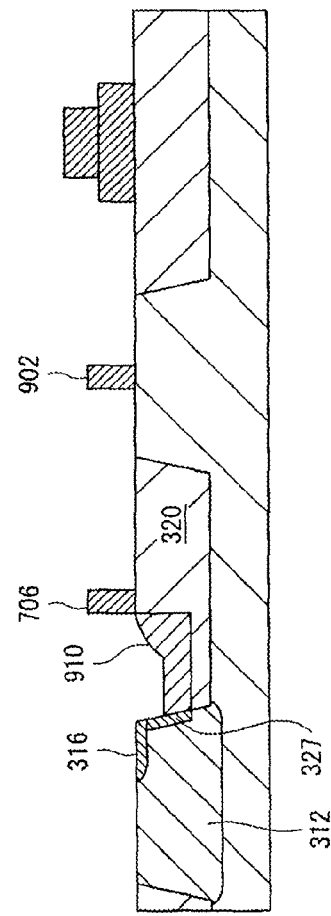
FIG. 37E
FIG. 37F

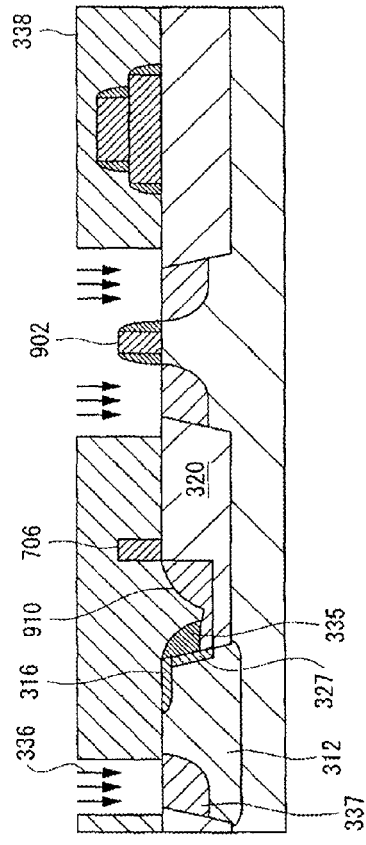
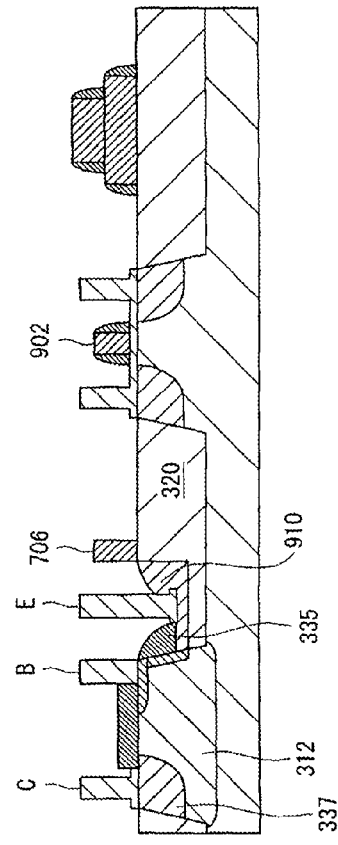
FIG. 37G
FIG. 37H

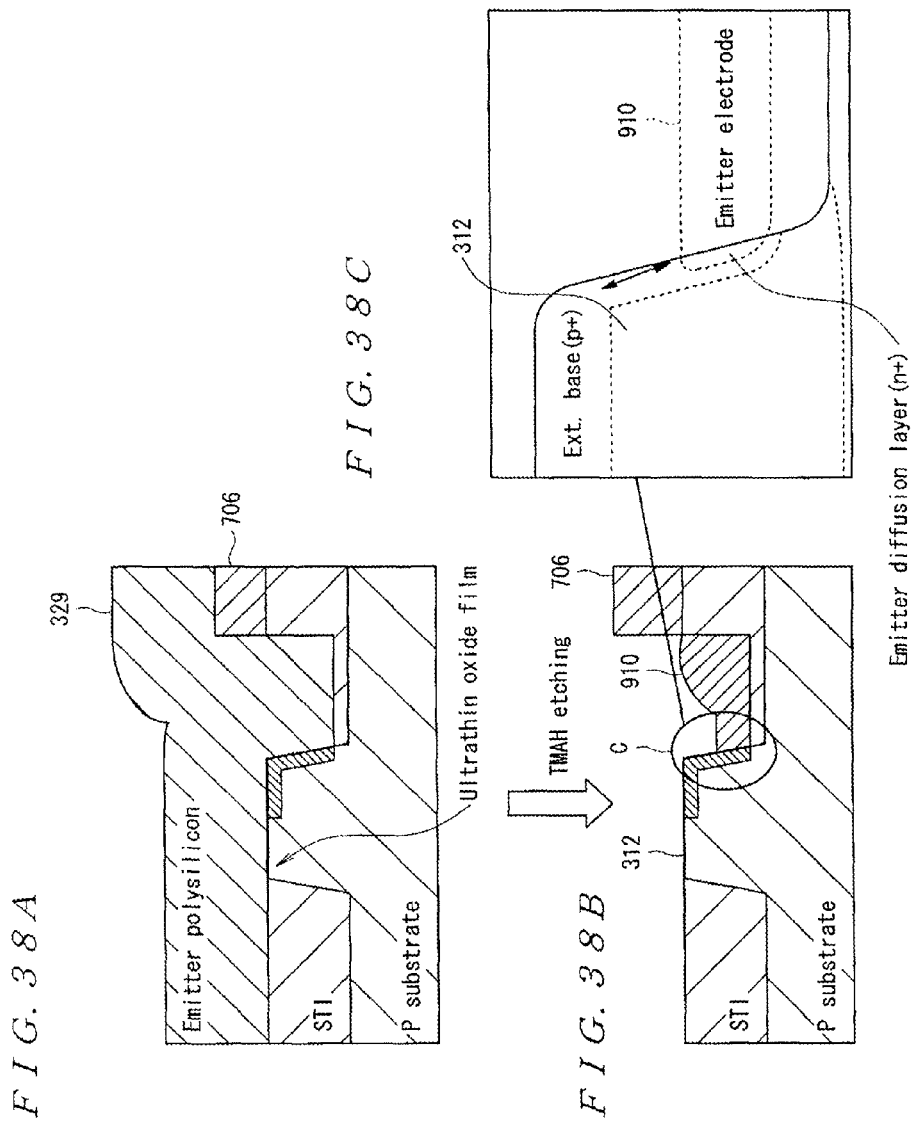

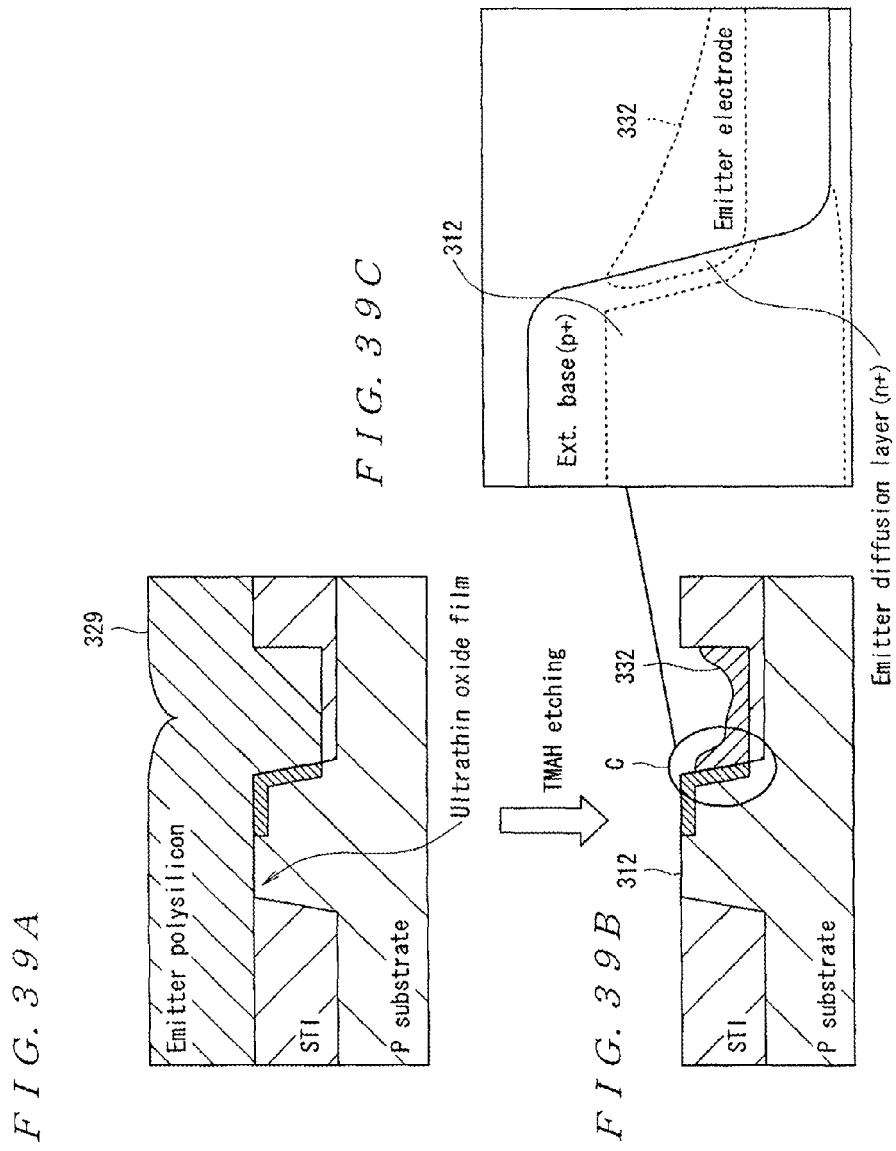

F I G. 4 0
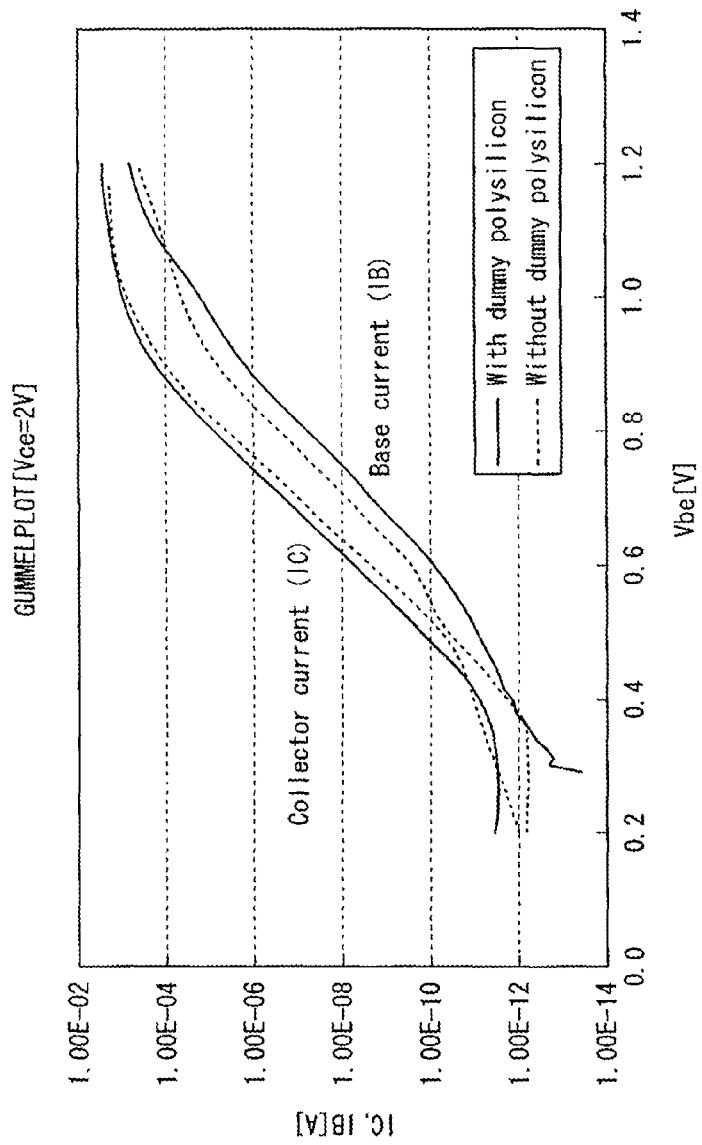

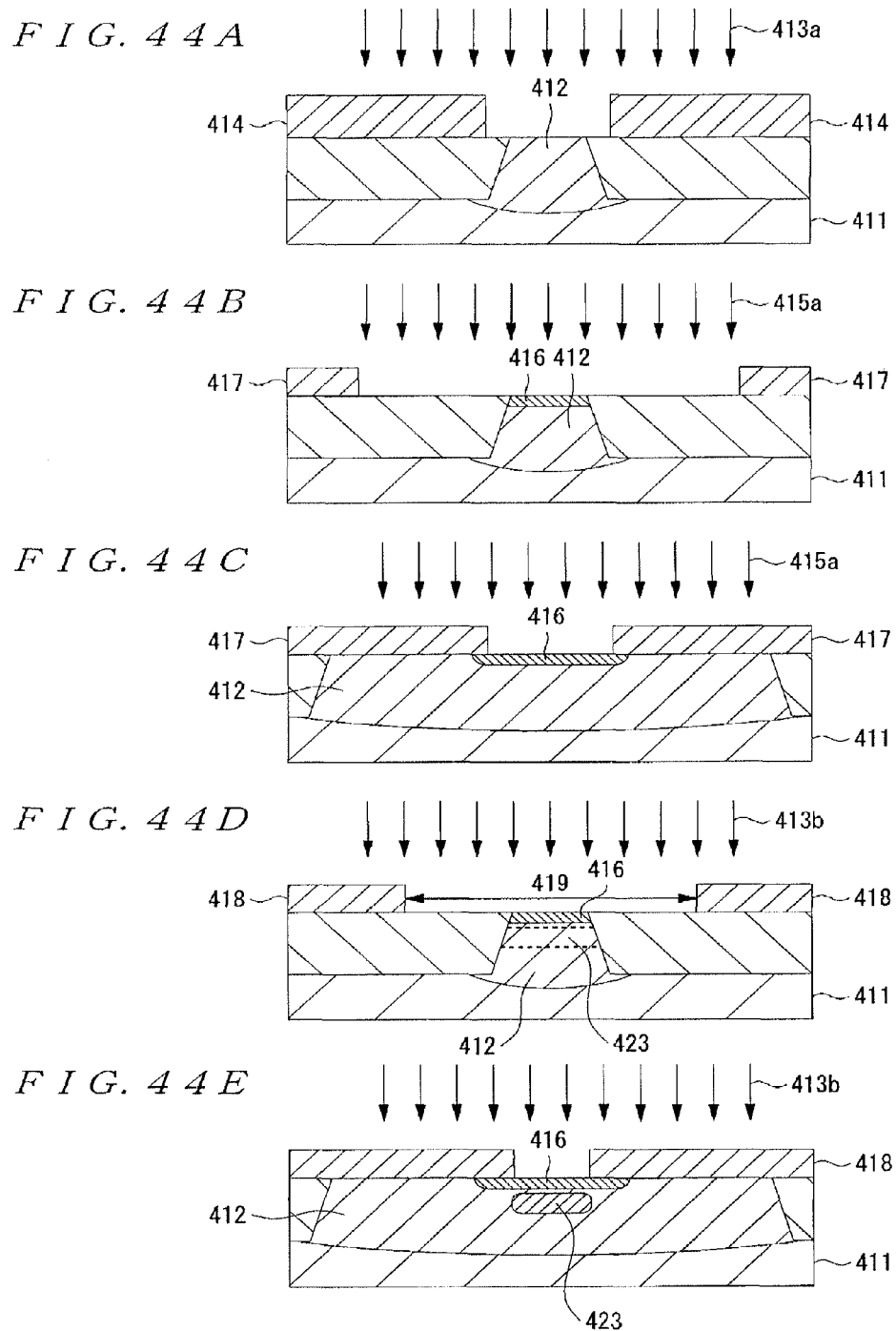

F I G. 5 1
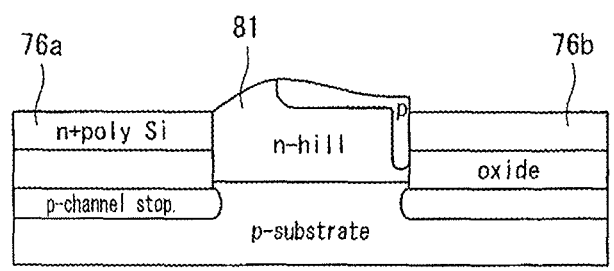

SEMICONDUCTOR DEVICE COMPRISING A LATERAL BIPOLAR TRANSISTOR

This is a divisional application of copending application Ser. No. 12/808,874, filed Jun. 17, 2010, which is hereby incorporated by reference.

TECHNICAL FIELD

The present invention relates to a semiconductor device and a method for manufacturing the semiconductor device. More particularly, the invention relates to a semiconductor device having a BiCMOS transistor configuration in which a CMOS transistor and a bipolar transistor are mounted, and to a method for manufacturing the semiconductor device.

BACKGROUND ART

Currently, remarkable progress is being made in technologies related to radio communication, and active research and development efforts are being made of small-sized ICs (Integrated Circuit) to be used in mobile phones. As one of ICs to be used mainly for mobile phones, a system-on-chip, in which an RF (Radio Frequency) circuit and a baseband circuit are mounted together on a single chip (hereinafter also referred to as hybrid integration) is now a focus of attention.

High-speed operation is needed for the RF circuit of the system-on-chip, and, miniaturization is also needed for the structure thereof. On the other hand, unlike the RF circuit, the baseband circuit need not be miniaturized. As is generally known, advanced miniaturization technology may lead to the problem that the cost of manufacture increases and the yield of manufacture decreases.

Incidentally, as is well known, transistors including an IC include a CMOS (Complementary MOS) transistor and a bipolar transistor. Since the gate voltage of the CMOS transistor is a low and the process steps thereof are easy to perform, the CMOS transistor is applied as an element of many types of ICs. On the other hand, the bipolar transistor is known to be more advantageous for high-speed operation than the CMOS transistor. Comparison between a bipolar transistor and a CMOS transistor both having the same microstructure shows that the bipolar transistor can achieve operating speed as high as that of a CMOS transistor of one or two generations ahead.

In consideration of the above-described viewpoint, it is desirable that the RF circuit of a system-on-chip should be composed of bipolar transistors advantageous for high-speed operation and the baseband circuit of the system-on-chip is composed of easy-to-manufacture CMOS transistors. A transistor which includes a bipolar transistor and a CMOS transistor will hereinafter be referred to as a BiCMOS transistor.

Bipolar transistors are classified into vertical transistors and lateral transistors. In a vertical bipolar transistor, carriers flow from an emitter in a vertical direction and reach a collector. Since a collector region is formed in a position deep from a wafer surface, an emitter-collector resistance increases, thus making the transistor disadvantageous for high-speed operation. In addition, the transistor requires a high-concentration buried layer, a collector epitaxial layer, a deep trench isolation, and the like. Consequently, the number of process steps increases, thus increasing costs to increase.

Meanwhile, the lateral bipolar transistor is simpler in structure than the vertical bipolar transistor. In addition, a BiCMOS transistor can be composed by adding a relatively small number of process steps to that of a CMOS transistor. Furthermore, since a collector electrode can be directly brought into contact with a collector region, the lateral bipolar transistor is also advantageous for high-speed operation. Accordingly, in the BiCMOS transistor, it is desirable to apply the lateral bipolar transistor in which carries flow in a lateral direction.

A lateral bipolar transistor is described in, for example, US 2005/0040495 A1 (hereinafter also referred to as Patent Document 1). The lateral NPN transistor described in Patent Document 1 is a transistor called a Horizontal Current Bipolar Transistor (HCBT).

DISCLOSURE OF THE INVENTION

Problems to be Solved by the Invention

The HCBT described in the aforementioned Patent Document 1, however, is not assumed to be applied to a BiCMOS transistor in combination with a CMOS transistor. Accordingly, if the HCBT and the CMOS transistor are hybrid-integrated to form a BiCMOS transistor, such process problems as described below will arise.

FIG. 49 is a cross-sectional view of the HCBT described in Patent Document 1. The HCBT illustrated in FIG. 49 includes a collector electrode 77, a base electrode 78, and an emitter electrode 79. In an active region (herein, referred to as n-hill layer) 81 of the HCBT, an intrinsic base layer 88 is formed first, and then an extrinsic base layer 89 for external contact is formed.

FIGS. 50A to 50F are process drawings used to explain the process of the HCBT illustrated in FIG. 49. In a process of forming the HCBT alone in order to first form a shallow trench isolation, an Si nitride film 83 is formed on an ion-implanted Si substrate and then etched to form an n-hill layer 81, as illustrated in FIG. 50A. Then, as illustrated in FIG. 50B, a CVD (Chemical Vapor Deposition) oxide film is formed over the entire surface of the HCBT from above the Si nitride film 83 etched along with the Si substrate. After CMP (Chemical Mechanical Polishing) is performed, the entire surface is wet-etched. As a result of the wet etching, an oxide film 90 remains as illustrated in FIG. 5C, thereby forming the shallow trench isolation. After the formation of the shallow trench isolation, ions are implanted into side surfaces of the n-hill layer 81 to form the intrinsic base layer 88. In addition, as illustrated in FIG. 50D, ions are implanted from above the Si nitride film 83 to form the extrinsic base layer 89.

Next, a doped polysilicon film is formed and etched. In this step, as illustrated in FIG. 50E, an N+ polysilicon film 92 relatively high in impurity concentration is formed on the n-hill layer 81 and an undoped polysilicon film 93 is formed on the N+ polysilicon film 92. Next, the undoped polysilicon film 93 and the N+ polysilicon film 92 are etched back by etching or by a combination of CMP and etching. At this time, the n-hill layer 81 is covered with the Si nitride film 83 and is, therefore, protected from the etching. As a result, doped polysilicons 76a and 76b illustrated in FIG. 50F remain around the n-hill layer 81.

However, an etchant (20% tetramethylammonium hydroxide solution, which is hereinafter referred to as "TMAH solution") used in the aforementioned etching does not provide any sufficient selection ratio between the n-hill layer 81 and the doped polysilicons 76a and 76b. For this reason, in Patent Document 1, the Si nitride film 83 formed beforehand on the n-hill layer 81 serves as an etching mask for the doped polysilicons 76a and 76b.

Incidentally, when the HCBT is hybrid-integrated together with a CMOS transistor, the width of a base region of the HCBT needs to be reduced as much as possible. It is therefore essential to avoid the effects of heat treatment at the time of forming a CMOS. Thus, the HCBT is desirably formed later than the formation of the CMOS transistor.

When the CMOS transistor is formed prior to the formation of the HCBT, elements are isolated by the above-described step for the shallow trench isolation, and the CMOS transistor is first formed. However, a screening oxide film is generally formed on the Si substrate at the time of forming the CMOS transistor, in order to prevent channeling during ion implantation. In addition, the Si nitride film 83 is a mask for the formation of the shallow trench isolation and is, therefore, not uniform in thickness. Thus, the Si nitride film 83 cannot be used to prevent channeling in ion implantation. This means that the Si nitride film 83 has to be removed prior to the ion implantation of the CMOS transistor, in order to hybrid-integrate the CMOS transistor. This is because it is difficult to selectively dry-etch the Si nitride film 83 and the film is therefore generally removed by overall wet etching using hot phosphoric acid.

However, if the doped polysilicons 76a and 76b are etched with the Si nitride film 83 removed, there is a risk of even the n-hill layer 81 being etched due to the aforementioned selection ratio problem. FIG. 51 illustrates an etched state of the n-hill layer 81.

Furthermore, in Patent Document 1, the extrinsic base layer 89 of the HCBT is formed subsequently to the formation of the intrinsic base layer 88. Such a process may cause a problem that impurities implanted into the extrinsic base layer 89 may affect the profile of the intrinsic base layer 88.

In addition, a wafer of (110) plane is used in this process and the intrinsic base layer is protected by a spacer formed of a (111) plane when a polysilicon is etched using TMAH. There remains a problem, however, that it is difficult for the wafer of (110) plane to be shared with a bulk CMOS.

Such a problem is a specific example of several problems when a lateral bipolar transistor (HCBT) having a particular structure and a transistor formed by a CMOS process are hybrid-integrated. The present invention is intended to provide a semiconductor device capable of separately dealing with each of such several problems, and a method for manufacturing the semiconductor device.

Means for Solving the Problems

In order to solve the aforementioned problems, a semiconductor device according to an aspect of the present invention includes a lateral bipolar transistor and a CMOS transistor hybrid-integrated therein, the lateral bipolar transistor including: an open region opened in a device isolating oxide film surrounding an active region; a polysilicon film formed on the open region; and a protective film covering at least a part of a peripheral surface of the active region exposed by opening the open region in the device isolating oxide film, wherein the polysilicon film has such a thickness as to expose the active region out of the polysilicon film, and the protective film is a film for preventing the active region from being etched when the polysilicon film is etched to the thickness.

In addition, a semiconductor device according to another aspect of the present invention includes a lateral bipolar transistor and a CMOS transistor hybrid-integrated therein, the lateral bipolar transistor including: an open region opened in a device isolating oxide film surrounding an active region; a polysilicon film formed on the open region; a protective film covering at least a part of a peripheral surface of the active region exposed by opening the open region in the device isolating oxide film; a collector diffusion layer formed in the active region; and a collector electrode directly connected to the collector diffusion layer region, wherein the polysilicon film has such a thickness as to expose the active region out of the polysilicon film, and the protective film is a film for preventing the active region from being etched when the polysilicon film is etched to the thickness.

In addition, a semiconductor device according to yet another aspect of the present invention includes a lateral bipolar transistor, the lateral bipolar transistor including: a substrate including a first conductive layer; an active region located on the first conductive layer and having such a shape as to protrude from the first conductive layer and have an upper surface and at least one side surface in contact with the upper surface; an open region opened in a device isolating oxide film surrounding the active region; a polysilicon film formed on the open region; an emitter region solid-phase diffused from the polysilicon film; and a dummy gate polysilicon formed in the device isolating oxide film, wherein the shape of the emitter region solid-phase diffused from the polysilicon film is controlled by the dummy gate polysilicon.

In addition, a semiconductor device according to further another aspect of the present invention includes a lateral bipolar transistor, the lateral bipolar transistor including: a substrate including a first conductive layer; an active region located on the first conductive layer and having such a shape as to protrude from the first conductive layer and have an upper surface and at least one side surface in contact with the upper surface; and a device isolating oxide film partially covering the side surface of the active region, wherein the active region includes a second conductive layer having a polarity different from that of the first conductive layer, and the active region further includes a third conductive layer having the same polarity as that of the first conductive layer in the upper surface and in two opposed positions of the at least one side surface.

In the above semiconductor device, the third conductive layer includes a fourth conductive layer having the same polarity as that of the second conductive layer.

In the above semiconductor device, the fourth conductive layer is connected to an emitter electrode.

In the above semiconductor device a, the semiconductor device further includes a contact electrode and the active region is electrically connected to the contact electrode.

In the above semiconductor device, the semiconductor device further includes at least two contact electrodes and the active region is electrically connected to the contact electrodes.

In the above semiconductor device, the impurity concentration and width of the active region are set so that the active region as a whole becomes depleted when the lateral bipolar transistor is electrically enabled.

In the above semiconductor device, a ratio between the impurity concentration of the active region and the impurity concentration of the third conductive layer is within a range of 1:10 to 1:10000.

In the above semiconductor device, further includes a CMOS transistor integrated on the substrate.

A method for manufacturing a semiconductor device, according to further another aspect of the present invention, in which a lateral bipolar transistor and a CMOS transistor are hybrid-integrated, the method including the steps of: forming an extrinsic base region for externally connecting the base region of the active region of the lateral bipolar transistor, following a step of at least one time of ion implantation in which an impurity is implanted with the gate electrode of the CMOS transistor used as a mask; forming an open region around the active region by removing a predetermined portion of the device isolating oxide film surrounding the active region; forming an intrinsic base region of the lateral bipolar transistor by implanting ions in a region of a side surface of the active region exposed by the formation of the open region partially overlapping with the extrinsic base region; forming a protective film for protecting the active region during etching in a subsequent step on a surface of the active region; forming an impurity-containing polysilicon film in a region including the active region in which the protective film is formed and the open region in the protective film formation step; etching away the polysilicon film by a predetermined thickness; and forming an emitter diffusion layer region and a collector diffusion layer region by solid-phase diffusing an impurity from the impurity-containing polysilicon film left after etching in the polysilicon etching step.

In the above method for manufacturing a semiconductor device, according to further another aspect of the present invention, the protective film is an oxide film having such a thickness as to prevent the active region of the lateral bipolar transistor from being etched in the polysilicon etching step.

A method for manufacturing a semiconductor device, according to further another aspect of the present invention, in which a lateral bipolar transistor and a CMOS transistor are hybrid-integrated, the method including the steps of: forming an extrinsic base region for externally connecting the base region of the active region of the lateral bipolar transistor, following a step of at least one time of conductive film formation in which an impurity is implanted with the gate electrode of the CMOS transistor used as a mask; forming an open region around the active region by removing a predetermined portion of the device isolating oxide film surrounding the active region; forming an intrinsic base region of the lateral bipolar transistor by implanting ions in a region of a side surface of the active region exposed by the formation of the open region partially overlapping with the extrinsic base region; forming a protective film for protecting the active region during etching in a subsequent step on a surface of the active region; forming an impurity-containing polysilicon film in a region including the active region in which the protective film is formed and the open region in the protective film formation step; etching away the polysilicon film by a predetermined thickness; forming an emitter diffusion layer region by solid-phase diffusing an impurity from the impurity-containing polysilicon film left after etching in the polysilicon etching step; forming an collector diffusion region in the active layer; and forming an electrode directly connected to the collector diffusion region.

In the above method for manufacturing a semiconductor device according, the protective film is an oxide film having such a thickness as to prevent the active region of the lateral bipolar transistor from being etched in the polysilicon etching step.

A method for manufacturing a semiconductor device including a lateral bipolar transistor, according to further another aspect of the present invention, wherein a step of manufacturing the lateral bipolar transistor includes the steps of: forming an active region having such a shape as to protrude from the first conductive layer and have an upper surface and at least one side surface in contact with the upper surface on a first conductive layer serving as a substrate; opening an open region in the device isolating oxide film surrounding the active region; forming a polysilicon film on the open region; forming an emitter region by solid-phase diffusing the emitter region from the polysilicon film; and forming a dummy gate polysilicon in the device isolating oxide film, wherein the shape of the emitter region solid-phase diffused from the polysilicon film is controlled by the dummy gate polysilicon.

Advantages of the Invention

According to the invention as described above, the semiconductor device includes the protective film for preventing the active region from being etched at the time of etching the polysilicon film. Consequently, even if the polysilicon film is etched until the active region becomes exposed, the active region is not etched. Therefore, it is possible to enhance the reliability of the characteristics of the semiconductor device having a BiCMOS transistor structure. It is also possible to increase the yield of manufacture, thereby contributing to reducing manufacturing costs.

According to the invention as described above, only the polysilicon film is etched when the polysilicon film is etched. Thus, the protective film makes it possible to prevent the active region from being etched. Accordingly, it is possible to improve the reliability of the semiconductor device having a BiCMOS transistor structure. In addition, it is possible to reduce manufacturing costs since any extra costs are not necessary. Furthermore, it is possible to mitigate damage to be caused to the lateral bipolar transistor by heat treatment performed at the time of forming the CMOS transistor. Still furthermore, according to the invention as described above, it is possible further to form the collector region directly in the active region over a wide range. Thus, it is possible to improve high-frequency characteristics.

According to the invention as described above, it is possible to control the shape of the emitter polysilicon. Consequently, it is possible to prevent any nonuniformity from arising as a result of planarizing a surface of emitter polysilicon. Thus, it is possible to obtain excellent contact with the emitter polysilicon. In addition, it is possible to secure a correct distance between the emitter region formed by the solid-phase diffusion of an n-type impurity from the polysilicon and the extrinsic base layer. Thus, it is possible to improve electrical characteristics.

According to the invention as described above, a depletion region extends from the upper and side surfaces of the active region. This depletion region further extends depending on a voltage applied. A depletion layer extending from an opposite side coalesces with the upper surface to form a collector region depleted sufficiently enough to restrict an electric field. This makes it possible to increase an emitter-collector breakdown voltage.

In addition, according to the invention as described above, a step of forming the intrinsic base region vulnerable to heat, among the steps of manufacturing the lateral bipolar transistor, can be carried out subsequently to at least one-time ion implantation into the CMOS transistor. Accordingly, in the BiCMOS transistor, it is possible to mitigate the degree to which the lateral bipolar transistor may be affected by heat treatment performed after ion implantation in the manufacture of the CMOS transistor.

In addition, the intrinsic base region can be formed by forming the extrinsic base region to serve as an extrinsic base layer, forming the open region to expose a side surface of the active region, and implanting ions into the side surface. By doing so, it is possible to implant only ions into the upper surface of the active region at the time of ion implantation performed for the extrinsic base region. Accordingly, it is possible to alleviate effects exerted by a profile of ions implanted into the front surface of the active region on ions implanted into the side surface.

Furthermore, the protective film is formed beforehand on a surface of the active region to etch the impurity-containing polysilicon film formed on the active region. Consequently, it is possible to prevent the active region from being etched also at the time of etching the polysilicon film. Thus, it is possible to form a lateral bipolar transistor in which correct characteristics are available.

In addition, according to the invention as described above, a high selection ratio is obtainable between the impurity-diffused polysilicon and the active region which is impurity-implanted silicon. Thus, it is possible to adopt a relatively easy-to-form oxide film as the protective film.

According to the invention as described above, only the polysilicon film is etched when the polysilicon film is etched. Thus, the protective film makes it possible to prevent the active region from being etched. Accordingly, it is possible to improve the reliability of the semiconductor device having a BiCMOS transistor structure. In addition, it is possible to reduce manufacturing costs since any extra costs are not necessary. Furthermore, it is possible to mitigate damage to be caused to the lateral bipolar transistor by heat treatment performed at the time of forming the CMOS transistor. Also according to the invention as described above, it is possible further to form the collector region directly in the active region over a wide range. Thus, it is possible to improve high-frequency characteristics.

In addition, according to the invention as described above, it is possible to use an oxide film appropriate for the protective film.

In addition, according to the invention as described above, it is possible to control the shape of the emitter region by the presence of the dummy gate polysilicon. Thus, it is possible to obtain excellent electrical characteristics.

BRIEF DESCRIPTION OF THE DRAWINGS

FIG. 1 is a top view of a semiconductor device according to a first embodiment of the present invention, depicting a state in which a lateral bipolar transistor and a CMOS transistor are hybrid-integrated FIGS. 2A and 2B are cross-sectional views depicting a configuration of the semiconductor device according to the first embodiment of the present invention;

FIGS. 4A and 4B are views depicting the method for manufacturing the semiconductor device according to the first embodiment of the present invention;

FIGS. 5A and 5B are views depicting the method for manufacturing the semiconductor device according to the first embodiment of the present invention;

FIGS. 6A and 6B are views depicting the method for manufacturing the semiconductor device according to the first embodiment of the present invention;

FIGS. 15A and 15B are views depicting the method for manufacturing the semiconductor device according to the first embodiment of the present invention;

FIGS. 19A and 19B are views depicting the method for manufacturing the semiconductor device according to the first embodiment of the present invention;

FIGS. 22A and 22B are views depicting the method for manufacturing the semiconductor device according to the first embodiment of the present invention;

FIGS. 37A to 37H illustrate a process flow applied to the dummy gate polysilicon explained in FIG. 36;

FIGS. 38A to 38C are views depicting the effects of the dummy gate polysilicon according to the third embodiment of the present invention;

FIGS. 39A to 39C are views depicting a process not using the dummy gate polysilicon in order to make a comparison with the process using the dummy gate polysilicon illustrated in FIG. 38A to FIG. 38C;

FIG. 40 is a graphical view illustrating a Gummel plot of a HCBT formed by the process using the dummy gate polysilicon according to the third embodiment of the present invention, in comparison with a Gummel plot of an HCBT formed by the process not using the dummy gate polysilicon;

FIG. 42B is a cross-sectional view taken along a plane 452 shown in FIG. 42A, FIG. 42C is a view depicting a depletion layer and an electric field in the cross section illustrated in FIG. 42B, and FIG. 42D is a graphical view illustrating a potential and an electric field in FIG. 42B;

FIG. 51 is a view schematically illustrating a state in which an active region is etched in the related art.

Figure 3A:
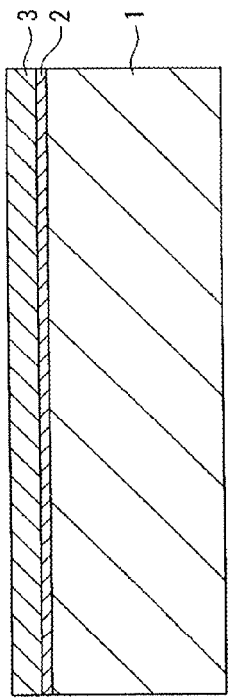
FIGS. 3A and 3B are views depicting a method for manufacturing the semiconductor device according to the first embodiment of the present invention.

DESCRIPTION OF SYMBOLS 1, 311, 411: Si substrate
6, 320, 420: Shallow trench isolation (device isolating oxide film)
11, 312, 412: n-hill layer
20, 316, 416: Extrinsic base layer
23, 327, 427: Intrinsic base layer
24, 328, 428: Ultrathin oxide film
30, 329, 429: Polysilicon
32a, 32b, 335, 435: Spacer
35, 439: Emitter diffusion layer
36: Collector diffusion layer
41, 442: Silicide
50, 344, 444: Contact hole
301, 401: Active mask
302, 402: n-hill ion implantation mask
303, 403: Base mask
304, 404a, 404b: Device isolating oxide film etching mask
305, 405: n+ ion implantation mask
306a, 306b, 406a, 406b: Silicidation blocking mask
307, 407: Contact mask
313, 413a: Collector ion implantation
315a, 415a: Extrinsic base ion implantation
319: Emitter window
321, 421: Side surface of n-hill layer
324, 413b: Ion implantation of additional collector (SIC)
326, 426a, 426b: Ion implantation of intrinsic base
328: Active region of transistor's side surface
331, 434: Depression
332, 910, 432: Emitter polysilicon
337, 437: Collector contact region
408: Polysilicon mask used to improve polysilicon planarization
706: Dummy gate polysilicon

BEST MODE FOR CARRYING OUT THE INVENTION

Hereinafter, a method for manufacturing a semiconductor device according to the first embodiment of the present invention will be described with reference to the accompanying drawings.

(First Embodiment)

FIG. 1 is a top view of the semiconductor device according to a first embodiment of the present invention, and is used to explain a state in which a lateral bipolar transistor and a CMOS transistor are hybrid-integrated. The semiconductor device according to the first embodiment is configured by hybrid-integrating an HCBT 100, which is the lateral bipolar transistor, and a CMOS transistor 200 on a device isolating oxide film 6 formed on an Si substrate to serve as a shallow trench isolation. In a region of the device isolating oxide film 6 in which the HCBT 100 is formed is described as an HCBT region 60, an a region the device isolating oxide film 6 in which the CMOS transistor 200 is formed is described as a CMOS region 70.

As illustrated in the figure, the HCBT 100 includes a collector, a base and an emitter. The collector has a collector electrode 31B and the emitter has an emitter electrode 31A. The base has an extrinsic base layer 20 and an intrinsic base layer 23 on an active region (n-hill layer) 11, though only the extrinsic base layer 20 is visible from the upper surface of the HCBT 100. An interconnect layer 51 is formed in each electrode of the collector, base and emitter through a contact hole 50 illustrated in FIG. 2.

On the other hand, the CMOS transistor 200 is configured by forming a gate electrode 13 on a well layer 10. Interconnect layers 51 are formed in the well layer 10 and the gate electrode 13 through the contact hole 50 illustrated in FIG. 2.

FIG. 2 is a cross-sectional view used to explain a configuration of the semiconductor device according to the first embodiment, where FIG. 2A illustrates the HCBT 100 and FIG. 2(B) illustrates the CMOS transistor 200.

The HCBT 100 includes: an open region 21 opened by etching the device isolating oxide film 6 which is a device isolating region surrounding the n-hill layer 11; the emitter electrode 31A and the collector electrode 31B which are polysilicon films formed within the open region 21; and an ultrathin oxide film 24 covering at least a part of the n-hill layer 11. The polysilicon films to serve as the emitter electrode 31A and the collector electrode 31B have such a thickness (film thickness) as to expose the n-hill layer 11.

The polysilicon films to serve as the emitter electrode 31A and the collector electrode 31B are set to a thickness illustrated in the figure by etching a polysilicon film formed on the n-hill layer 11. The ultrathin oxide film 24 is a protective film for preventing the n-hill layer 11 from being etched during etching performed to form the emitter electrode 31A and the collector electrode 31B.

In the first embodiment, the ultrathin oxide film 24 is set to such a thickness as to prevent the n-hill layer 11 from being etched in a later-described polysilicon etching process.

The extrinsic base layer 20 and the intrinsic base layer 23 to serve as a base region, an emitter diffusion layer 35, and a collector diffusion layer 36 are provided in the n-hill layer 11 of the HCBT 100.

The emitter diffusion layer 35 is electrically connected to an interconnect layer 51 (denoted as E in the figure) through the emitter electrode 31A. In addition, the collector diffusion layer 36 is electrically connected to another interconnect layer 51 (denoted as C in the figure) through the collector electrode 31B. The extrinsic base layer 20 and the intrinsic base layer 23 are electrically connected to another interconnect layer 51 (denoted as B in the figure).

In the CMOS region 70, a P- or N-type well layer 10 is formed in the Si substrate. The CMOS transistor 200 includes a gate oxide film 12 formed underneath the gate electrode 13 on the well layer 10. In addition, the CMOS transistor 200 includes an impurity layer 34 provided on each side of the gate electrode 13 to serve as a source or a drain. Each impurity layer 34 is electrically connected to an interconnect layer 51 to serve as a source electrode S or a drain electrode D.

(Manufacturing Process)

Hereinafter, a method for manufacturing the semiconductor device according to the first embodiment will be described with reference to FIGS. 3 to 27. In FIGS. 3 to 27, suffix A of each figure number denotes a manufacturing process of the HCBT 100 and suffix B denotes a manufacturing process of the CMOS transistor 200.

In the manufacturing method according to the first embodiment, the CMOS transistor 200 and the HCBT 100 are formed on a P-type Si substrate 1 to configure a BiCMOS transistor. In the first embodiment, the Si substrate 1 is a wafer having a specific resistance of 9 to 12 Ω·cm fabricated from single-crystal Si.

Figure 3B:
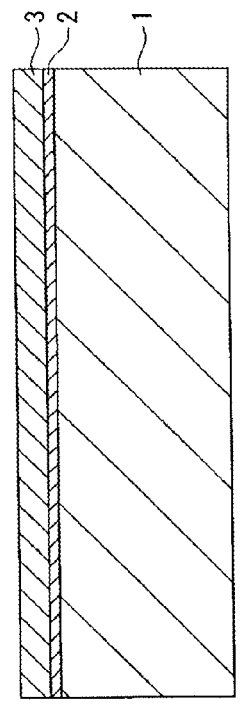

Next, in the first embodiment, an oxide film ($SiO_2$ film) 2 is formed on the Si substrate 1, as illustrated in FIGS. 3A and 3B. Subsequently, an Si nitride film (SiN film) 3 is formed on the oxide film 2. The oxide film 2 is approximately 10 nm thick and the Si nitride film 3 is approximately 140 nm thick. It is to be noted that the Si nitride film has an $Si_3N_4$ composition in many cases.

Next, as illustrated in FIGS. 4A and 4B, a resist pattern R1 covering the active regions of the HCBT 100 and CMOS transistor 200 is formed thereon. The oxide film 2 and the Si nitride film 3 are dry-etched with the resist pattern R1 used as a mask to pattern the films. After the etching, the resist pattern R1 is removed by ashing or the like.

The Si substrate 1 is dry-etched with the patterned oxide film 2 and Si nitride film 3 used as masks, as illustrated in FIGS. 5A and 5B. By the dry etching, a shallow trench 4 is formed on the Si substrate 1. The shallow trench 4 is approximately 350 nm deep.

After the formation of the shallow trench, an oxide film 5 is formed by CVD, as illustrated in FIGS. 6A and 6B. For the oxide film 5, a TEOS (Tetra Ethyl Ortho Silicate) film (an oxide film formed by a reaction between $Si(OC_2H_5)_4$ and oxygen $O_2$), for example, is used. The TEOS film is approximately 600 nm thick.

Figure 7A:
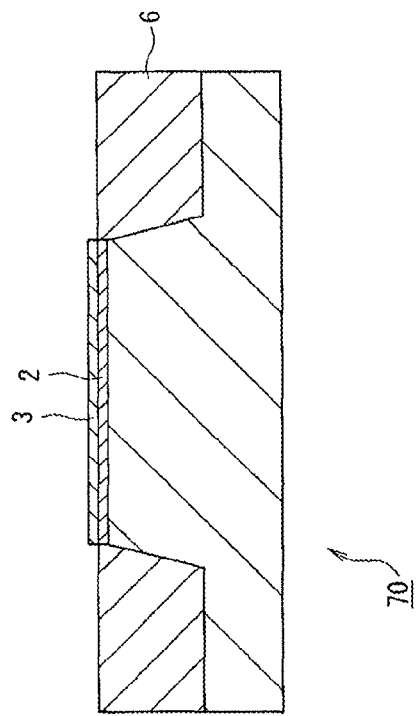
FIGS. 7A and 7B are views depicting the method for manufacturing the semiconductor device according to the first embodiment of the present invention.
Figure 7B:
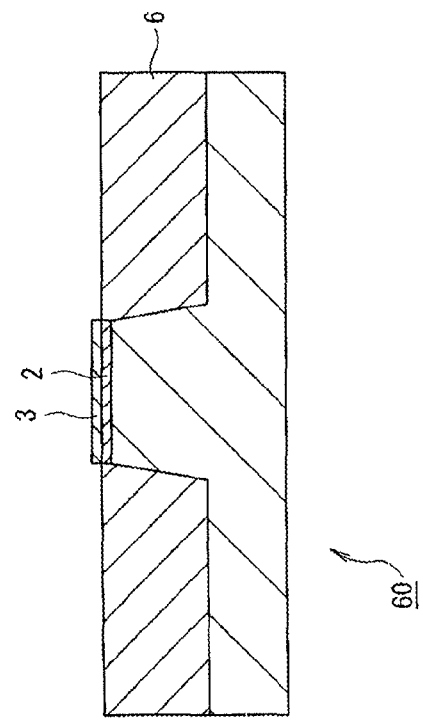

The oxide film 5 is subjected to a planarization process by CMP (Chemical Mechanical Planarization), as illustrated in FIGS. 7A and 7B. By the planarization process, an oxide film material is buried in the shallow trench 4 to form a device isolating oxide film 6 including a shallow trench isolation (STI).

The CMP is stopped before the Si nitride film 3 is entirely removed. Consequently, the n-hill layer 11 is protected by the Si nitride film 3 from abrasion. The remaining thickness of the Si nitride film 3 after CMP is approximately 60 nm. The remaining Si nitride film 3 is completely removed after the CMP. This removal is possible by, for example, soaking the Si nitride film 3 in a phosphoric acid solution of 150° C. for approximately 60 minutes.

After the removal of the Si nitride film 3, the oxide film 2 underneath the Si nitride film 3 is removed. In the first embodiment, the oxide film 2 is completely removed by wet-etching the film using a hydrofluoric acid (HF)-based solution. This wet etching is performed on the condition that, for example, the oxide film 2 is soaked in a dilute fluorinated acid solution having a composition ratio of $HF:H_2O=1:99$ for 4 to 5 minutes.

Figure 8A:
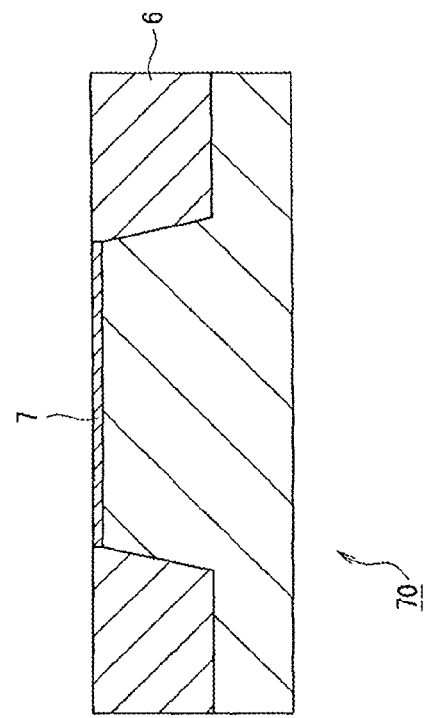
FIGS. 8A and 8B are views depicting the method for manufacturing the semiconductor device according to the first embodiment of the present invention.
Figure 8B:
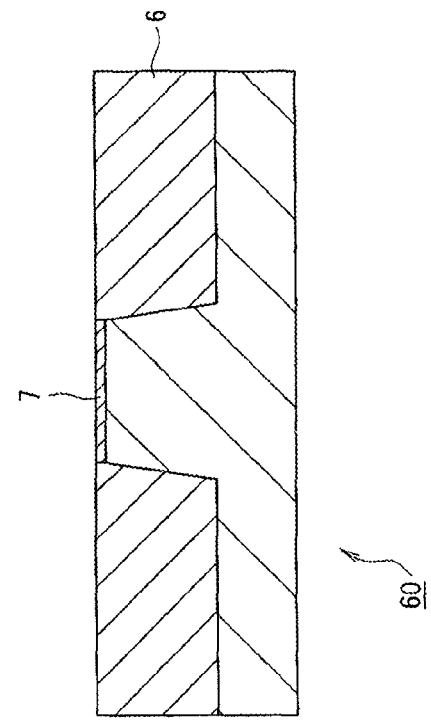

After the removal of the Si nitride film 3 and the oxide film 2, an upper portion of the n-hill layer 11 is subjected to thermal oxidation treatment to form a pad oxide film 7, as illustrated in FIGS. 8A and 8B. The pad oxide film 7 is approximately 15 nm thick.

Figure 9A:
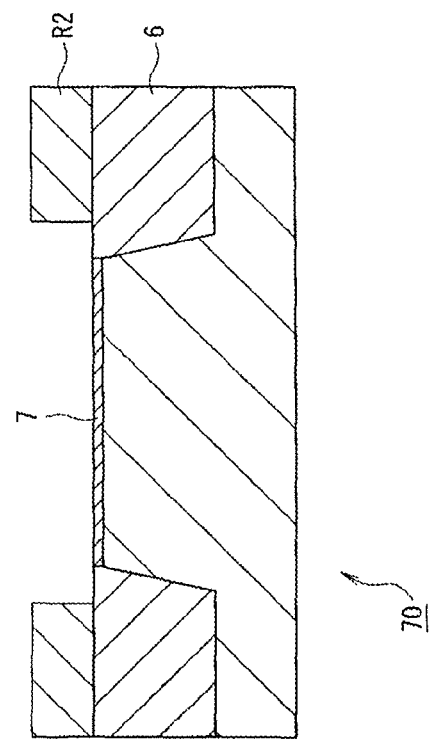
FIGS. 9A and 9B are views depicting the method for manufacturing the semiconductor device according to the first embodiment of the present invention.
Figure 9B:
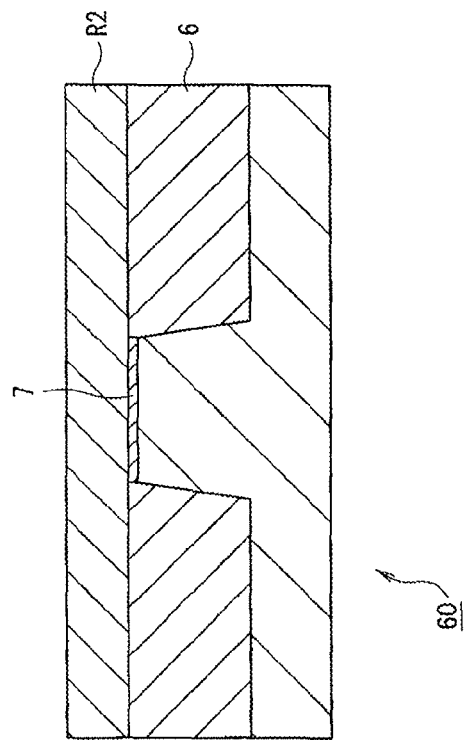

Next, as illustrated in FIG. 9B, a resist R2 having a pattern in which an opening is defined only on the active region for ion implantation is formed in the CMOS region 70. At this time, the active region and the device isolating oxide film 6 of the HCBT region 60 are covered with the resist pattern R2, as illustrated in FIG. 9A. The resist pattern R2 serves as a mask for various types of ion implantation intended for the purposes of formation of the well layer 10 of the CMOS region 70 and the threshold adjustment thereof. For this reason, the resist pattern R2 may in some cases be re-formed several times, according to the purpose of ion implantation.

Figure 10A:
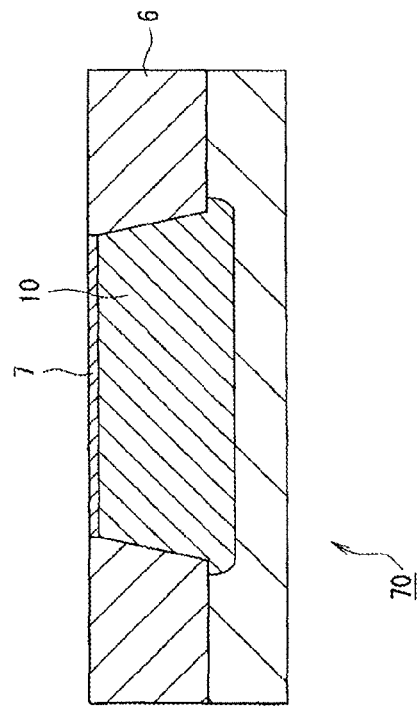
FIGS. 10A and 10B are views depicting the method for manufacturing the semiconductor device according to the first embodiment of the present invention.
Figure 10B:
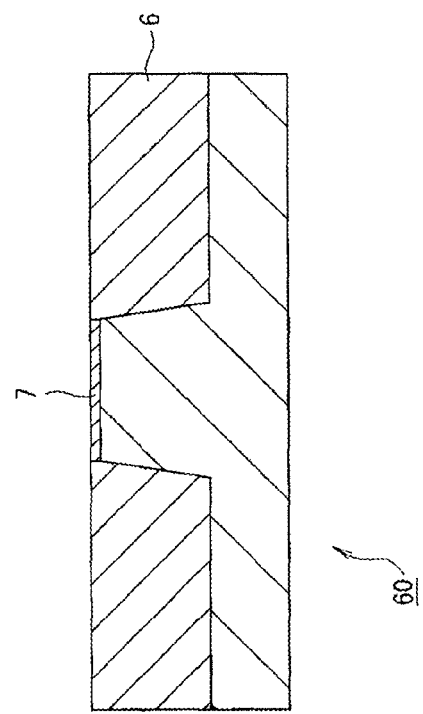

After the ion implantation, the resist pattern R2 is removed. After the separation, annealing is performed in order to diffuse implanted ions. The annealing is performed by means of, for example, RTA (Rapid Thermal Annealing) at 950° C. for 10 seconds. As the result of the annealing, the well layer 10 is formed, as illustrated in FIG. 10B.

Figure 11B:
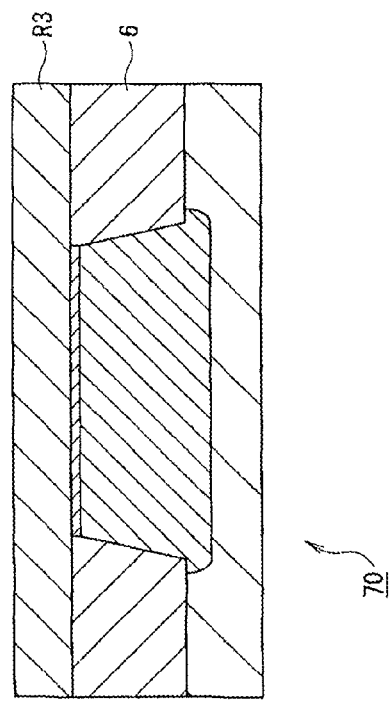
FIGS. 11A and 11B are views depicting the method for manufacturing the semiconductor device according to the first embodiment of the present invention.
Figure 11A:
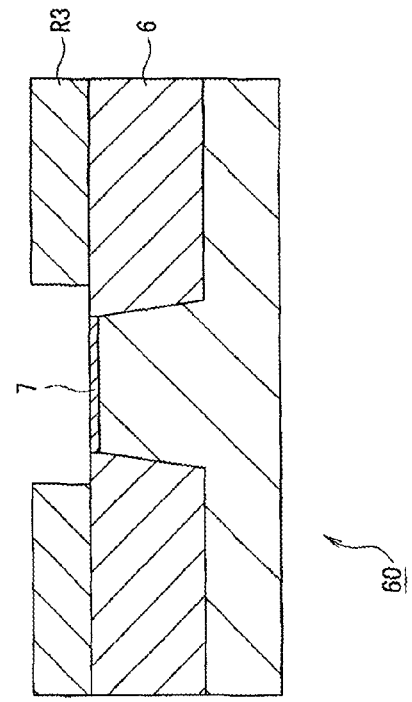

Subsequently, in order to implant ions into the HCBT region 60, a resist pattern R3 in which an opening is defined only in the active region of the HCBT region 60 is formed, as illustrated in FIG. 11A. At this time, the active region and the device isolating oxide film 6 of the CMOS region 70 are covered with the resist pattern R3, as illustrated in FIG. 11B.

Figure 12B:
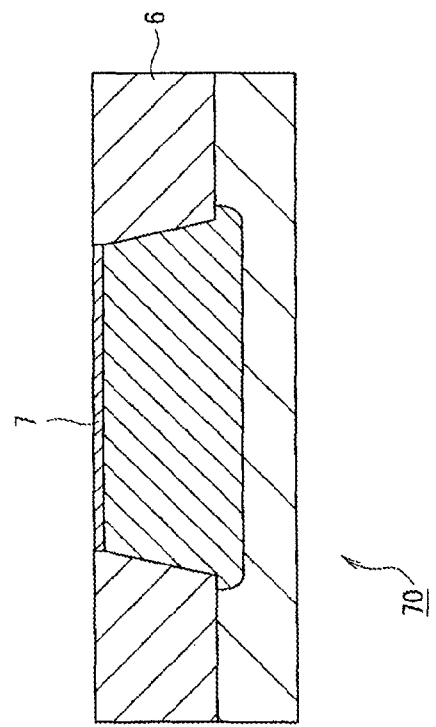
FIGS. 12A and 12B are views depicting the method for manufacturing the semiconductor device according to the first embodiment of the present invention.
Figure 12A:
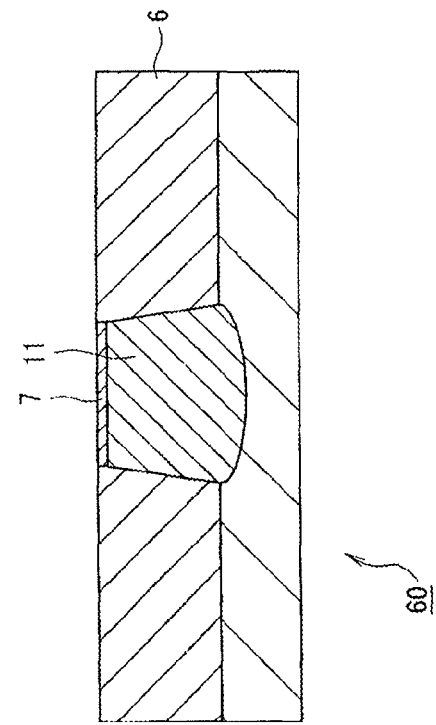

In the active region of the HCBT region 60, an N-type impurity is ion-implanted with the resist pattern R3 used as a mask. For the N-type impurity, phosphorous (P), for example, is used. The ion implantation is effectively performed by setting implantation energy in the following three process steps, for example:

$3.0 \times 10^{12}/cm^2$, 220 keV
$5.0 \times 10^{12}/cm^2$, 220 keV
$3.0 \times 10^{11}/cm^2$, 220 keV After the completion of the ion implantation, the resist pattern R3 is removed, as illustrated in FIGS. 12A and 12B. An N-type impurity region formed by the ion implantation is a region functioning as a collector diffusion layer. This region is described as the n-hill layer 11. The pad oxide film 7 on the n-hill layer 11 is removed by wet-etching the layer by using, for example, a hydrofluoric acid-based solution after the separation of the resist pattern R3.

Figure 13A:
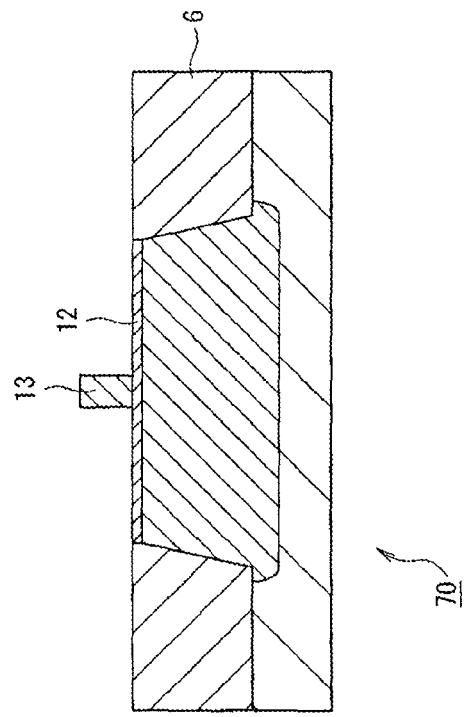
FIGS. 13A and 13B are views depicting the method for manufacturing the semiconductor device according to the first embodiment of the present invention.
Figure 13B:
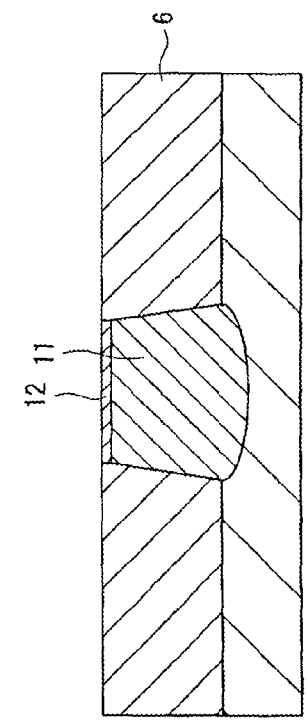

After the removal of the pad oxide film 7, a gate oxide film 12 is formed on the n-hill layer 11, as illustrated in FIGS. 13A and 13B. The gate oxide film 12 is an approximately 2.9 nm-thick oxide film formed by, for example, wet oxidization at 850° C. for 45 seconds. On the gate oxide film 12, a polysilicon (not illustrated) film is formed. The polysilicon film is formed by, for example, CVD to have a thickness of 25 nm. Phosphorous, boron or the like is implanted into the polysilicon film in order to impart conductivity to the film.

Next, a resist pattern (not illustrated) corresponding with the shape of a gate electrode is formed on the active region of the CMOS region 70. Then, a gate electrode 13 illustrated in FIG. 13B is formed by dry-etching the polysilicon film with the resist pattern used as a mask.

Here in the first embodiment, extremely light wet etching using hydrofluoric acid is performed for the purpose of reinforcing the gate oxide film 12 at edges of the gate electrode 13. After the wet etching, a thermal oxidation treatment is performed once again to form an oxide film 14 illustrated in FIGS. 14A and 14B. The oxide film 14 is approximately 2.5 nm thick. In addition, after a resist pattern (not illustrated) for covering the HCBT region 60 is formed, an n- or p-layer 15 is formed by ion implantation corresponding to the extension of the CMOS transistor 200. An impurity to be implanted is, for example, phosphorous if the CMOS transistor is an NMOS transistor or, for example, boron if the CMOS transistor is a PMOS transistor.

Next, a resist pattern R4 for partially covering the HCBT region 60 is formed on the oxide film 14 thereof, as illustrated in FIG. 15A. By ion-implanting a p-type impurity with the resist pattern R4 used as a mask, an extrinsic base layer 20 is formed in the n-hill layer 11 of the HCBT 100. It is to be noted that during this time, the upper surface of the CMOS region 70 is entirely covered with the resist pattern R4.

According to the first embodiment as described above, since the sidewalls of the n-hill layer 11 are not exposed at the time of forming the extrinsic base layer 20, it is possible to prevent the formation of the extrinsic base layer 20 from affecting an intrinsic base layer 23 to be described later.

The p-type impurity implanted to form the extrinsic base layer 20 may be, for example, $BF_2+$, implantation energy may be 15 keV, and a dose amount may be $1.5 \times 10^{15}/cm^2$. The implanted impurity is preferably subjected to RTA for activation after the separation of the resist pattern R4 by aching.

Figure 16A:
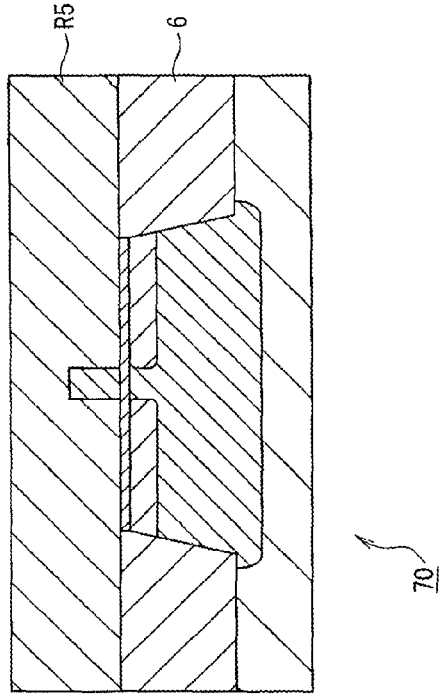
FIGS. 16A and 16B are views depicting the method for manufacturing the semiconductor device according to the first embodiment of the present invention.
Figure 16B:
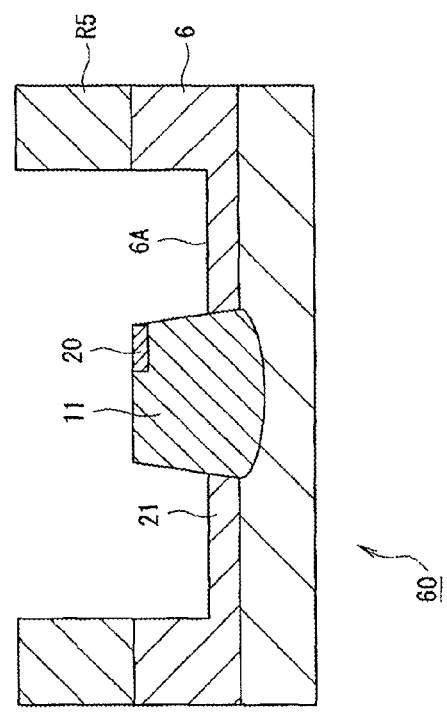

After the separation of the resist pattern R4, a resist pattern R5 is formed on the device isolating oxide film 6, as illustrated in FIG. 16A. The resist pattern R5 is formed so as to sandwich the n-hill 11 of the HCBT region 60. By wet-etching the device isolating oxide film 6 with the resist pattern R5 used as a mask, an open region 21 is formed. A portion 6A of the device isolating oxide film 6 after having been reduced by wet etching is approximately 100 nm thick.

The oxide film 14 illustrated in FIG. 15 is removed at the time of the wet etching. After the completion of the wet etching, the resist pattern R5 is removed by, for example, ashing.

Figure 17A:
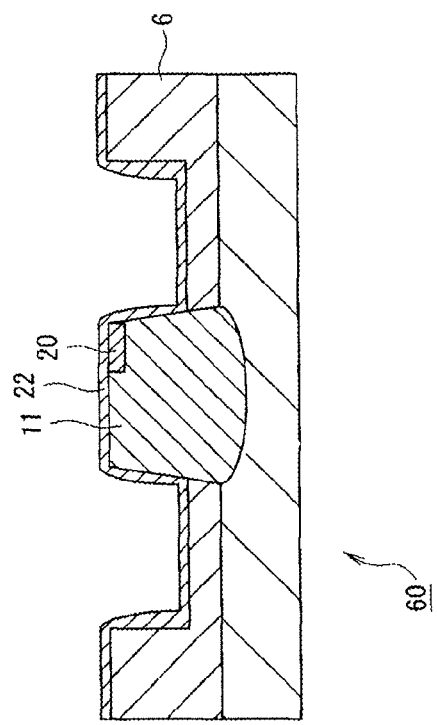
FIGS. 17A and 17B are views depicting the method for manufacturing the semiconductor device according to the first embodiment of the present invention.
Figure 17B:
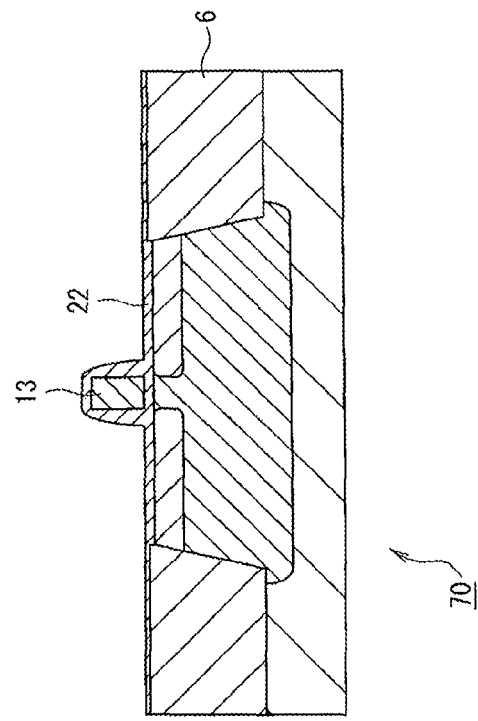

Next, as illustrated in FIGS. 17A and 17B, an oxide film 22 is formed in the HCBT region 60 and the CMOS region 70. The oxide film 22 is, for example, a TEOS film formed by CVD. The oxide film 22 is approximately 10 nm thick.

Figure 18A:
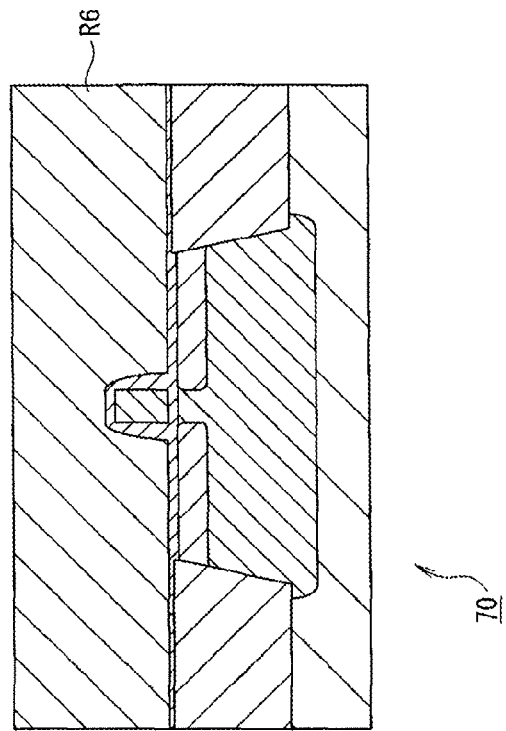
FIGS. 18A and 18B are views depicting the method for manufacturing the semiconductor device according to the first embodiment of the present invention.
Figure 18B:
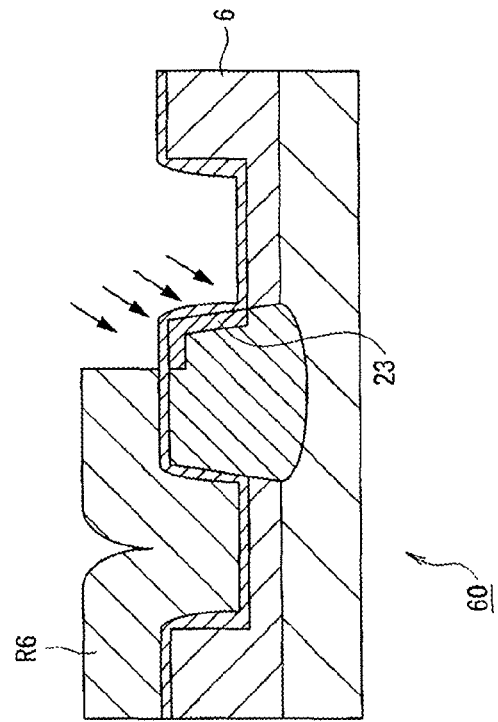

Next, a resist pattern R6 is formed on the HCBT region 60 and the CMOS region 70, as illustrated in FIGS. 18A and 18B. The resist pattern R6 is the same as the resist pattern R4 illustrated in FIG. 15. With the resist pattern R6 used as a mask, a p-type impurity is ion-implanted in the active region of the HCBT region 60. By the ion implantation, the intrinsic base layer 23 is formed on a sidewall of the n-hill layer 11. The p-type impurity to be ion-implanted is, for example, $BF_2+$. The impurity is desirably implanted obliquely at a dose amount of, for example, $7.0 \times 10^{13}/cm^2$ at an implantation energy of, for example, 35 keV. The resist pattern R6 is removed by ashing or the like after the ion implantation.

After the separation of the resist pattern R6, an ultrathin oxide film 24 is formed in the HCBT region 60 and the CMOS region 70, as illustrated in FIGS. 19A and 19B. The ultrathin oxide film 24 can be formed by, for example, performing RTA for 60 seconds under nitrogen atmosphere of 700° C. The ultrathin oxide film 24 is approximately 6 to 8 angstrom thick. The ultrathin oxide film 24 is, as a matter of course, also formed in portions of the CMOS region 70 where a silicon-containing member is exposed.

Figure 20A:
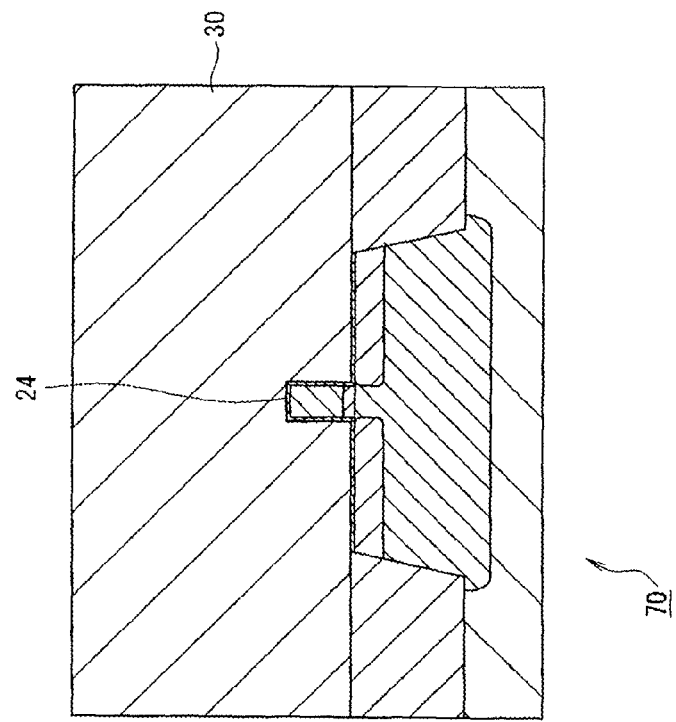
FIGS. 20A and 20B are views depicting the method for manufacturing the semiconductor device according to the first embodiment of the present invention.
Figure 20B:
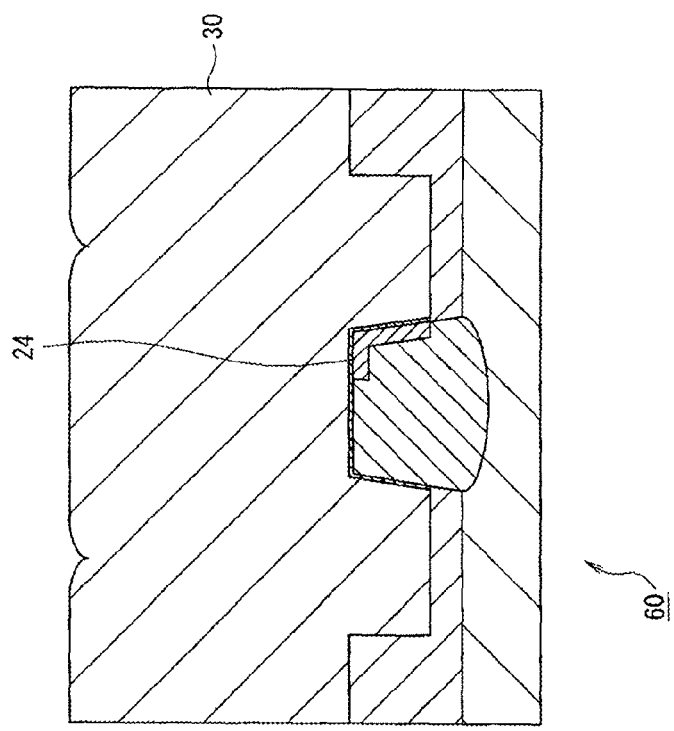

As illustrated in FIGS. 20A and 20B, a polysilicon film 30 is formed on the ultrathin oxide film 24 by CVD. As a material for the polysilicon film 30, in-situ doped polysilicon is used. The in-situ doped polysilicon refers to a member in which a high-concentration N-type impurity, such as phosphorus, can be introduced during deposition.

The polysilicon film 30 in the first embodiment has an impurity concentration of approximately $1.0 \times 10^{20}/cm^3$ and a thickness of approximately 700 nm. The polysilicon film 30 has such a thickness as necessary to completely bury the open region 21 and allow a surface of the polysilicon film 30 to be planarized.

Figure 21A:
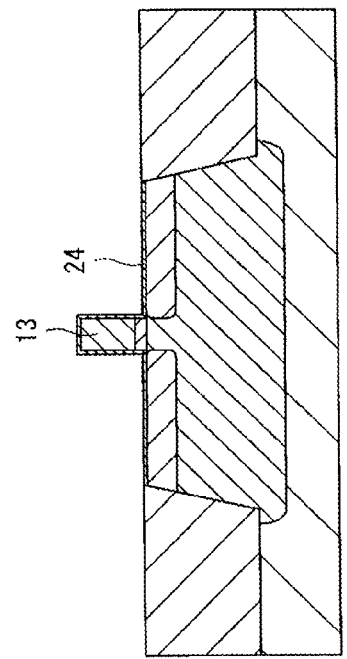
FIGS. 21A and 21B are views depicting the method for manufacturing the semiconductor device according to the first embodiment of the present invention.
Figure 21B:
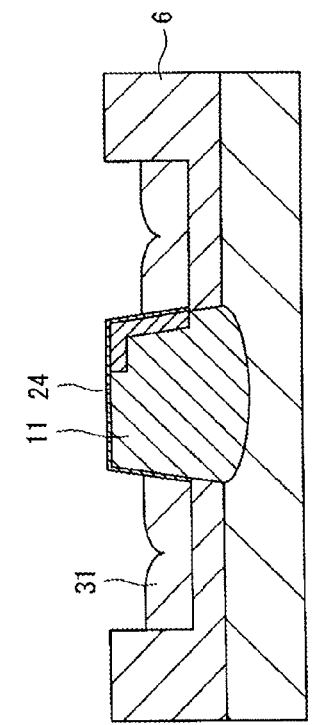

The polysilicon film 30 is etched back in the next process. The HCBT region 60 and the CMOS region 70 after the completion of the etch back process are shaped as illustrated in FIGS. 21A and 21B. The etch back process is performed with a TMAH solution. The TMAH solution is an etchant extremely high in etching selectivity between a polysilicon film and an oxide film. Consequently, the n-hill layer 11 of the HCBT 100 and the CMOS transistor 200 of the CMOS region 70 are protected by the ultrathin oxide film 24 serving as a protective film from etching damage during the etch back process.

In the first embodiment as described above, it possible to protect the n-hill layer 11 and the CMOS region 70 from any damage in the etch back process. Consequently, this makes it possible to prevent such a phenomenon, as illustrated in FIG. 51, in which the active region is abraded away.

In addition, the etch back process of the polysilicon film 30 with a TMAH solution progresses isotropically. Accordingly, the etch back process is expected to make planar a surface of the polysilicon film 30 (polysilicon film 31) substantially, after the etching is performed with the use of the TMAH solution.

Figure 23A:
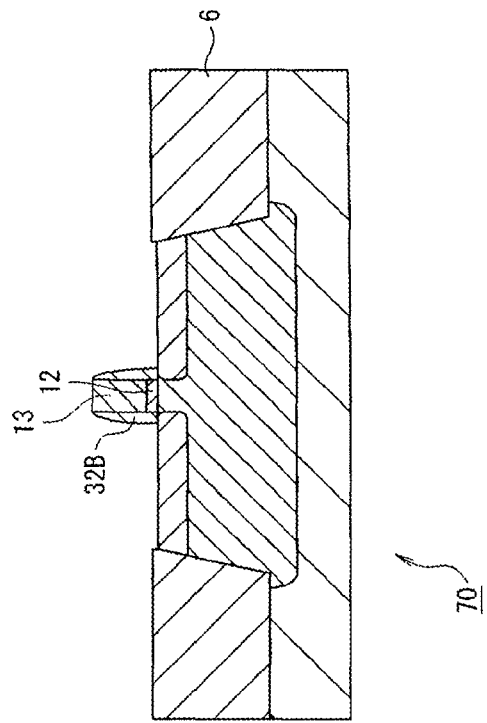
FIGS. 23A and 23B are views depicting the method for manufacturing the semiconductor device according to the first embodiment of the present invention.
Figure 23B:
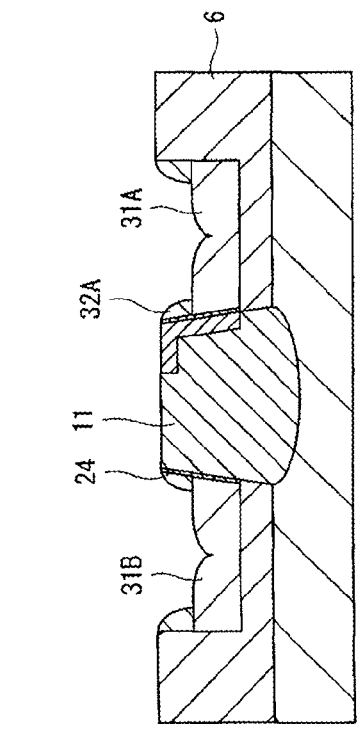

Next, as illustrated in FIGS. 22A and 22B, an oxide film 32, which is a TEOS film, is formed by CVD on the HCBT region 60 and CMOS region 70 after he etch back process is performed. The oxide film 32 is approximately 100 nm thick. The formed oxide film 32 is etched back by dry etching. As illustrated in FIG. 23A, a spacer 32A is formed in the n-hill layer 11 of the HCBT region by the etch back process. In addition, a spacer 32B for a gate electrode 13 is formed in the CMOS region 70, as illustrated in FIG. 23B. The spacer 32A, makes it possible to prevent the extrinsic base layer 20 and the emitter electrode 31A from being electrically short-circuited to each other by a subsequent silicide formation process.

The ultrathin oxide film 24 on the upper surface of the n-hill layer 11 is removed when the oxide film 32 is etched back, and cannot be observed in the completed HCBT 100. However, the ultrathin oxide film 24 on the peripheral surface of the n-hill layer 11 still remains in the HCBT 100, as illustrated in FIG. 2A.

Figure 24B:
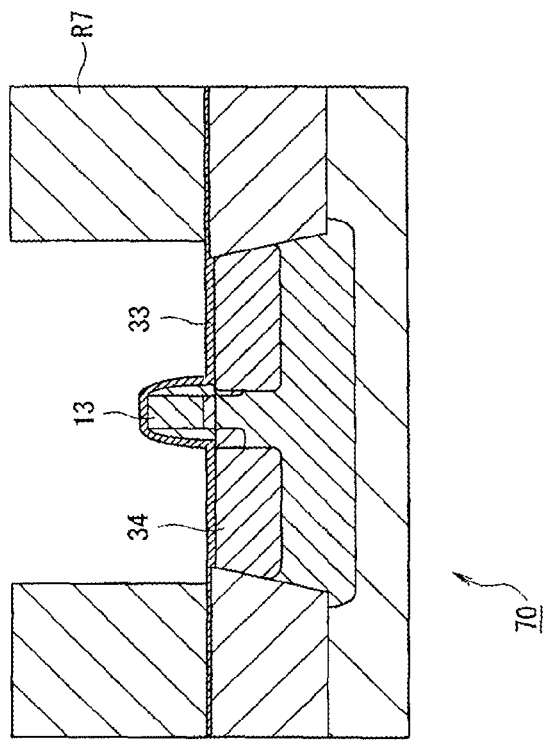
FIGS. 24A and 24B are views depicting the method for manufacturing the semiconductor device according to the first embodiment of the present invention.
Figure 24A:
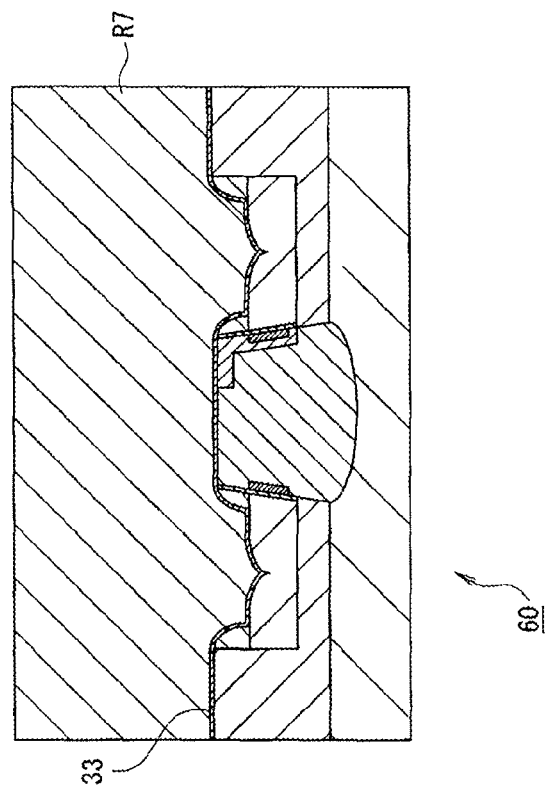

Next, an oxide film 33, which is a TEOS film, is formed on the HCBT region 60 and the CMOS region 70 by CVD. After that, a resist pattern R7 is formed. The oxide film 32 is approximately 10 nm thick. The resist pattern R7 covers the HCBT region 60, as illustrated in FIG. 24A, and defines an opening in the active region of the CMOS transistor 200, as illustrated in FIG. 24B. Ions are implantated for forming an impurity layer 34 on the CMOS region 70 with the resist pattern R7 used as a mask. The impurity layer 34 is an N+ layer if the CMOS transistor 200 is an NMOS transistor, and a P+ layer if the CMOS transistor 200 is a PMOS transistor. The resist pattern R7 is removed by ashing or the like.

Figure 25A:
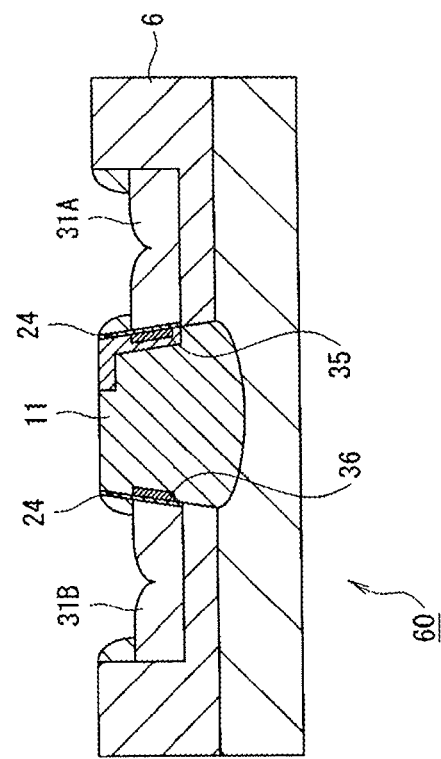
FIGS. 25A and 25B are views depicting the method for manufacturing the semiconductor device according to the first embodiment of the present invention.
Figure 25B:
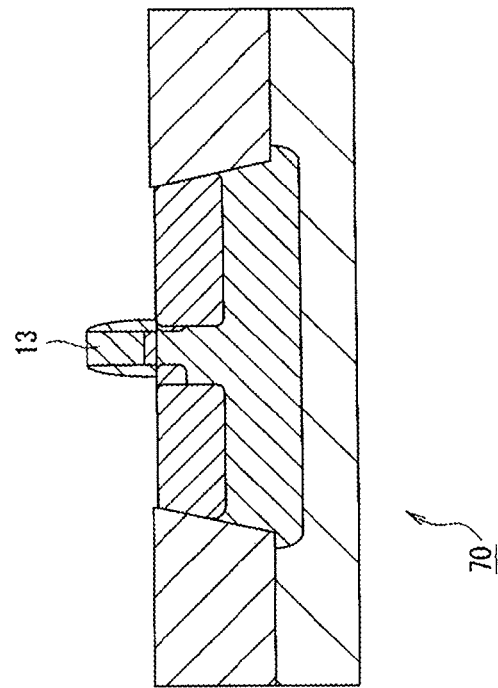

After the ion implantation, the HCBT region 60 and the CMOS region 70 are subjected to RTA under a nitrogen atmosphere including a small amount of oxygen in order to activate the impurity layer 34. RTA conditions are set as, for example, 950° C., for 10 seconds. By the RTA, as illustrated in FIG. 25A, phosphorous, which is an N-type impurity, is solid-phase diffused from the emitter electrode 31A and the collector electrode 31B. By the solid-phase diffusion, an emitter diffusion layer 35 and a collector diffusion layer 36 are simultaneously formed on sidewalls of the n-hill layer 11. The emitter diffusion layer 35 functions as an emitter electrode.

Figure 26A:
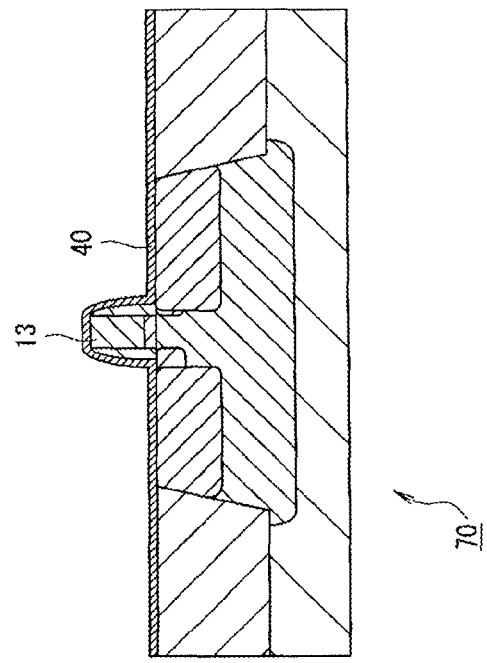
FIGS. 26A and 26B are views depicting the method for manufacturing the semiconductor device according to the first embodiment of the present invention.
Figure 26B:
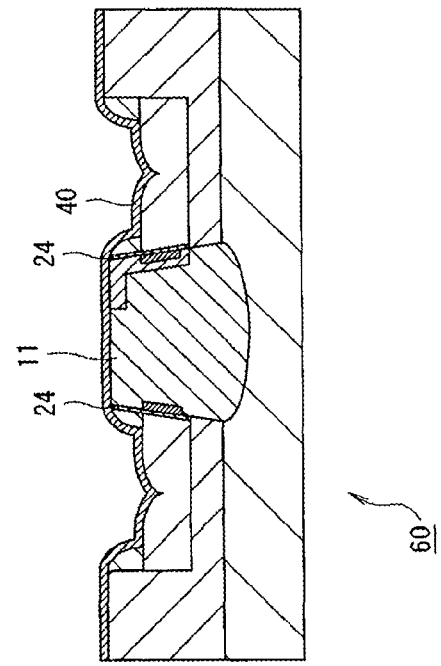

Next, as illustrated in FIGS. 26A and 26B, an oxide film 40, which is a TEOS film, is formed on the HCBT region 60 and the CMOS region 70 by CVD. The oxide film 40 is approximately 30 nm thick.

Figure 27A:
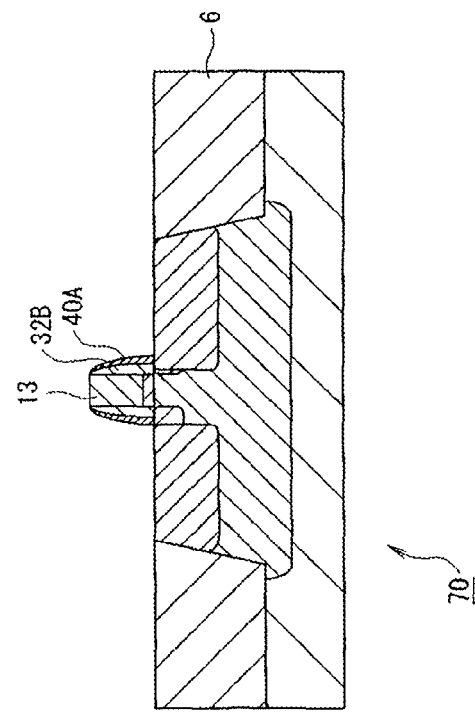
FIGS. 27A and 27B are views depicting the method for manufacturing the semiconductor device according to the first embodiment of the present invention.

Next, in the first embodiment, a resist pattern R8 for partially covering the upper surface of the n-hill layer 11 is formed, as illustrated in FIG. 27A. With the resist pattern R8 used as a mask, the oxide film 40 is slightly dry-etched. By the etching of the oxide film 40, it is made possible to prevent the extrinsic base layer 20 and the n-hill layer 11 from being short-circuited to each other by silicide.

Figure 27B:
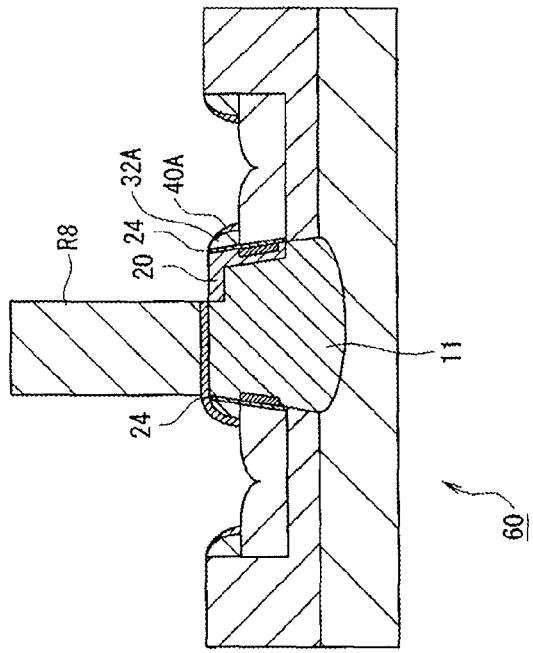

In addition, by the etching of the oxide film 40, spacers 40A are formed beside a spacer 32A for isolating an emitter and a base from each other and beside a spacer 32B of the CMOS transistor 200, as illustrated in FIGS. 27A and 27B. However, the spacer 40A is extremely small in width, so does not affect the characteristics of the HCBT 100 and the CMOS transistor 200.

In addition, in the first embodiment, a cobalt (Co) film, for example, is formed as a metal film over the entire surface of the Si substrate 1 by sputtering. The Si substrate 1, in which the Co film has been formed, is heat-treated to form a cobalt silicide (CoSi) film on a silicon layer or a polysilicon layer in direct contact with the Co film.

Figure 28A:
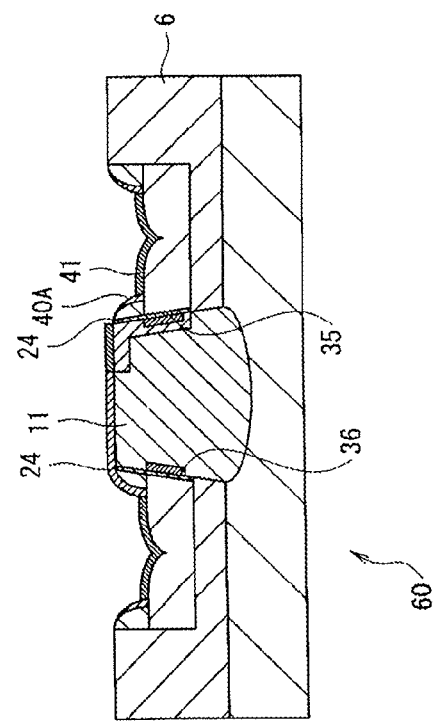
FIGS. 28A and 28B are views depicting the method for manufacturing the semiconductor device according to the first embodiment of the present invention.

That is, as illustrated in FIG. 28A, a cobalt silicide 41 is formed on the extrinsic base layer 20 in a self-aligned manner by a salicide process. The cobalt silicide 41 is also formed in portions, among those of the emitter electrode 31A and the collector electrode 31B, exposed out of the spacer 32A and the spacer 40A.

Figure 28B:
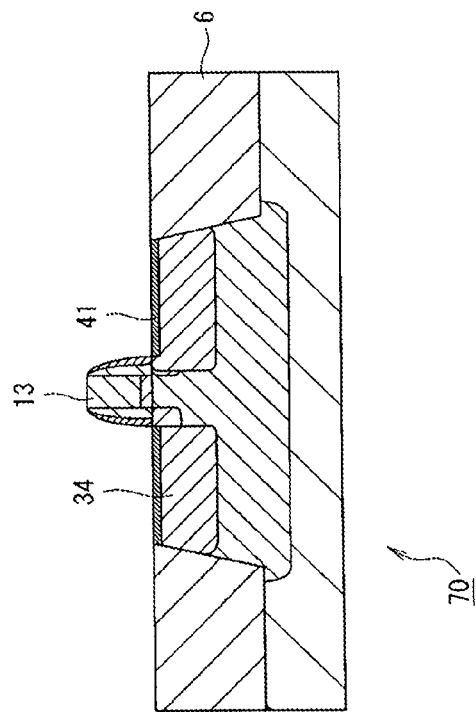

In addition, in this salicide process, the cobalt silicide 41 is also formed on the impurity layer 34 and the gate electrode 13 of the CMOS transistor 200, as illustrated in FIG. 28B.

Next, an Si nitride film, a PSG film, a plasma TEOS film, or the like is deposited over the entire surface of the Si substrate 1 as an interlayer insulating film. CMP-based planarization processing is performed on the deposited interlayer insulating film, as necessary. Subsequently, by use of photolithographic and etching techniques, the interlayer insulating film on the cobalt silicide 41 is removed to form a contact hole 50. After the formation of the contact hole 50 illustrated in FIG. 2, an aluminum alloy film, for example, is formed over the entire surface of the Si substrate 1 by sputtering.

A mask for an interconnect pattern is formed on the aluminum alloy film and is etched to form the interconnect layers 51 illustrated in FIG. 2. After that, a sintering process is performed on the Si substrate 1, thereby completing the semiconductor device.

Figure 14A:
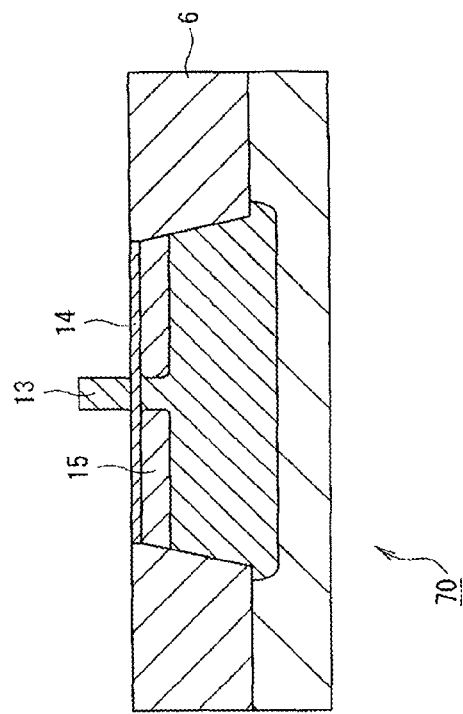
FIGS. 14A and 14B are views depicting the method for manufacturing the semiconductor device according to the first embodiment of the present invention.
Figure 14B:
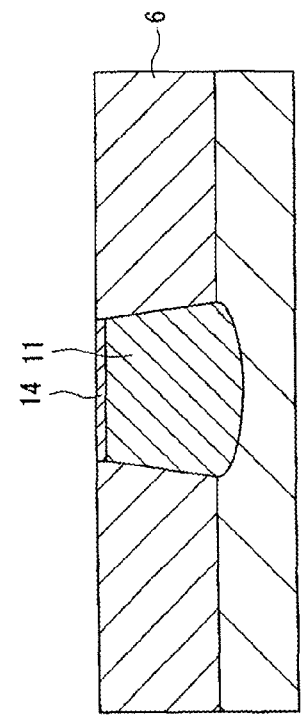

In the processes heretofore described, the steps illustrated in FIGS. 5 to 8 correspond to steps of forming the device isolating region in the first embodiment. In addition, FIG. 11A and FIG. 12A illustrate steps of forming the active region of the HCBT 100. FIG. 14B represents a step of implanting an impurity at least once with the gate of the CMOS transistor 200 used as a mask.

FIG. 15A illustrates a step of forming the extrinsic base layer. FIG. 16A illustrates a step of removing a predetermined portion of the device isolating oxide film 6 surrounding the n-hill layer 11, thereby forming the open region 21 around the n-hill layer 11. FIG. 18A illustrates a step of implanting ions in a region of a side surface of the active region exposed by the formation of the open region 21 and partially overlapped with the extrinsic base layer 20, thereby forming the intrinsic base layer 23.

In addition, FIG. 19A illustrates a step of forming the ultrathin oxide film 24 for protecting the n-hill layer 11, during etching in a subsequent step, on a surface of the n-hill layer 11. FIGS. 20A and 20B illustrate a step of forming a polysilicon film including impurities, where FIG. 21A illustrates a polysilicon etching step. FIG. 25A illustrates a step of forming the emitter diffusion layer region and the collector diffusion layer region.

As has been described heretofore, according to the first embodiment of the present invention, it is possible to provide a semiconductor device and a method for manufacturing the semiconductor device in which a CMOS transistor manufacturing process does not thermally affect a bipolar transistor, formation of an emitter electrode and a collector electrode does not cause any damage to an active region due to etching, and the impurity profiles of an intrinsic base layer and an extrinsic base layer included in the base layer of the active region do not affect each other.

That is, in according to the first embodiment, it is possible to realize a semiconductor device in which a HCBT and a CMOS transistor are hybrid-integrated. In addition, since ion implantation into the CMOS transistor of the semiconductor device is performed at least once prior to a step of forming the base of an HCBT, it is possible to mitigate the effect of heat treatment in the CMOS transistor after the ion implantation on the characteristics of the HCBT.

In addition, it is possible to form an ultrathin oxide film on the n-hill layer of the HCBT and on the CMOS region prior to a step of etching back a polysilicon film with the use of a TMAH solution. Consequently, it is possible to protect the n-hill layer 11 and the CMOS region from any damage to be caused in the etch back process. Thus, this eliminates such problems as illustrated FIG. 51 in which the n-hill layer is abraded away.

In addition, it is possible to form the extrinsic base layer prior to the formation of the intrinsic base layer. Since sidewalls of the n-hill layer 11 are not exposed at the time of forming the extrinsic base layer, it is possible to perfectly prevent ion implantation for forming the extrinsic base layer from affecting the intrinsic base layer.

(Experimental Example)

Figure 29B:
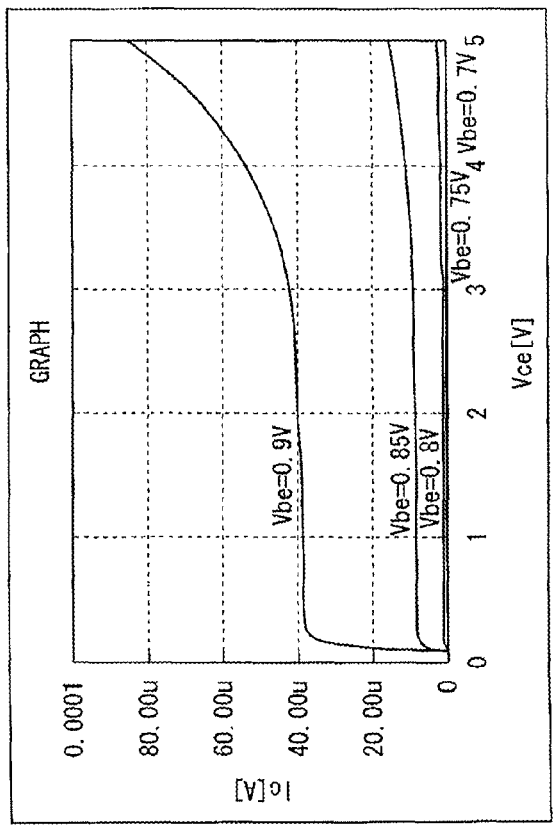
FIGS. 29A and 29B are graphs used to explain the characteristics of the semiconductor device manufactured by method for manufacturing the semiconductor device according to the first embodiment of the present invention.
Figure 29A:
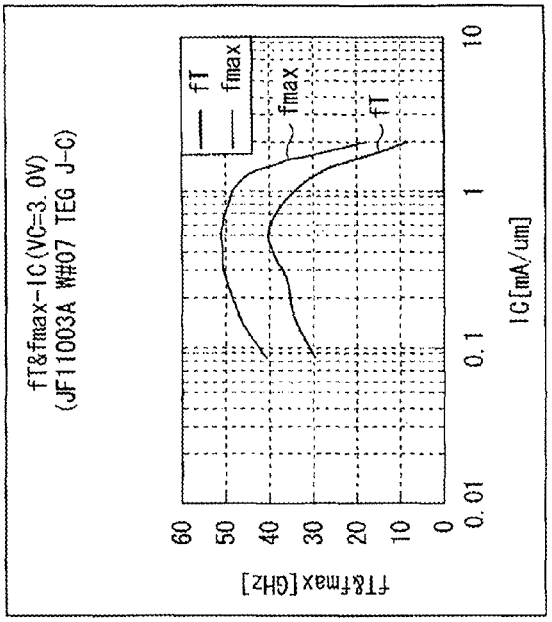

The inventors of the present invention manufactured a semiconductor device using the above-described semiconductor device manufacturing method according to the first embodiment. FIG. 29 is a graphical view depicting the characteristics of the manufactured semiconductor device, and illustrates the characteristics of the HCBT 100. FIG. 29A is a graph illustrating a Vc-Ic characteristic indicating a relationship between a collector-emitter voltage Vice and a collector current Ic flowing through a collector electrode. FIG. 29B is a graph illustrating fT/fmax-Ic characteristics indicative of a relationship among the cutoff frequency fT, the maximum oscillation frequency fmax, and the collector current Ic. It is to be noted that the Vc-Ic characteristic illustrated in FIG. 29A was measured with a fixed base-emitter voltage Vbe.

The measurement exhibits that with the HCBT according to the first embodiment, it is possible to obtain a breakdown voltage of 4.7 V, a cutoff frequency of 40 GHz, and a maximum oscillation frequency of 50 GHz.

(Second Embodiment)

Next, a second embodiment of the present invention will be described. The second embodiment differs from the first embodiment in a method for forming a HCBT collector contact region. That is, in the first embodiment, solid-phase diffusion from polysilicon causes the active region to form the collector diffusion layer, whereas in the second embodiment, the collector diffusion layer is directly formed in an upper portion of the active region without the intervention of polysilicon. Since polysilicon is used only for the emitter diffusion layer, such a configuration of the second embodiment will be referred to as single-polysilicon type HCBT.

Figure 30B:
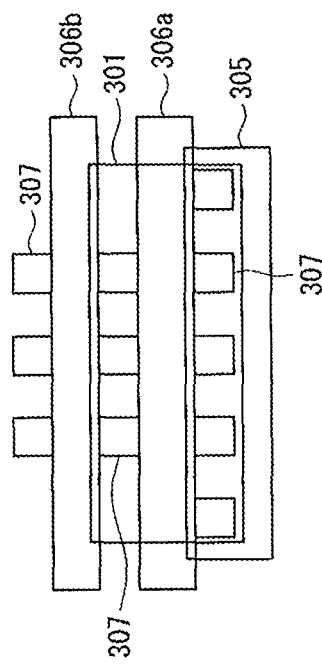
FIGS. 30A and 30B are views depicting a mask used in a method for manufacturing of a semiconductor device according to a second embodiment of the present invention.
Figure 30A:
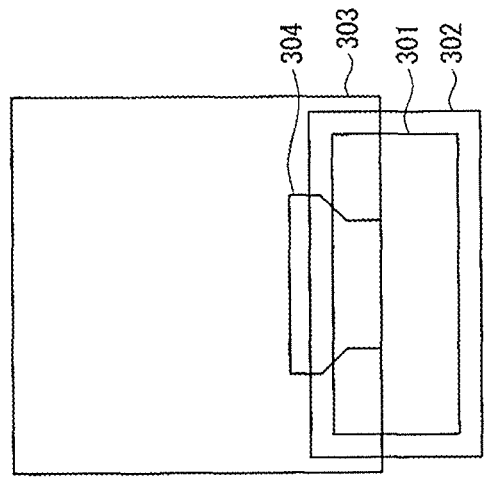

FIG. 30A illustrates a standard mask set used for a single-polysilicon type HCBT. As illustrated in FIG. 30A, an HCBT can be hybrid-integrated together with a CMOS by typically using three additional masks. Integration with a fewer number of masks is also possible. FIG. 30B illustrates masks already available in a CMOS process and also used for the HCBT.

The HCBT, like the CMOS, is normally formed on a P-type Si substrate. An initial stage of this formation process is the same as a standard CMOS process of forming a shallow trench isolation (STI). The active region of the HCBT to be used later for a collector contact region is formed as a columnar n-hill layer surrounded by the STI. The active region is fixed by using an active mask 301 for common use with the CMOS. After that, well ion implantation and the like necessary to form an n-type well for a pMOS and a p-type well for an nMOS are carried out. Both of these wells are essential to CMOS technology.

In order to form not only other types of devices (for example, resistors, capacitors and inductors) but also different types of transistors (for example, those optimized for high-speed, highly voltage-resistant, high-current applications) on the same substrate, different doping concentrations are needed. In addition, different doping profiles and gradients may be necessary in some cases, in order to obtain desired device characteristics. These doping profiles and gradients are usually implemented by ion implantation.

As an ion implantation step of forming the collector of the HCBT, it is possible to use a single ion implantation step or a combination of several ion implantation steps used for the CMOS, depending on the combination of CMOS technology and targeted characteristics of the HCBT. For an NPN-type transistor, moderate n-type doping is needed in order to form an n-hill layer.

Figure 31A:
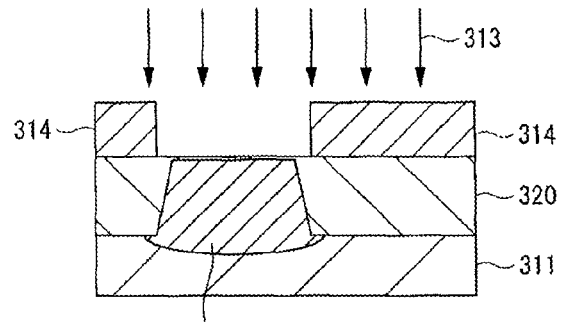
FIGS. 31A to 31L illustrate a process flow diagram illustrating an HCBT according to the second embodiment of the present invention.

In this case, it is possible to use CMOS masks to be used for n-well ion implantation for doping into the n-hill layer 312 of the HCBT. More generally, the n-hill layer 312 is formed separately from the CMOS, as illustrated in FIG. 31A, by use of the additional mask 302 illustrated in FIG. 30A. This mask is a first additional mask necessary to form the HCBT.

Ion implantation into the n-hill layer 312 should be adjusted in order to obtain a doping profile of the n-hill layer 312 optimized for the characteristics of the HCBT. The doping profile is achievable by means of several steps of ion implantation, which are performed on the condition that, for example, phosphorous is implanted at 200 keV and $3 \times 10^{12}$ cm$^{-2}$ and at 100 keV and $5 \times 10^{12}$ cm$^2$.

Under these conditions, it is possible to create a relatively high-concentration peak in an upper portion of the n-hill layer 312, thereby suppressing a base expansion effect. This means that it is possible to optimize high-frequency characteristics. Such an even more uniform electric field distribution achieves a high breakdown voltage. After the well-forming ion implantation of the CMOS process is performed, a photoresist is removed. In order to recover silicon crystal damaged by the ion implantation and to electrically activate the implanted impurity, high-temperature annealing is carried out. Ion implantation into the n-hill layer of the HCBT is carried out, immediately before or immediately after the well ion implantation of the CMOS is performed. This is because the annealing step of the CMOS process is also used for the crystal recovery of the HCBT and dopant activation.

After the completion of the well-forming ion implantation, a gate stack is normally formed in the CMOS process. During gate oxidization, the n-hill layer for the HCBT is also oxidized. During polysilicon gate etching in the CMOS process, an HCBT region is exposed and polysilicon on the n-hill layer is removed. After the polysilicon etching, the gate of the MOS transistor is lightly oxidized and the etched polysilicon gate region is covered with an ultrathin oxide film. Next, another different MOS transistor is once again selected by another different mask to perform ion implantation on a source/drain extension. At this point in the CMOS process, a second additional mask 303 illustrated in FIG. 30A and necessary for the HCBT is applied.

Figure 31B:
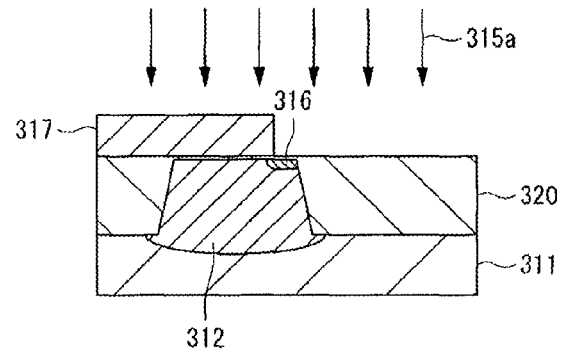

In this ion implantation, extrinsic base ion implantation 315*a* is carried out, while protecting the CMOS portion of a chip with a photoresist 317, as illustrated in FIG. 31B, thereby forming an extrinsic base layer 316. Examples of conditions of the extrinsic base ion implantation 315*a* include implanting $BF_2$ at an energy of 18 keV and at a dose amount on the order of $10^{15}$ cm$^{-2}$. In the CMOS process, an annealing treatment is performed at a high temperature after the ion implantation of the source/drain extension is performed. The same step as described above is also used in an annealing treatment for the ion implantation of the extrinsic base layer 316 to recover silicon single crystal and activate ionic species.

If the CMOS process does not include any annealing treatment or annealing conditions are not suitable for the HCBT, the extrinsic base ion implantation 315a may be performed prior to the ion implantation of the source/drain extension to apply an additional annealing treatment. The annealing temperature and time are, in general, lower and shorter than or equal to the conditions of gate oxidization. Accordingly, effects to be exerted on the CMOS are not so serious even if an annealing treatment is added. Coincidentally, the source/drain regions of the CMOS most sensitive to heat treatment have not yet been formed at this point of time.

Figure 31C:
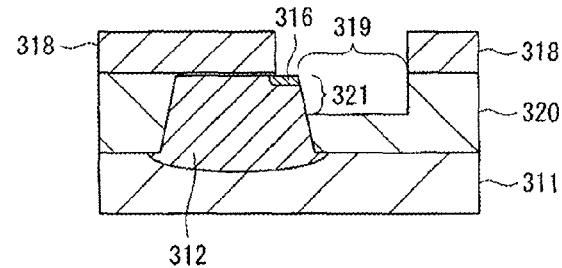

After the process of annealing the source/drain extension of the CMOS, a third additional mask 304 necessary for the HCBT is used. This is a step of protecting the entire CMOS by use of a photoresist 318 and opening an emitter window 319 of the HCBT. As illustrated in FIG. 31C, a device isolating oxide film 320 is etched with this mask used for a given period of time. Either wet etching or dry etching is applicable. The etching is set so as to define the intrinsic base layer of the transistor, thereby exposing a side surface 321 of the n-hill layer 312. After the etching of the device isolating oxide film, a thin screening oxide film 322 is formed. This film has the purpose of alleviating damage due to implanted ionic species and protecting a silicon surface. This is a method commonly used in ion implantation.

Figure 31D:
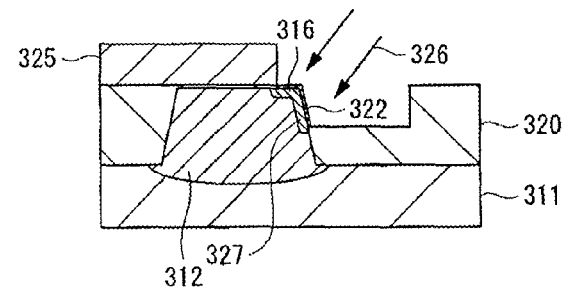

Next, as illustrated in FIG. 31D, intrinsic base ion implantation 326 is carried out at a certain angle once again by using the second additional mask 303 illustrated in FIG. 30A. Consequently, a p-type intrinsic base layer 327 is formed on a side surface of the n-hill layer. The intrinsic base ion implantation 326 is carried out on the condition that, for example, $BF_2$ is implanted at an angle of 30 degrees, at an energy of 30 keV with a dose amount of $5 \times 10^{14}$ $cm^{-2}$. In order to obtain the optimum doping profile, intrinsic base ion implantation may be carried out in several steps.

The additional mask 304 of the HCBT used to etch the device isolating oxide film has a certain angle with respect to the active mask 301, as illustrated in FIG. 30A. This angle is set for the purpose of making the device isolating oxide film extremely thin at a boundary with the n-hill layer 312. The oxide film thus varied in thickness has the effect of gradually blocking the impurity of a base at a frame of the emitter window.

By doing so, base ion implantation is caused to partially penetrate the oxide film. That is, this method increases the impurity concentration of the base around the emitter and can eventually prevent collector-emitter punch-through.

Figure 31E:
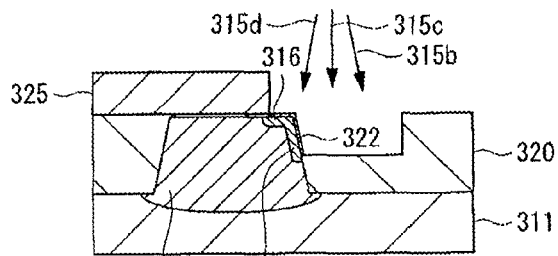

Extrinsic base ion implantation can be alternatively carried out at this timing rather than prior to etching the device isolating oxide film. In this case, the additional mask 303 for the base ion implantation may be used only once, therefore reducing the number of process steps. As illustrated in FIG. 31E, the extrinsic base ion implantation 315b in this case may preferably be carried out at a wafer rotation angle opposite to that of the intrinsic base layer in order to prevent an impurity from being excessively implanted into the side surface of the n-hill layer 312.

Meanwhile, the extrinsic base ion implantation can also be carried out in a direction 315c perpendicular to a wafer or at an implantation angle 315d that is same as or different from that of the intrinsic base layer, thereby intentionally increasing the concentration of the intrinsic base layer 327. By varying the implantation angle and the rotational angle, it is possible to optimize the impurity profiles of the intrinsic base layer 327 and those of the extrinsic base layer 316. The intrinsic base layer 327 and the extrinsic base layer 316 are exposed to the same annealing process. The extrinsic base layer 316 may enhance the diffusion of boron of the intrinsic base layer 327, thus possibly widening a base width.

This is in general not desirable in light of a current gain and high-frequency characteristics. In addition, the concentration of the intrinsic base layer 327, particularly the concentration of the bottom thereof, may become too high due to ion scattering within the device isolating oxide film 320 of the extrinsic base layer 316. This effect needs to be taken into consideration when determining the ion implantation parameters of these layers. That is, in order to minimize excessive doping in the bottom portion of the base, the angle of the ion implantation 315b is desirable.

After the completion of the ion implantation of the intrinsic base layer 327 and the extrinsic base layer 316, a photoresist 325 is removed and the thin screening oxide film 322 is etched. Since the thin screening oxide film 322 is also formed on the CMOS, time management should be performed for this etching so that a thermally-oxidized film which has grown on the polysilicon gate of the CMOS is not removed. Accordingly, the etching time of the thin screening oxide film 322 is adjusted so that only an oxide film on the side surface of the n-hill layer is exactly removed.

Since the oxide film on the side surface of the n-hill layer 312 has undergone the ion implantation of the intrinsic base layer 327 or, in some cases, of the extrinsic base layer 316, the oxide film is faster in the etching rate than an oxide film on the CMOS gate which has not undergone the ion implantation. This has the effect of increasing margins related to the etching time, when compared with a conventional HCBT in which a thin screening oxide film on the collector-side side surface of the n-hill layer 312 also needs to be removed.

The thin screening oxide film 322 is formed by means of deposition and is, therefore, faster in etching rate than the thermally-oxidized film on the CMOS gate. Consequently, even after the thin screening oxide film 322 is etched, it is possible to leave the thermally-oxidized film on the CMOS gate without problems.

Upon completion of the removal of the thin screening oxide film 322, a silicon surface is exposed on the side surface of the n-hill layer 312. An annealing treatment is performed on this surface in order to form a terminal layer of silicon. The treatment of the surface is carried out by using, for example, rapid thermal annealing (RTA) under a nitrogen atmosphere at 800° C. for 20 seconds. With the surface thus treated, it is possible to prevent the surface from growing epitaxially at the time of subsequent polysilicon deposition. In addition, the surface can serve as a protective layer of the n-hill layer 312 at the time of polysilicon etching.

An ultrathin oxide film 328 formed by the surface treatment can also be grown on the exposed silicon surface by use of oxygen remaining within a chamber. Alternatively, the ultrathin oxide film 328 can also be formed by means of another silicon surface termination treatment. This oxide film, irrespective of the chemical composition thereof, behaves as a stopping film of polysilicon etching essential to an HCBT process. The ultrathin oxide film 328 has to be thin enough, however, for a current to flow with no increase in resistance.

This annealing treatment causes the dopant of the ion-implanted base to diffuse, so profile redistribution takes place.

Figure 31F:
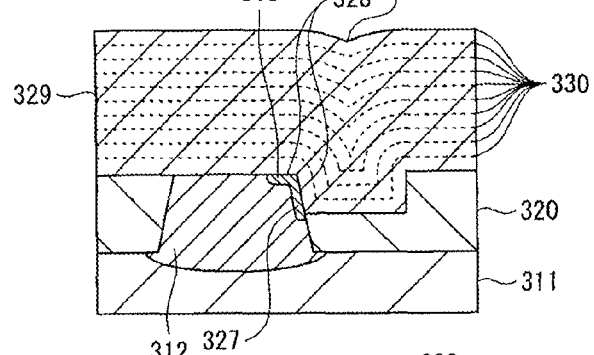

Next, as illustrated in FIG. 31F, a polysilicon film 329 is deposited. Since The polysilicon film 329 functions as an emitter of the transistor it needs to be doped to a high concentration. The high-concentration doping of the polysilicon film 329 can be achieved by an in-situ process, that is, by performing doping during deposition. Although in-situ doping is the easiest and simplest method, doping is also possible with other methods including ion implantation and diffusion.

In this case, in-situ doping is preferred from the viewpoint of uniformity. Accordingly, it is made possible to diffuse impurities uniformly from the emitter to the base by the subsequent annealing treatment. Furthermore, it is made possible to adjust the way of in-situ doping and optimize a process flow. This means that, by using undoped or lightly-doped polysilicon, it is made possible, for example, to make a shallow emitter-base junction or form an upper portion of the polysilicon film to be undoped polysilicon in order to increase a deposition rate.

The thickness of the polysilicon film 329 correlates with the shape of a residual polysilicon film subsequent to the etch back. The residual polysilicon film needs to be planar, so a surface of the polysilicon film 329 after being deposited should be as planar as possible. Since the deposition of the polysilicon film 329 is a conformal process, the film buries the emitter window 319. A more planar surface of the polysilicon film 329 is available with an increase in the thickness thereof.

FIG. 31F illustrates contour lines 330 of a surface shape of the polysilicon film 329 being deposited. Thickly deposited polysilicon allows a depression 331 to be reduced in the surface. Although this method is probably the simplest method of planarization, other methods well known in a semiconductor process are also applicable. For example, these methods include CMP and burying the depression 331 with another layer and then etching back the layer. However, thick deposition of the polysilicon film prolongs the above treating time of a process, and is therefore not realistic. In addition, CMP necessitates a stopping film for controlling an increase in the number of steps and the completion of polishing.

In the case of CMP, the stopping film has to be formed on the CMOS gate or on another structure (capacitor or the like) built at this point of time of the process. In the case of a process dealing with bipolar transistors only or in other BiC-MOS integration methods, a surface of an STI oxide film is utilized as a CMP stopping film.

Figure 31G:
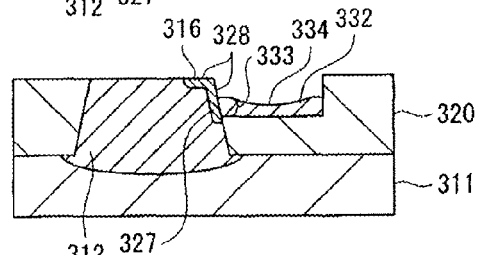

After the polysilicon is deposited, the polysilicon is etched back and an emitter polysilicon region 332 as illustrated in FIG. 31G is obtained. Regions for the extrinsic base layer 316 and the intrinsic base layer 327 have already been formed, and like the n-hill layer 312, they have to be protected during the etching back of the polysilicon. In order to fulfill this requirement, TMAH etching having the advantage of high selectivity with respect to an oxide film is used in the polysilicon etching. The ultrathin oxide film 328 that has been grown on a surface of the n-hill layer 312 by the treatment prior to the deposition of the polysilicon film 329 is sufficient for stopping tetramethylammonium hydroxide (TMAH) solution-based etching and can perfectly protect the n-hill layer 312.

To this end, other crystal-dependent etchants (for example, KOH and EDP) can also be used. In general, other polysilicon etching methods, such as wet etching and dry etching, can also be used. However, TMAH can satisfy requirements, such as high selectivity of polysilicon against an oxide film and adaptability to a CMOS process. TMAH etching is therefore a method perfectly suitable for this process.

A film thickness 333 of polysilicon determines the height of the emitter and affects the electrical characteristics of the transistor, such as a collector current, base resistance, and base-emitter capacitance. Therefore, polysilicon etching needs to be time-controlled. The rate of TMAH-based polysilicon etching is adjustable by the temperature and concentration of a TMAH solution.

As illustrated in FIGS. 31F and 31G, only the deposition and etch back are not sufficient for a polysilicon surface to be perfectly planar. The depression 331 to be generated after the deposition will eventually be transferred onto the emitter polysilicon region 332 as a depression 334. At this time, care must be taken so that any holes should not be made in the emitter polysilicon region 332. That is, the emitter polysilicon region 332 has to be left on the device isolating oxide film 320 that has been etched, and contact has to be ensured even at the thinnest portion of the depression 334 of the emitter polysilicon region 332.

The rate of TMAH etching depends on the crystal plane orientation of a layer being etched. Since polysilicon is composed of crystal grains having different plane orientations, a polysilicon surface after TMAH etch back is markedly irregular. In order to minimize the irregularity of the polysilicon surface, polysilicon composed of even smaller crystal grains is desired a film closer to an amorphous film is preferable. To this end, conditions of polysilicon deposition may be adjusted. Examples of adjustment include a method of performing treatments at lower temperatures.

Basically, there are no further processes to be added for the HCBT once the etching back of polysilicon ends. Use of a CMOS process brings the HCBT into completion. Therefore, only the CMOS formation process influential on the HCBT will be described hereinafter.

Figure 31H:
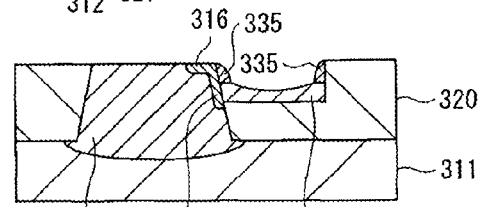
Figure 31I:
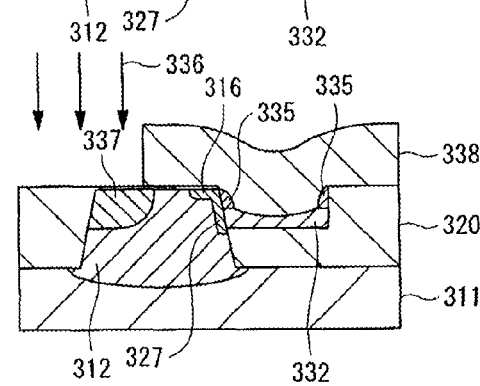

Normally, the next CMOS process step is the formation of a gate spacer. An oxide film, such as a TEOS film, is deposited and etched back by means of anisotropic etching. Thus, a spacer 335 is left beside a CMOS gate. By the nature of this step, the same spacer 335 is formed on polysilicon as a spacer of the n-hill layer 312, as illustrated in FIG. 31H. After that, ion implantation 336 is performed on the source/drain of the CMOS. The ion implantation 336 in the n+ source/drain regions of an nMOS is also performed on the collector contact region 337 of the HCBT, as illustrated in FIG. 31I.

The positions of ends of a photoresist 338 determined with a mask 305 define a distance between the collector n+ region 337 and the extrinsic base layer 316. This distance affects transistor characteristics, such as a collector-base breakdown voltage and a collector-emitter breakdown voltage. The other end of the collector n+ region is determined by a side surface of the n-hill layer 312.

Annealing for the purpose of activating the ion-implanted source/drain regions of the CMOS is also used to activate the ion-implanted regions of the HCBT region. This annealing is further used for a purpose commonly called drive-in diffusion where a diffusion region 339 is formed by the diffusion of an impurity from a heavily-doped emitter polysilicon region 332 to the side surface of the n-hill layer 312 (see FIG. 31J).

The doping profile of the intrinsic base layer 327 of the transistor is determined by this step. The depth of a base-emitter pn junction after annealing is adjustable either by varying the impurity concentration of the emitter polysilicon region 332 or by varying the grain diameter of polysilicon. These variables are determined by the conditions of polysilicon deposition.

Figure 31J:
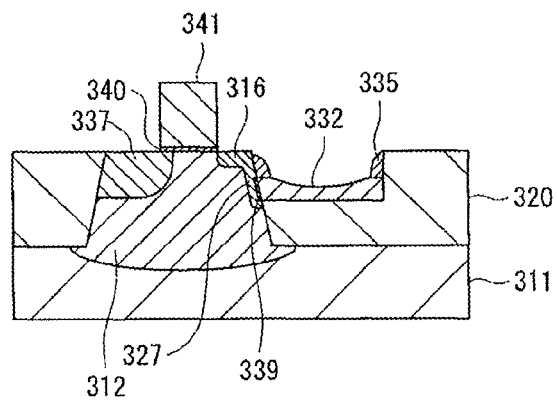

The next CMOS process step is the formation of a silicide. First, an oxide film 340 is deposited as a silicide protection film. Use of a mask 306 causes some CMOSs to be made open and some devices or the regions thereof to be protected by a photoresist 341. In the HCBT, the collector and the ultrathin oxide film 328 are protected by the illustrated portion 306a of the mask, and the rest of the HCBT are made open. This condition is illustrated in FIG. 31J. The left oxide film 340 prevents the collector n+ region 337 and the extrinsic base layer 316 from electrically short-circuiting to each other.

Figure 31K:
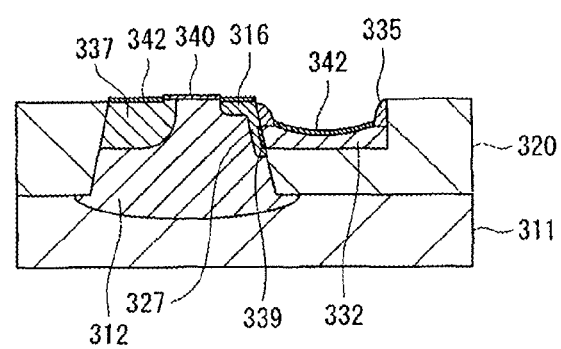

A silicide 342 is formed in such a manner as illustrated in FIG. 31K. This step is carried out by use of a standard method well known in a semiconductor process.

Figure 31L:
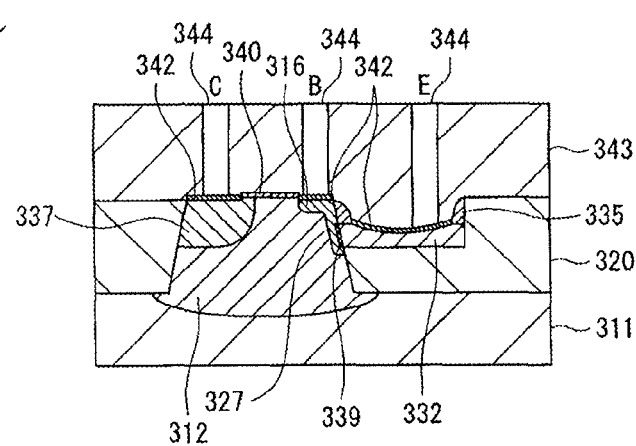

As the back-end of the process, an oxide film 343 is deposited, a contact hole 344 is defined, the contact hole is buried by a low-resistance film, and interconnect layers are formed, in a usual way. A final single-polysilicon type HCBT is illustrated in FIG. 31L along with contact regions.

It is to be noted that in the second embodiment, the ultrathin oxide film 328 is illustrated only in FIGS. 31F and 31G in consideration of the visibility of reference numerals shown in FIG. 31. The ultrathin oxide film 328 remains, however, on the upper and the side surfaces of the n-hill layer 312, as is illustrated in FIGS. 31F and 31G, in the course of steps subsequent to the step of FIG. 31F up to the step illustrated in FIG. 31L.

Figure 32:
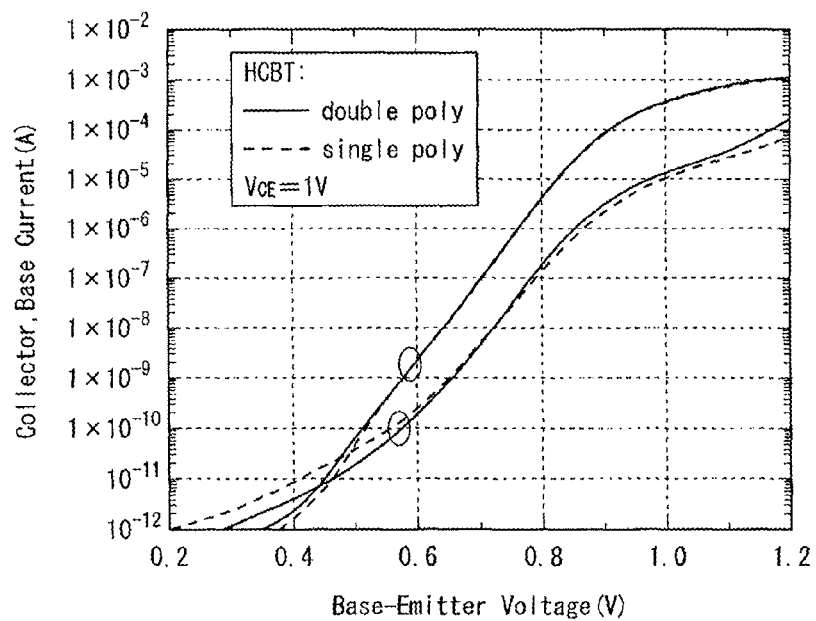
FIG. 32 is a graphical view illustrating a Gummel plot of a double-polysilicon type HCBT according to the second embodiment of the present invention, in comparison with that of a single-polysilicon type HCBT.
Figure 33:
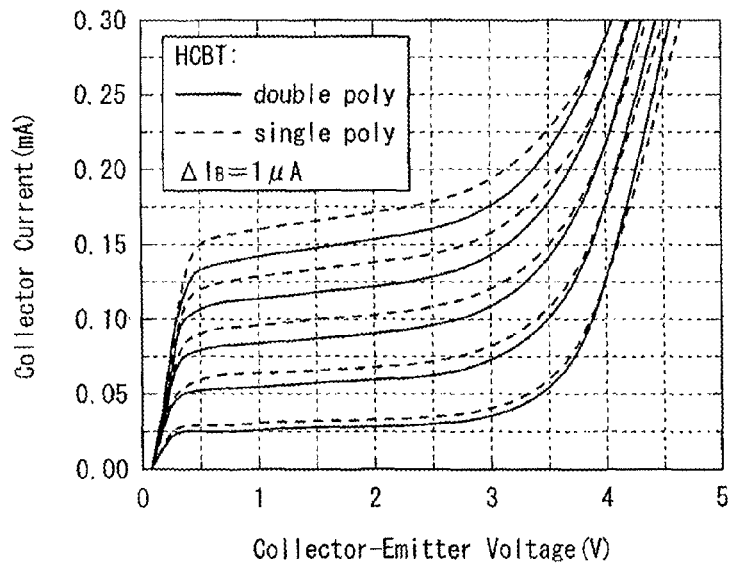
FIG. 33 is a graphical view illustrating the output characteristics of the double-polysilicon type HCBT according to the second embodiment of the present invention, in comparison with that of a single-polysilicon type HCBT.

FIGS. 32 and 33 illustrate characteristics of dependence (Gummel plots) of a collector current (IC) and a base current (IB) on a base-emitter voltage (VBE) with regard to an HCBT having a polysilicon collector and a polysilicon emitter (double-polysilicon type) and an HCBT having a polysilicon emitter and an ion-implanted collector (single-polysilicon type).

It is understood from the figures that the double-polysilicon type and single-polysilicon type HCBTs are almost the same in base current IB and collector current IC. Both the base current IB and the collector current IC depend mainly on the profile of an intrinsic base layer of a transistor. The figures represent that the double-polysilicon type and single-polysilicon type HCBTs are basically the same in the profile.

In both the double-polysilicon type and single-polysilicon type HCBTs, the same mask dimensions are used for base and emitter regions. The collector of the single-polysilicon type HCBT is an n+ region and has a wider n-hill layer.

In FIG. 32, extremely similar output characteristics are observed in the double-polysilicon type and single-polysilicon type HCBTs. Both structures are also almost the same in collector-emitter breakdown voltage (BVCEO). A slight difference in characteristics between the structures of the two HCBTs is considered to be due to distributions within a wafer surface.

Figure 34:
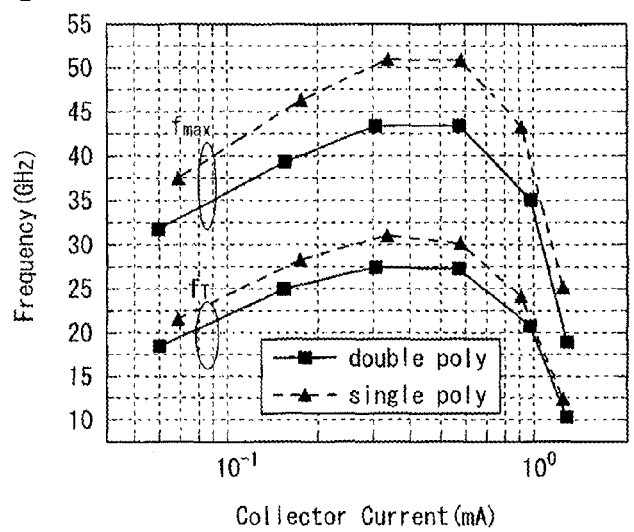
FIG. 34 is a graphical view illustrating the dependence of the cutoff frequency (fT) and the maximum oscillation frequency (fmax) of the double-polysilicon type HCBT according to the second embodiment of the present invention on a collector current (IC), in comparison with that of a single-polysilicon type HCBT.

FIG. 34 illustrates the collector current (IC) dependence of the cutoff frequencies (fT) and maximum oscillation frequencies (fmax) of the double-polysilicon HCBT and the single-polysilicon HCBT. It is understood that the single-polysilicon type HCBT exhibits higher levels of fT and fmax. This improvement in fT and fmax is due to the single-polysilicon type HCBT being larger in effective collector area than the double-polysilicon type HCBT. In the case of the double-polysilicon type HCBT, the n+ polysilicon has contact with only a part of a side surface of the n-hill layer 312. In contrast, in the case of the single-polysilicon type HCBT, the ion-implanted n+ region extends up to an edge of the n-hill layer 312, thereby enlarging a collector contact region.

In addition, as described earlier, the fact that the collector n+ polysilicon is thinner than the emitter n+ polysilicon in the case of the double-polysilicon type HCBT also contributes to making larger the difference with the single-polysilicon type HCBT. In the single-polysilicon type HCBT, the collector current flows in a more radial pattern due to the collector contact region being larger. Consequently, a collector current density at a collector-base junction becomes lower.

A low collector current density makes it possible to suppress a base broadening effect known as the Kirk effect, thereby decreasing a base transition time and improving fT. In addition, collector resistance can be reduced in the single-polysilicon type HCBT. The effect of reduction is not so significant, however, as observed in FIG. 34.

In conclusion, fT and fmax can be improved in the single-polysilicon type HCBT without sacrificing any other transistor characteristics thereof. This improvement in fT and fmax can be unfailingly confirmed even if mask dimensions and technical parameters are changed in various ways.

(Experimental Example)

Figure 35A:
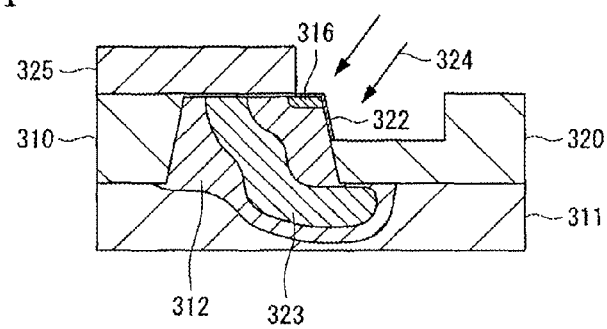
FIGS. 35A and 35B are views depicting an application example of a process according to the second embodiment of the present invention.

In addition, the present invention is not limited to the above-described configurations. For example, a step illustrated in FIG. 35A can be added, following the step of FIG. 31C. Using the same second HCBT mask 303 as used for extrinsic base ion implantation, an n-type region 323 called a Selectively Implanted Collector (SIC) is formed by ion implantation 324, as illustrated in FIG. 35A. At this time, the CMOS part is protected by the photoresist 325. The SIC is effective in improving the high-frequency characteristics of a transistor since the SIC increases the doping concentration of the n-hill layer 312.

That is, the base broadening effect can be suppressed without involving any remarkable breakdown voltage drop or collector-base capacitance increase. The SIC is means commonly used in a vertical bipolar transistor. The SIC is not always essential, however, and an HCBT having no SICs is also useful. Typical conditions of the ion implantation 324 of the SIC include implanting phosphorous at an implantation angle of 45°, and at energy and dose amount on the order of 250 keV and $10^{13}$ cm$^{-2}$, respectively.

Figure 35B:
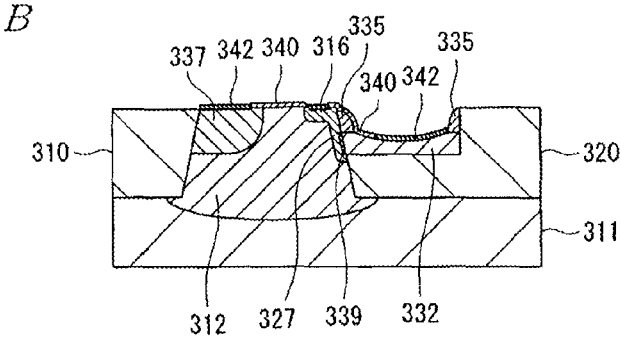

Alternatively, there can be a process in which the step of FIG. 35B is carried out, for example, in place of the step illustrated in FIG. 31K. In FIG. 35B, a pattern for an oxide film is formed on a spacer 335. In other words, the extrinsic base layer 327 and the emitter polysilicon region 332 of the n-hill layer 312 are isolated from each other by the oxide film spacer at the side surface of the n-hill layer in the same way as silicides are isolated between a gate and a source and between a gate and a drain in a CMOS process.

In the case of the process illustrated in FIG. 31K, a silicide protection mask is composed only of the portion 306a illustrated in FIG. 30B. However, since the inclination of the sidewall of the n-hill layer is smaller than 90°, only a thin spacer is left after anisotropic etching is performed. If the spacer is too thin, the silicide may short-circuit to the intrinsic base layer 327, or the emitter polysilicon region 332 and the extrinsic base layer 316 may come so close to each other that electrical characteristics are affected adversely.

However, if the thickness of the oxide film for silicide protection is increased, the spacer remains even if treatments are performed by anisotropic etching. On the other hand, if the oxide film is left between the emitter polysilicon region 332 and the extrinsic base layer 327, as illustrated in FIG. 35B, with the portion 306b of the mask illustrated in FIG. 30, the region and the layer can be reliably isolated from each other. In this case, the silicide blocking mask is composed of the portions 306a and 306b of the mask 306 illustrated in FIG. 30, but no changes are made to the CMOS process. However, series resistance between the base and the emitter may become higher.

(Third Embodiment)

Figure 36A:
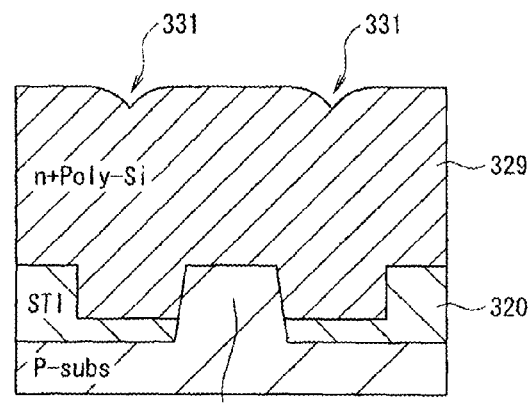
FIGS. 36A to 36D are views depicting dummy gate polysilicon according to a third embodiment of the present invention.
Figure 36B:
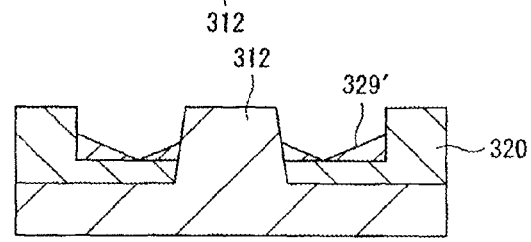

Furthermore, if the thickness of the emitter polysilicon region decreases in part and a hole is defined therein, an interconnect layer immediately above the hole fails to have adequate contact, as explained in FIG. 31G. However, since the polysilicon 329 is deposited along the contours of the n-hill layer 312 and the device isolating oxide film 320, as illustrated in FIG. 36A, depressions 331 arise on a surface of the polysilicon 329. Since the shape of each of these depressions 331 is traced as the shape of the polysilicon 329 after TMAH-based polysilicon etch back is performed, a hole may be defined in polysilicon 329' after etch back, as illustrated in FIG. 36B.

Figure 36C:
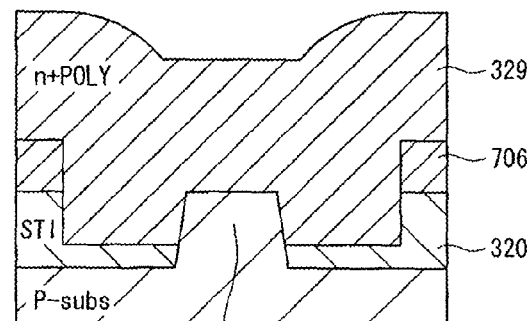
Figure 36D:
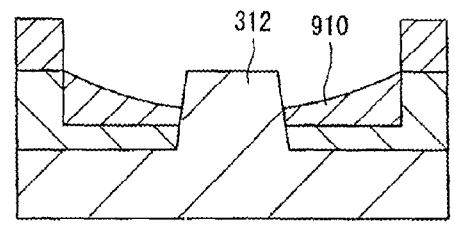

According to the present invention, a polysilicon film called dummy gate polysilicon 706 is formed on a surface of the device isolating oxide film 320, and emitter polysilicon 510 is deposited on top of the dummy gate polysilicon 706. By doing so, the effects of depressions in the polysilicon film 329 are eliminated, as illustrated in FIG. 36C. By etching back this polysilicon film, it is possible to form an excellent polysilicon region 910 which is planar with respect to the side surface of the n-hill layer, as illustrated in FIG. 36D. This dummy gate polysilicon 706 on the device isolating oxide film 320 can be formed in the same step as is used for a gate electrode in the CMOS process. Accordingly, this formation can be performed without involving any significant change in the process.

FIGS. 31A to 31H are views used to explain process steps of a third embodiment in which the dummy gate polysilicon 706 is used.

As illustrated in FIG. 37A, in the third embodiment, ion implantation 313 for the formation of an HCBT collector is performed to form an n-hill layer 312. Subsequently, extrinsic base ion implantation 315a is performed to form an extrinsic base layer 316.

Next, in the third embodiment, an unillustrated polysilicon film is deposited on the device isolating oxide film 320 and on the n-hill layer 312 of a CMOS, and is patterned to simultaneously form dummy gate polysilicon 706 and the gate electrode 902 of a CMOS transistor.

Next, as illustrated in FIG. 37B, an extrinsic base layer 316 is formed by the extrinsic base ion implantation 315a using a photoresist pattern for exposing only a part of the n-hill layer 312.

Subsequently, in the third embodiment, the dummy gate polysilicon 706 and the gate electrode 902 are covered with a photoresist 317, as illustrated in FIG. 37C, and ion implantation is performed on a side surface of the n-hill layer 312. As a result, the intrinsic base layer 327 illustrated in FIG. 37D is formed on the side surface of the n-hill layer 312.

Subsequently, in the third embodiment, polysilicon 329 is deposited on the HCBT and the MOS transistor, as illustrated in FIG. 37E. Then, as illustrated in FIG. 37F, the deposited polysilicon 329 is etched back to form an emitter polysilicon region 910. Next, as illustrated in FIG. 37G, a collector contact region 337 and the source/drain of the CMOS transistor are formed by ion implantation 336. After the ion implantation 336, a spacer 911 is formed and interconnect layers denoted by C, B and E are further formed, thereby bringing the semiconductor device being fabricated into a state illustrated in FIG. 37H.

Next, a description will be given of effects on device characteristics exerted by the use of the dummy gate polysilicon 706. FIG. 38 is a view depicting the emitter polysilicon region 910 formed by a process using the dummy gate polysilicon according to the third embodiment. FIG. 38A illustrates a pre-etch back state of the polysilicon 329 to serve as the emitter polysilicon region. FIG. 38B illustrates a state in which the semiconductor device of FIG. 38A has been etched back. FIG. 38C is an enlarged view of a portion C in FIG. 38B.

As illustrated in FIG. 38, in the third embodiment, a portion of the emitter polysilicon region 910 in contact with the side surface of the n-hill layer 312 is shaped to be planar by introducing the dummy gate polysilicon. Thus, it is possible to allow for an adequate distance between the emitter electrode and the extrinsic base layer. This process reduces pn junction leakage, thereby decreasing a base current IB. As a result, a current amplification factor $\beta$ (=IC/IB) becomes higher.

FIG. 39 is a view shown for comparison with FIG. 38 and used to explain a process of forming the emitter polysilicon region without the dummy gate polysilicon. FIG. 39A illustrates a pre-etch back state of the polysilicon 329 to serve as the emitter polysilicon region. FIG. 39B illustrates a state in which the semiconductor device of FIG. 39A has been etched back. FIG. 39C is an enlarged view of a portion C in FIG. 39B.

If the dummy gate polysilicon is not used, the emitter polysilicon region 332 is shaped so as to rise along the side surface of the n-hill layer 312. The emitter diffusion layer according to the third embodiment is formed by the solid-phase diffusion of phosphorous from the emitter polysilicon region and extends as far as close to an upper portion of the side surface of the n-hill layer 312. As a result, the emitter diffusion layer and the extrinsic base layer come close to each other at the upper portion of the side surface of the n-hill layer 312.

Since the emitter diffusion layer and the extrinsic base layer are of n+ and p+ types, respectively, a pn junction having a high impurity concentration is formed. The leakage current of such a junction is large and flows irrespective of bipolar operation. This leakage current is electrically superimposed on a base current IB, thus causing an apparent base current IB to increase. As a result, a current amplification factor $\beta$, which is one of the important characteristics of a bipolar transistor, becomes lower.

FIG. 40 is a graphical view used to explain the degree to which the characteristics of a manufactured HCBT are affected by the dummy gate polysilicon. FIG. 40 shows Gummel plots of an HCBT which uses the dummy gate polysilicon and an HCBT which does not use the dummy gate polysilicon. In FIG. 40, the axis of ordinates represents a base current (IB) and a collector current (IC), and the axis of abscissas represents a base-emitter voltage (VBE). In addition, solid lines belong to the HCBT manufactured with the use of the dummy gate polysilicon, and dotted lines belong to the HCBT manufactured without the dummy gate polysilicon.

As is evident from FIG. 40, any significant differences due to the presence/absence of the dummy gate polysilicon are not observed in the collector current IC of the bipolar transistor. However, as described above, a process which uses the dummy gate polysilicon suppresses a leakage current to be superimposed on the base current IB. Accordingly, it is understood that the bipolar transistor manufactured with the dummy gate polysilicon is smaller in base current IB than the bipolar transistor manufactured without the dummy gate polysilicon.

(Fourth Embodiment)

Next, a fourth embodiment of the present invention will be described. Since it is conceivable to provide two intrinsic base layers described in the first to third embodiments on side surfaces of the n-hill layer so as to be opposing to each other, a semiconductor device according to the fourth embodiment has been invented in order to improve breakdown voltages in that case.

I: Theory

Figure 41A:
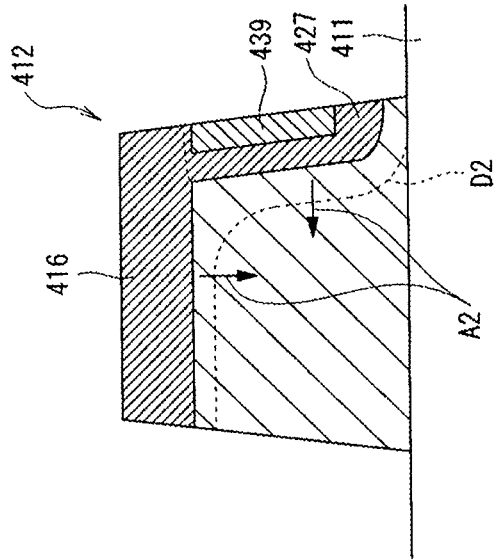
FIGS. 41A and 41B are views illustrating an HCBT having a double-emitter structure according to a fourth embodiment 4 of the present invention, in comparison with an HCBT having a single-emitter structure.
Figure 41B:
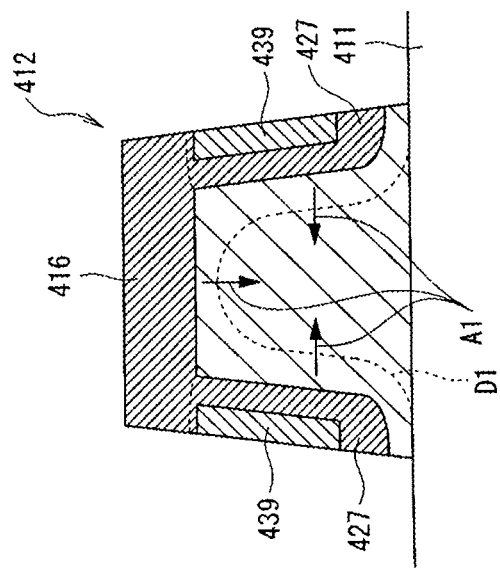

FIG. 41A is a view illustrating a double-emitter structure. FIG. 41B is a view used to show a single-emitter structure in comparison with the double-emitter structure. Both the double-emitter structure and the single-emitter structure include an Si substrate 411 and an n-hill layer 412.

The n-hill layer 412 is formed in an active region. The Si substrate 411 has a p-type polarity, while the n-hill layer 412 has an n-type polarity. The single-emitter structure includes an extrinsic base layer 416 on an upper surface of the n-hill layer 412. In addition, an intrinsic base layer 427 is formed on one side of a side surface of the n-hill layer 412. The double-emitter structure includes an n-hill layer 412 having two opposing side surfaces on a surface of a p-type Si substrate identical to the Si substrate 411.

A depletion region D1 of the double-emitter structure extends over the entire range of the n-hill layer 412 in the direction of an arrowed line A1. On the other hand, a depletion region D2 of the single-emitter structure extends in such a manner as shown by an arrowed line A2 in FIG. 41B.

Figure 42A:
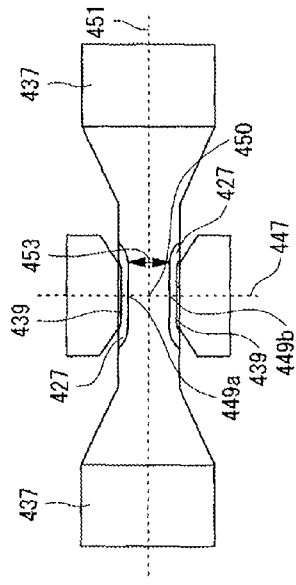
FIGS. 42A to 42D are cross-sectional views of the double-emitter HCBT structure according to the fourth embodiment of the present invention.
Figure 42B:
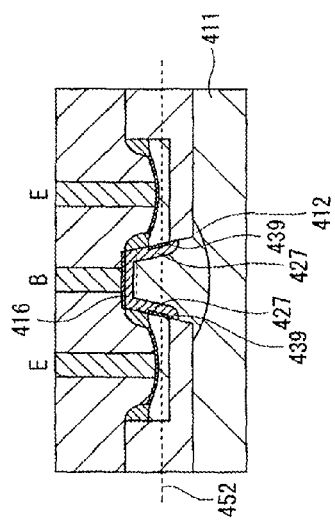
Figure 42C:
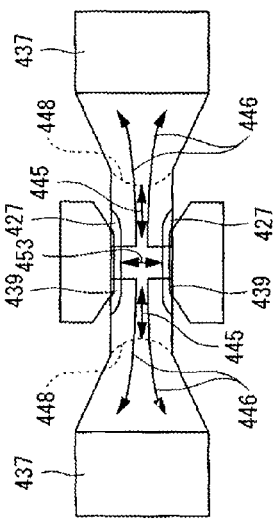

A horizontal cross-sectional view taken along a line parallel to a wafer surface of the double-emitter structure and denoted by reference numeral 452 in FIG. 42A is shown as 42B and FIG. 42C. The main idea of the double-emitter structure is to bring two intrinsic transistors (emitter-base-collector) close to each other in mutually opposite directions. Doing so causes the emitter region 439 and the intrinsic base layer 427 to be formed on side surfaces opposing to each other and connect to a collector at a central part of the n-hill layer. In addition, collector contact regions 437 connected to each other through a low-resistance path are disposed in lateral positions with respect to an intrinsic base-collector junction.

Figure 42D:
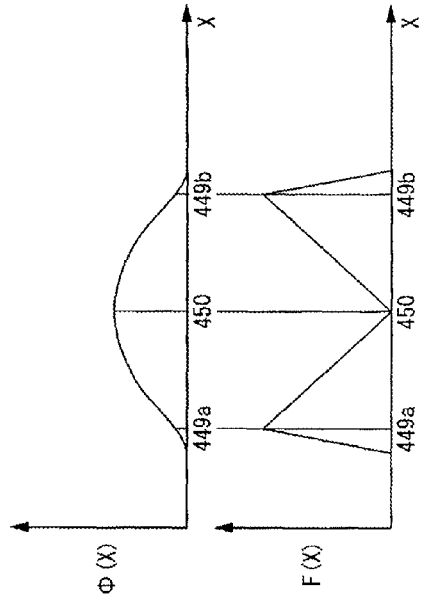

Charges of the collector at the central part are distributed to the two intrinsic base layers 427, the extrinsic base layer 416 and the Si substrate 411. The amounts of distribution can be controlled by varying a distance between the two intrinsic base layers 427, that is, by varying a collector width 453. If the charges of the collector are completely distributed to the two intrinsic base layers 427, the collector is completely depleted. Thus, the collector no longer holds an amount of charges large enough to maintain an electric field in a direction orthogonal to an intrinsic base layer-collector junction. An electrical potential $\phi(X)$ and an electric field $F(X)$ in the plane 447 of FIG. 42B are shown in FIG. 42D.

The maximum electric field in this direction arises in base-collector junctions 449a and 449b. After the complete depletion of the collector, the maximum electric field is not increased by the application of a voltage. The maximum potential of a depletion region is precisely observed at the central part of the depleted collector 450 and, consequently, equals a zero electric field in that direction, as illustrated in FIG. 42D. The rest of the applied collector-base voltage is divided in lateral directions with respect to the intrinsic base layer-collector junction. As a result, the voltage serves as an electric field in that direction in an upper portion of a drift region 445.

The length of the drift region is defined by a depletion region edge 448 and can be controlled by mask design and collector doping profiles. Accordingly, after electrons are induced by the electric field to cause a current 446 to flow toward the central part of the transistor, the current turns toward the collector contact region 437. In addition, carriers are confined in a low electric field region having a low probability of impact ionization due to a two-dimensional effect. In this way, it is possible to form a transistor having a high breakdown voltage. Furthermore, the extrinsic base layers 416 of the two opposing transistors coalesce with each other at the top of the structure thereof. Thus, it is possible to make the region of the extrinsic base layer 416 smaller.

The effect of collector charge division, in combination with the effect of the region of an extrinsic base layer 416-collector junction being made smaller, causes collector-base capacitance to decrease, thereby making this device suitable for low-power and smart-power applications. The maximum electric field developed across a range from the intrinsic base layer to the collector contact region depends not only on an applied voltage but on a distance 453 between the two bases. Accordingly, as the result of the intrinsic base layer being electrostatically shielded, thereby significantly suppressing base width modulation, an Early voltage has a high value. By this effect, it is possible to prevent collector-emitter punch-though from occurring within the base. This means that base doping profile can be positively downscaled.

This structure can be formed not only on an SOI wafer but also on a bulk silicon wafer. In a bulk silicon transistor, an insulating collector is formed so as to be opposite in polarity to that of a pn junction. An electric field at the junction consumes some of collector charges for maintaining the depletion of the n-hill layer or of a lower portion thereof. The doping profile of the collector contact region needs to be adjusted so that the collector is completely depleted at the time of normal operation. The lower portion of the collector can be depleted by likewise applying a reverse voltage to substrate electrodes.

In a transistor formed on an SOI wafer, a buried oxide isolates a collector from an Si substrate, thus causing the collector to be confined between two intrinsic base layers in the course of nature. A process of a double-emitter HCBT structure requires one time of additional implantation, compared with a standard bipolar-type and BiCMOS HCBT technology to form the intrinsic base layer 427 on an opposite side of the n-hill layer 412. The effect of collector charge division is controlled by mask dimensions.

Any lithography steps to be added to existing techniques are not needed in forming transistors. This means that the double-emitter HCBT can be integrated with a standard HCBT device without having to further complicating a process.

II: Masks

Now, a double-emitter structure based on HCBT technology will be described. This structure can also be formed on a bulk or SOI wafer using other techniques. Both NPN-type and PNP-type bipolar devices can be formed. Two intrinsic base layer-collector junctions opposing to each other having opposite orientations are needed along with a collector integrated at a central part of the structure. In this geometrical arrangement, charges of the collector can be shared by the two intrinsic base layers. This structure is suitable for the integration of devices including a CMOS, though also realizable in technology dealing with bipolar-type devices only.

Some steps of a CMOS process are necessary for an HCBT structure in BiCMOS technology. In this case, these steps need to be used to form bipolar transistors only. Descriptions given in the present invention with regard to a double-emitter HCBT are based on a BiCMOS process flow. Although the process flow of an NPN-type transistor will be described here, a PNP-type transistor can also be formed using the same technical concept by reversing the type of dopant doped in a transistor region. FIG. 43 illustrates a typical set of masks used for the double-emitter HCBT.

Figure 43A:
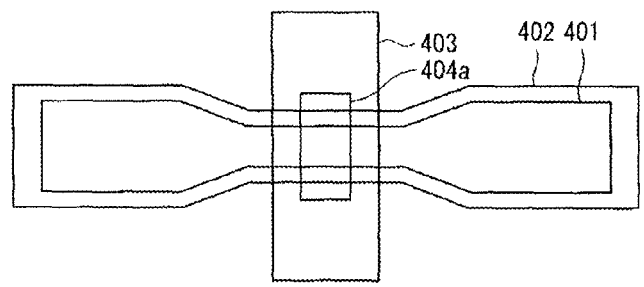
FIGS. 43A to 43C are views depicting a lithography mask used in an HCBT process according to the fourth embodiment of the present invention.
Figure 43B:
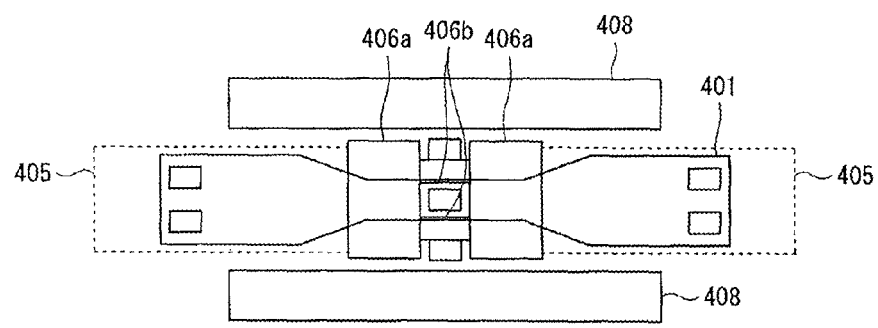
Figure 43C:
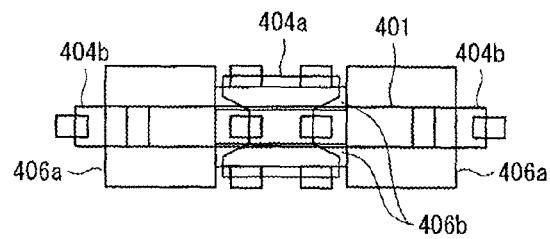

Although it is possible to incorporate an HCBT into a CMOS process requiring a smaller number of masks, integration of the HCBT with the CMOS generally requires three additional masks illustrated in FIG. 43 (masks 402, 403 and 404a). FIG. 43B illustrates masks already available in a CMOS process flow and used for the double-emitter HCBT. FIG. 43C illustrates masks used when a polysilicon electrode is sued for a collector.

III: Manufacturing Process

The double-emitter HCBT structure is in general processed in the same way as the Si substrate 411 in which a p-type CMOS is formed. A first step of the process is forming a standard shallow trench isolation (STI). An active region of the HCBT to serve as a collector contact region is formed on a silicon column surrounded by the STI and on an n-hill layer 412, and is defined by an active mask 401.

A portion of the active mask 401 whereby a collector contact region is formed is angled to some degree, as illustrated in FIG. 43A, in order to reduce collector resistance. The ends of the active mask 401 may be left flat, as illustrated in FIG. 43C.

After the formation of the STI, a continuous series of CMOS ion implantation steps is performed, including ion implantation for the prevention of punch-through, ion implantation for threshold voltage adjustment, and ion implantation in wells. A combination of some of these ion implantation steps can be used to obtain doping profiles of the n-hill layer (collector contact region) of the HCBT.

In this case, CMOS lithography can be used for the mask 402 for the ion implantation of the n-hill layer. More generally, the n-hill layer can be ion-implanted using a process other than those added to the CMOS process, the ion implantation mask 402 illustrated in FIG. 43A is necessary for the added process. This is the first additional mask which has become necessary for the HCBT structure. However, no matter whether the CMOS mask or the added HCBT mask is used, the dimensions of these masks are the same.

As the result of the ion implantation of the n-hill layer, there is obtained a doping profile of the n-hill layer optimum for HCBT operation. In order to obtain a desirable profile of the n-hill layer, it is possible to combine several ion implantation steps.

Ion implantation 413a in the HCBT collector is illustrated in FIG. 44A. After well ion implantation in a CMOS process step, a photoresist 414 is removed, a silicon crystal structure is restored, and high-temperature annealing for electrically activating ion-implanted ionic species is carried out. The ion implantation of the n-hill layer 412 of the HCBT is performed immediately before or after the ion implantation of CMOS wells is performed. Therefore, an annealing step in CMOS process steps can likewise be used to restore the crystal of the n-hill layer and activate the dopant thereof.

In a usual CMOS process flow, the well ion implantation is followed by the formation of a gate stack and the ion implantation of a source/drain extension region. At this point in the CMOS process steps, the second lithography mask 403 is needed for the HCBT structure.

This mask is used for base ion implantation 415a performed to obtain a p-type extrinsic base layer 416. During this ion implantation step, a CMOS portion of a chip is covered with a photoresist 417, as illustrated in FIGS. 44B and 44C. The photoresist 417 extends over the active mask 401, as illustrated in FIG. 44C, so that the left- and right-side portions of the active region are thereby protected.

A collector-n+ contact region is ion-implanted in the protected portions thereof, and a distance to the extrinsic base layer determines base-collector and collector-emitter breakdown voltages. In a CMOS formation step, a source/drain extension region is treated by high-temperature annealing after ion implantation. This step can be used for annealing performed to restore the crystal of the extrinsic base layer and activate ionic species.

Alternatively, the ion-implanted extrinsic base layer 416 can be annealed separately using an added annealing step. This is because the source/drain regions have not yet been ion-implanted at this point, so the annealing step does not exert any significant effects on CMOS characteristics. After the annealing of CMOS source/drain extensions, the etching mask 404a for a device isolating oxide film is needed as a third additional mask. The CMOS structure is entirely covered with a photoresist 418, and an emitter window 419 of the HCBT is opened, as illustrated in FIG. 44D.

At this point of the process, additional collector ion implantation 413b can be performed on the collector region 423. This ion implantation is not essential to transistor operation, however, and may therefore be avoided. By performing this ion implantation, an even higher collector implantation density can be obtained in a region determined by masks illustrated in FIGS. 44D and 44E.

Figure 44F:
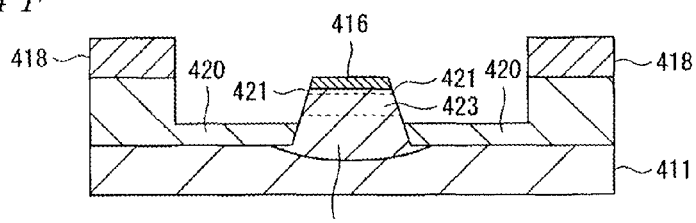
FIGS. 44A to 44S illustrate a process flow of the HCBT according to the fourth embodiment of the present invention.

In such a way as described above, the high-frequency performance of a transistor has been improved. In addition, the uniformity of an electric field distribution of the base-collector junction has been achieved. The device isolating oxide film 420 is etched for a predetermined period of time using these masks, as illustrated in FIG. 44F. To this end, wet or dry etching is used. The etching time is determined depending on to what degree a side surface 421 of the n-hill layer 412 is to be exposed. The etching of the device isolating oxide film 420 can also be used to determine the contact region of the collector for which polysilicon is used.

In this case, a device isolating etching mask pattern 404b illustrated in FIG. 43C has to be used to determine the collector polysilicon region. After the device isolating etching, a thin screening oxide film 422 is deposited.

Figure 44G:
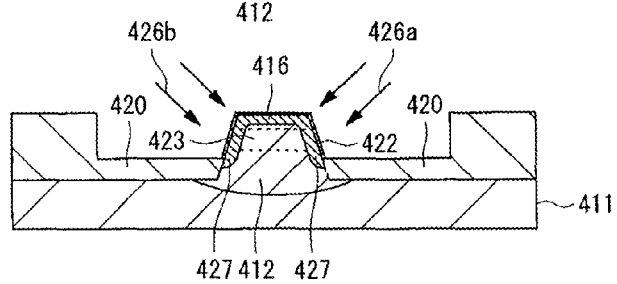
Figure 44H:
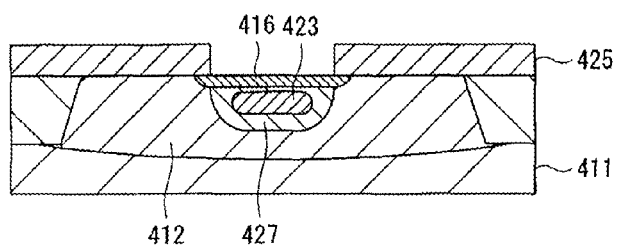

Next, using the second HCBT mask 403, the ion implantations 426a and 426b are performed at two angles inclined in directions opposite to each other, as illustrated in FIG. 44G. A p-type intrinsic base layer 427 is obtained on a side surface of the n-hill layer 412. A cross section defined by the plane 451 shown in FIG. 42B after the ion implantation of the intrinsic base is illustrated in FIG. 44H as a shape in which the intrinsic base layer 427 is projected onto a side surface of the active region. The ion implantations 426a and 426b of the intrinsic base layer 427 are performed on the inside and outside of a plane illustrated in FIG. 44H.

The ion implantation of the intrinsic base layer 427 on opposing side surfaces is the only step added to a fundamental HCBT structure to obtain the double-emitter HCBT structure. Accordingly, both HCBTs can be manufactured simultaneously using the same process.

In HCBT lithography based on the device isolating mask 404a used for device isolating etching, the mask 404a can be inclined with respect to the mask 401 for the active region, as illustrated in FIG. 43C, in order to form an oxide film in contact with the n-hill layer so as to be extremely thin. Consequently, ions implanted in the base can partially penetrate through the thin oxide film distributed in a stepwise manner around the emitter window. This method increases the concentration of a base doping material around the emitter, and makes it possible to eventually prevent collector-emitter punch-through. In addition, extending the drift region 445 laterally further is desired from the viewpoint of improvements toward high breakdown voltages.

After the ion implantation of the intrinsic base layer 427, the photoresist 425 has to be removed and the thin screening oxide film 422 is etched. After the etching of the thin screening oxide film 422, a silicon surface of the sidewall of the n-hill layer 412 is exposed. This surface is treated by thermal annealing to form an ultrathin oxide film 428.

Figure 44I:
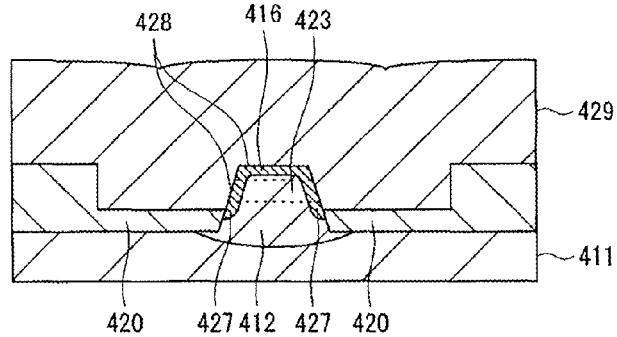
Figure 44J:
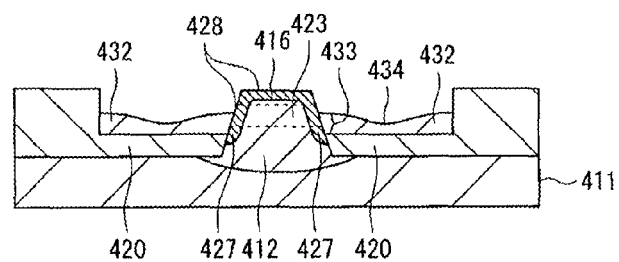

This treatment prevents polysilicon from being epitaxially crystallized during the deposition thereof. Thus, the ultrathin oxide film 428 serves as a protective film of surfaces of the n-hill layer 412 during polysilicon etching. Next, a polysilicon layer 429 is deposited as illustrated in FIG. 44I. After the deposition, the polysilicon is etched back, thereby obtaining an emitter polysilicon region 432 to be used as an emitter electrode (FIG. 44J). If the collector contact is to be made of polysilicon, collector polysilicon is formed in the same way.

In order to reduce a depression 434 in the emitter polysilicon region 432, a different planarization technique can be used. For example, it is possible to use a CMOS dummy gate formed in the vicinity of an emitter sidewall using a dummy gate mask 408, as illustrated in FIG. 43B. This is the same method as used in the above-described third embodiment.

Tetramethylammonium hydroxide (TMAH) solution-based etching, for its high selectivity against oxides, is used to etch back polysilicon. The thin oxide film 428 grown on a surface of the n-hill layer at the time of pre-deposition surface treatment can fully stop TMAH etching and perfectly protect the n-hill layer. Basically, the height 433 of an active transistor (FIG. 44J) is determined at the end of the TMAH etch back of polysilicon, and additional process steps needed for the HCBT end. After this, the HCBT structure is completed using CMOS process steps.

Figure 44K:
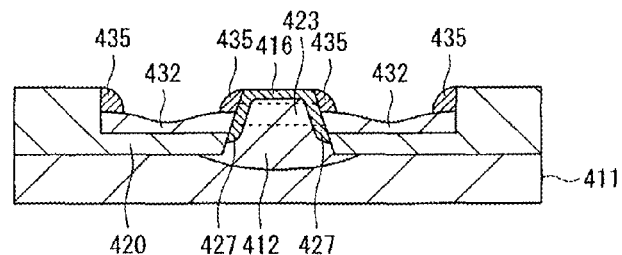

Hence, CMOS steps which affect the HCBT structure will be described. In general, the next CMOS process module is the formation of a gate spacer. To this end, an oxide film is deposited and etched back by anisotropic treatment. A spacer 435 of an oxide film is left on a sidewall of a CMOS gate. Due to the nature of this treatment, the same spacers 435 are formed in an emitter polysilicon region 432 on sidewalls of the n-hill layer 412, as illustrated in FIG. 44K.

Figure 44L:
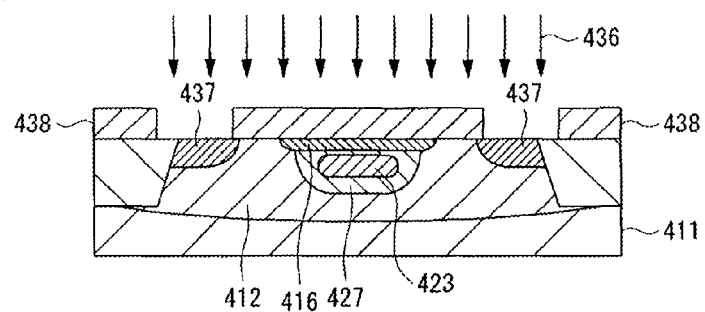

After that, source/drain ion implantation is performed on the CMOS structure. The ion implantation 436 of the n+ source/drain regions of an nMOS transistor can be used for the heavily-doped n+ collector contact region 437 of the HCBT structure, as illustrated in FIG. 44L. In this case, polysilicon is not used for the collector. Thus, the etching mask 404b for a device isolating oxide film illustrated in FIG. 43C is no longer necessary.

The positions of the ends of the photoresist 438 fixed by the n+ ion implantation mask 405 determine a distance between an n+ collector and an extrinsic base layer. This distance affects transistor characteristics, such as collector-base and collector-emitter breakdown voltages. In addition, the distance determines the drift region 445, illustrated in FIG. 42C, which determines a collector-emitter voltage drop. Varying the distance changes the length of the drift region 445. Thus, it is possible to adjust the collector-emitter breakdown voltage in the same way as the transition time of a collector-base depletion region which affects fT and fmax.

The other end of the collector n+ region is determined by a sidewall of the n-hill layer. If the collector is connected through polysilicon, a distance between the extrinsic base layer and the collector polysilicon determines a drift region crucial to transistor performance.

Figure 44M:
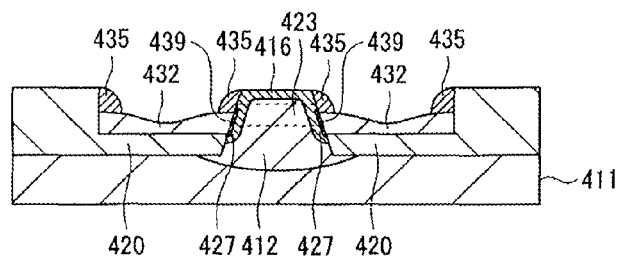

Annealing for activating ions implanted into the source/drain of the CMOS can also be used to activate an ion-implanted region of the HCBT. This annealing can also be used for the purpose of diffusing a dopant from an n-type doped emitter polysilicon region 432 formed in contact with a sidewall of the n-hill layer 412. This diffusion is generally called drive-in diffusion. In this way, an emitter n+ region 439 is formed in the intrinsic base layer 427 (illustrated in FIG. 44M).

Figure 44N:
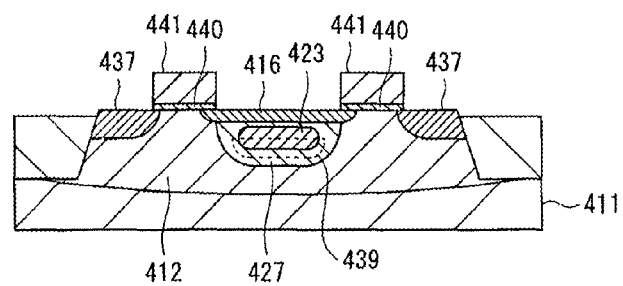

A doping profile of the intrinsic base layer 427 is formed using such a process as described above. A horizontal cross section defined by the plane 451 illustrated in FIG. 42B is illustrated in FIG. 44N along with the formed emitter n+ region 439.

The next CMOS process module is the formation of a silicide. First, an oxide film 440 to be used as a silicide protection film is deposited. Next, some CMOS parts are opened and some elements or regions are protected by a photoresist 441 by using a silicide blocking mask.

In the HCBT structure, an oxide film 440 between the collector contact region 437 and the extrinsic base layer 416 has to be partially protected by the silicidation blocking masks 406a and 406b illustrated in FIG. 43B. However, as illustrated in FIG. 44N, the rest of the structure is made open. The remaining oxide film 440 prevents the collector contact region 437 and the extrinsic base layer 416 from electrically short-circuiting to each other.

Figure 44O:
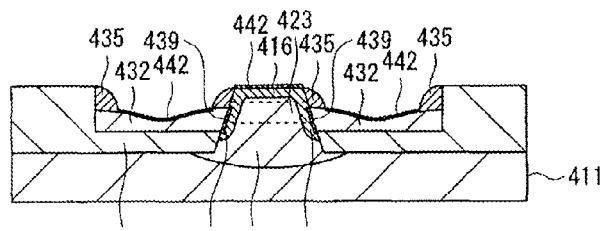
Figure 44P:
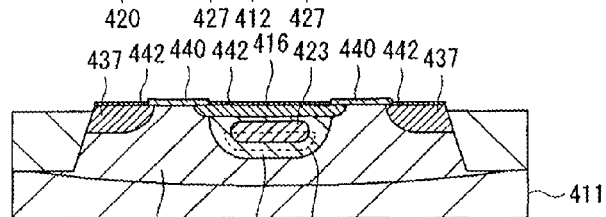

A silicide 442 is formed using a standard method heretofore known in the semiconductor industry as a silicidation method, as illustrated in FIGS. 44O and 44P. The extrinsic base layer 416 and emitter polysilicon region 432 of the n-hill layer 412 are segregated from each other by the spacer 435 on a side surface of the n-hill layer 412, as illustrated in FIG. 44O. In this case, a silicide protection mask is composed only of the portion 406a.

On the other hand, the emitter polysilicon region 432 and the extrinsic base layer 416 can be segregated from each other by an oxide film left therebetween, by using the portion 406b of the silicide protection mask. In this case, the silicide protection mask is composed of the portions 406a and 406b.

Figure 44Q:
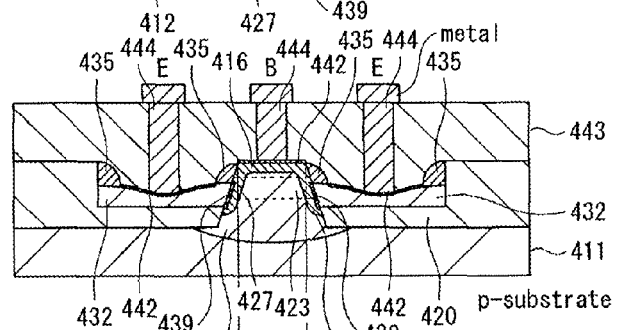
Figure 44R:
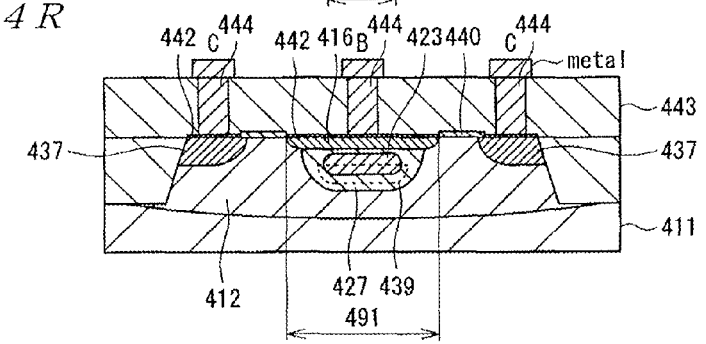

In a back-end step of a process, an oxide film 443 is deposited, a contact hole 444 is etched and filled with low-resistance metal, and metallization is carried out using a standard method. An ultimate double-emitter HCBT structure, as illustrated in FIG. 44Q, have a single layer of metal. A final device structure as shown by a cross section defined by the plane 451 of FIG. 42B is illustrated in FIG. 44R.

Figure 44S:
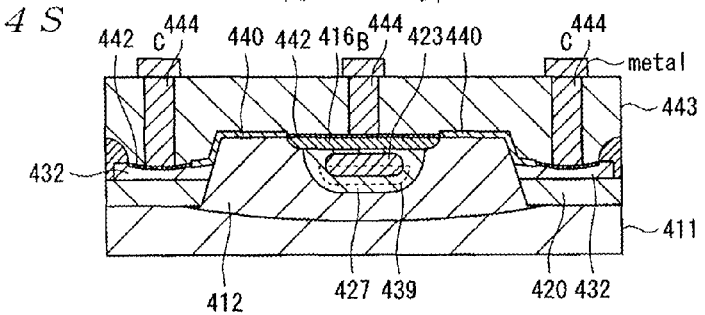

A cross section of a polysilicon collector contact structure is illustrated in FIG. 44S. The size of the upper surface of the n-hill layer 412 is denoted by reference numeral 490 in FIG. 44Q. The size 490 (width of an active region) is, for example, 0.5 μm. In addition, the size of the upper surface of the n-hill layer 412 is denoted by reference numeral 491 in FIG. 44R. The size 491 is, for example, 2.0 μm.

IV: Electrical Characteristics

Figure 45:
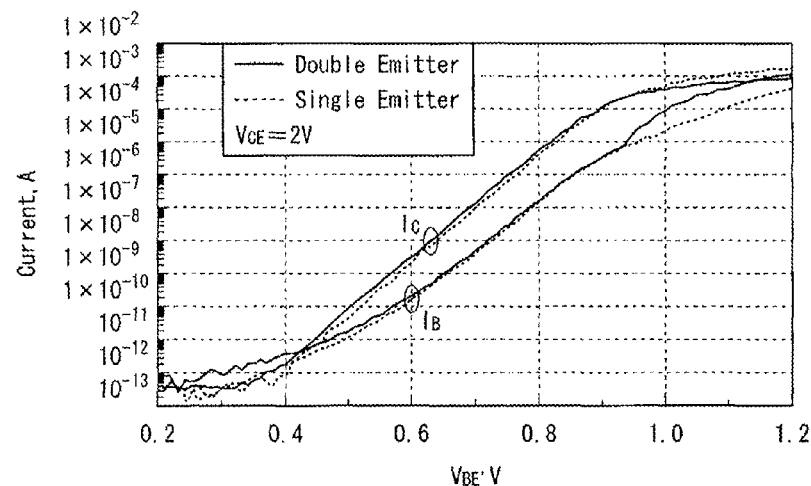
FIG. 45 is a graphical view illustrating a Gummel plot of a HCBT having a double-emitter structure according to the fourth embodiment of the present invention, in comparison with that of a HCBT having a single-emitter structure.
Figure 46:
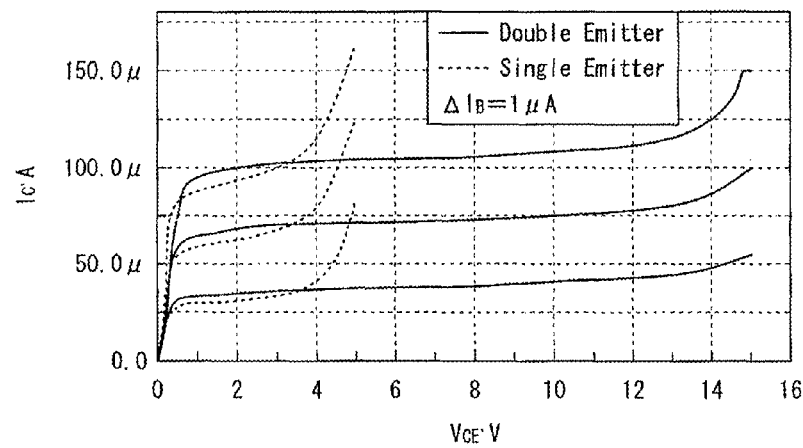
FIG. 46 is a graphical view illustrating the output characteristics of the HCBT having the double-emitter structure according to the fourth embodiment of the present invention, in comparison with that of a HCBT having a single-emitter structure.

For a double-emitter HCBT structure and a single-emitter HCBT structure, FIG. 45 illustrates the dependence of a base current (IB) and a collector current (IC) on a base-emitter voltage (VBE). This graph is also called Gummel plot. FIG. 46 illustrates output characteristics common to the double-emitter HCBT structure and the single-emitter HCBT structure.

A significant improvement has been made in the double-emitter structure with regard to the breakdown voltage (BV-CEO) of the HCBT structure having a common emitter. Both transistors are formed using the same set of masks and the same process parameters. The BVCEO can be increased by using a double-emitter configuration. This can be realized by the design of lithography masks.

Figure 47:
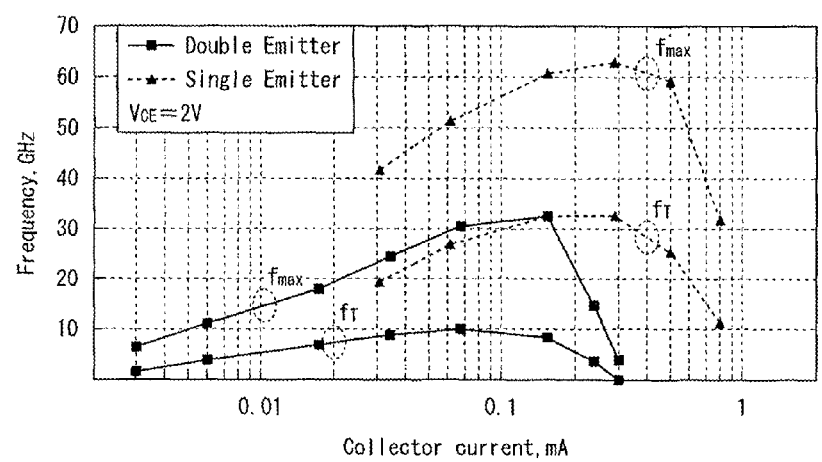
FIG. 47 is a graphical view illustrating the dependence of the cutoff frequency (fT) and the maximum oscillation frequency (fmax) of the HCBT having the double-emitter structure according to the fourth embodiment of the present invention on a collector current (IC), in comparison with that of an HCBT having a single-emitter structure.

FIG. 47 illustrates a relationship among the maximum oscillation frequency (fmax), cutoff frequency (fT) and collector current (IC) of the double-emitter and single-emitter HCBT structures. It is understood that the double-emitter HCBT shows lower values of fT and fmax and has a peak at a lower value of IC. This is ascribable to an increase in current density in the collector contact region. A current flowing in a base-collector depletion region is led toward the central part of the region by an electric field, and then led toward the collector contact region. Consequently, the collector current density at the central part of the collector rises, and a base width begins to increase at a low value of the collector current (that is, Kirk effect), as illustrated in FIG. 47. In addition, electrons are forced to move within the enlarged depletion region, thus causing related time constants to increase. By varying an emitter width, it is possible to reduce both the current density and the time taken by electrons to move through the base-collector depletion region.

Figure 48:
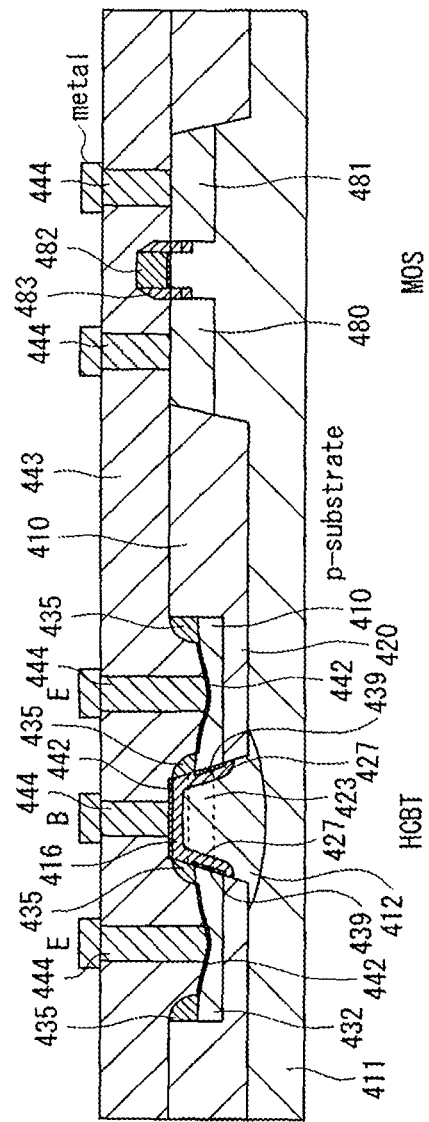
FIG. 48 is a view illustrating the HCBT according to the fourth embodiment of the present invention and a CMOS transistor integrated on the same substrate.
Figure 49:
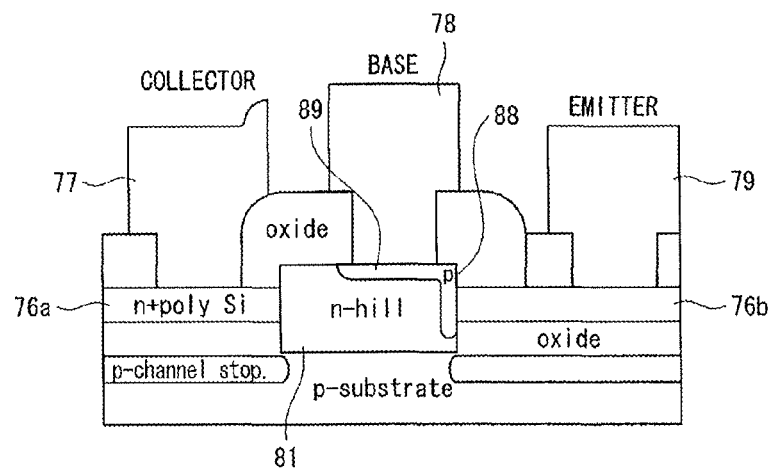
FIG. 49 is a cross-sectional view of an HCBT described in a patent document which is a related art of the present invention.
Figure 50A:
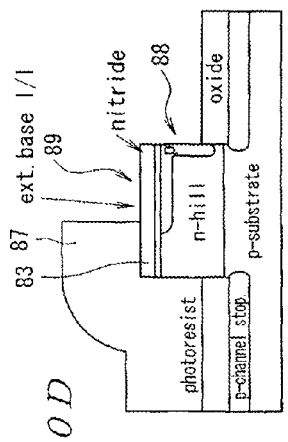
FIGS. 50A to 50F are views depicting problems with the related art.
Figure 50B:
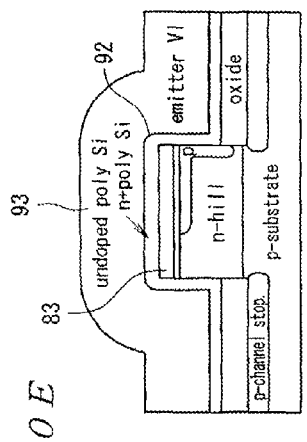
Figure 50C:
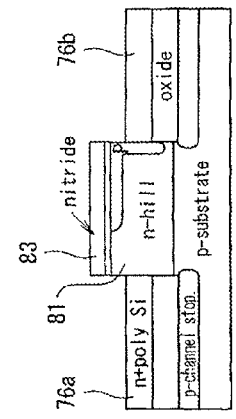
Figure 50D:
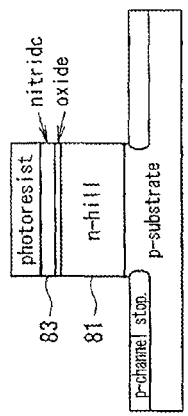
Figure 50E:
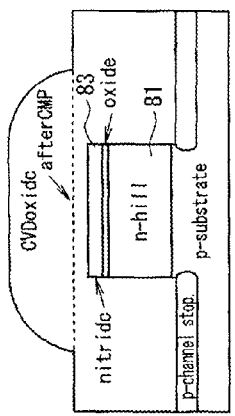
Figure 50F:
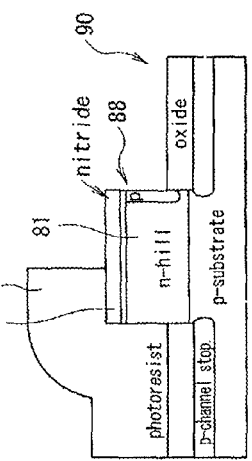

In addition, the above-described bipolar transistor can be formed on the same Si substrate on which the CMOS transistor is formed. FIG. 48 is a view illustrating a bipolar transistor and a CMOS transistor integrated on a substrate. In the CMOS transistor of FIG. 48, reference numeral 480 denotes a source diffusion layer of the CMOS transistor and reference numeral 481 denotes a drain diffusion layer thereof.

In particular, reference numeral 482 denotes the gate electrode of the CMOS transistor and reference numeral 483 denotes the spacer thereof. The spacer 483 is formed along with the spacer 435 of the bipolar transistor.

(Experimental Example)

Specific conditions of each process described above are as shown below. The conditions of the ion implantation methods illustrated in FIGS. 44A to 44J are as follows:

Extrinsic base layer (416 in FIG. 44B)
  Approximately $5 \times 10^{19}$-$5 \times 10^{20}$ cm$^{-3}$
Intrinsic base layer (427 in FIG. 44G)
  Approximately $1 \times 10^{18}$-$5 \times 10^{18}$ cm$^{-3}$
Collector (n-hill layer) (412 in FIG. 44A)
  Approximately $1 \times 10^{16}$-$5 \times 10^{17}$ cm$^{-3}$ The ratio in impurity concentration between the extrinsic base layer and the collector is within the range from 10:1 to 10000:1.

Ion Implantation Conditions
Extrinsic base layer implantation (415a)
Impurity: BF$_2$+
Doping concentration: $1.5 \times 10^{15}$ cm$^{-2}$
Energy: 18 keV
Intrinsic base layer implantation (426a, 426b)
Impurity: BF$_2$+
Doping concentration: $5.0 \times 10^{13}$ cm$^{-2}$
Energy: 30 keV
Inclination: 30°
Collector implantation (413a)
Impurity: P+
Doping concentration: $3.0 \times 10^{12}$ cm$^{-2}$
Energy: 220 keV
Doping concentration: $2.0 \times 10^{12}$ cm$^{-2}$
Energy: 110 keV
Doping concentration: $5.0 \times 10^{11}$ cm$^{-2}$
Energy: 30 keV
Additional collector implantation (413b)
Impurity: P+
Doping concentration: $5.0 \times 10^{12}$ cm$^{-2}$
Energy: 110 keV In the present experimental example, it is possible to form a semiconductor element having an n-hill layer which is completely depleted on these conditions and on the condition that the width of the n-hill layer (width of an active region) is smaller than 500 nanometers.

The invention claimed is:

1. A semiconductor device comprising a lateral bipolar transistor,
   the lateral bipolar transistor including:
   a substrate including a first conductive layer;
   an active region located on the first conductive layer and having such a shape as to protrude from the first conductive layer and have an upper surface and at least one side surface in contact with the upper surface; and
   a device isolating oxide film partially covering the side surface of the active region,
   wherein the active region includes a second conductive layer having a polarity different from that of the first conductive layer, and
   wherein the active region includes a third conductive layer having the same polarity as that of the first conductive layer at two opposing positions of the upper surface and said at least one side surface,
   wherein the third conductive layer includes a fourth conductive layer having the same polarity as that of the second conductive layer,
   wherein the fourth conductive layer is connected to an emitter electrode,
   further comprising at least two collector contact electrodes, wherein the active region is electrically connected to said at least two collector contact electrodes, and said at least two collector contact electrodes are arranged in such a manner that a line connecting said at least two collector contact electrodes is substantially orthogonal to another line connecting said two opposing positions of said at least one side surface.

2. The semiconductor device according to claim 1, wherein an impurity concentration and a width of the active region are set so that the entire of the active region becomes depleted when the lateral bipolar transistor is electrically enabled.

3. The semiconductor device according to claim 2, wherein a ratio between the impurity concentration of the active region and an impurity concentration of the third conductive layer is within a range from 1:10 to 1:10000.

4. The semiconductor device according to claim 3, further comprising a CMOS transistor integrated on the substrate.

5. The semiconductor device according to claim 2, further comprising a CMOS transistor integrated on the substrate.

6. The semiconductor device according to claim 1, further comprising a CMOS transistor integrated on the substrate.

* * * * *